US006182729B1

(12) United States Patent
Banzawa et al.

(10) Patent No.: US 6,182,729 B1
(45) Date of Patent: Feb. 6, 2001

(54) SYSTEM AND METHOD FOR PROCESSING INGOTS

(75) Inventors: Yoshiaki Banzawa, Yokosuka; Nobuaki Hayashi, Yokohama; Kiyoakira Shimizu, Toyama-ken, all of (JP)

(73) Assignee: Nippei Toyama Corporation (JP)

( * ) Notice: Under 35 U.S.C. 154(b), the term of this patent shall be extended for 0 days.

(21) Appl. No.: 09/166,949

(22) Filed: Jan. 29, 1998

Related U.S. Application Data

(62) Division of application No. 08/753,387, filed on Nov. 26, 1996, now Pat. No. 6,024,814.

(30) Foreign Application Priority Data

| | | |
|---|---|---|
| Nov. 30, 1995 | (JP) | 7-338279 |
| Jul. 31, 1996 | (JP) | 8-201653 |
| Oct. 31, 1996 | (JP) | 8-290913 |

(51) Int. Cl.$^{7}$ .......................... B32B 31/00; C30B 33/00; B26D 7/01

(52) U.S. Cl. .......................... 156/353; 156/358; 156/362; 156/378; 156/516; 156/563; 156/584; 378/73; 125/21; 125/35; 125/16.01; 356/30; 356/31

(58) Field of Search .................................... 156/353, 356, 156/358, 378, 516, 563, 584, 362; 125/21, 35, 16.01; 414/745.8, 935; 378/73; 356/30, 31

(56) References Cited

U.S. PATENT DOCUMENTS

| | | | |
|---|---|---|---|
| 3,838,678 | 10/1974 | Kumada et al. | 125/13 R |
| 4,331,452 | 5/1982 | Causey et al. | 51/5 R |
| 4,710,259 * | 12/1987 | Howe et al. . | |
| 5,099,820 | 3/1992 | Stricot | 125/16.01 |
| 5,720,271 | 2/1998 | Hauser | 125/28 |

FOREIGN PATENT DOCUMENTS

| | | |
|---|---|---|
| 2752915 | 5/1979 | (DE) . |
| 738572 | 11/1996 | (EP) . |
| 3255948 | 11/1991 | (JP) . |
| 7146257 | 6/1995 | (JP) . |
| 1436035 | 7/1988 | (RU) . |

* cited by examiner

*Primary Examiner*—Linda L. Gray
(74) *Attorney, Agent, or Firm*—Stetina Brunda Garred & Brucker

(57) ABSTRACT

An apparatus for manufacturing a plurality of wafers by slicing a cylindrical ingot with a wire saw. The apparatus includes a measuring device for measuring the crystal orientation of the ingot; an adhering device for adhering a support to the surface of the ingot based on the orientation where the support includes an intermediate plate and a support plate, where the support plate is adapted to fit the wire saw, and where the adhering device includes an auxiliary adhering element for adhering the intermediate plate to the surface of the ingot and an adhering element for adhering the support plate to the intermediate plate; a dryer for drying and solidifying an adhesive applied between the ingot and the intermediate plate and an adhesive applied between the intermediate plate and the support plate; and the wire saw for slicing the ingot into the plurality of wafers while the ingot is supported on the support. The apparatus may include stockers for storing the ingot and transferring devices for transferring the ingot within the apparatus.

21 Claims, 42 Drawing Sheets

SYSTEM AND METHOD FOR PROCESSING INGOTS

This application is a division of application Ser. No. 08/753,387, filed Nov. 26, 1996, now U.S. Pat. No. 6,024, 814.

BACKGROUND OF THE INVENTION

1. Field of the Invention

The present invention relates to a system that slices silicon ingots used as the material for semiconductors, or the like. The present invention also relates to a method and apparatus for adhering ingots to support members, which are used to mount ingots on slicing machines, and an ingot slicing method.

2. Description of the Related Art

Semiconductor wafers are generally formed by slicing ingots, which are constituted by silicon monocrystals, into a predetermined thickness using a wire saw or the like. An example of one method to slice the ingots will now be described. As shown in FIG. 3, an ingot 13 is lifted out of a crucible (not shown) and machined cylindrically. An intermediate plate 20, which is made of carbon or the like, is adhered to the cylindrical surface of the ingot 13. A support plate 21 (FIG. 6) is adhered to the upper surface of the intermediate plate 20 with a glass insulating plate 21*a* arranged therebetween. As shown in FIG. 13, the ingot 13 is mounted on a wire saw 326 by way of the support plate 21.

The wire saw 326 includes a plurality of rollers 327, a wire 328 wound spirally around the rollers 327 with a predetermined pitch between each winding, and supply pipes 329 through which slurry containing abrasive grains is supplied to the wire 328. As shown in FIG. 8, the wire 328 is drawn in either a single direction or two directions while the slurry, which includes abrasive grains, is supplied to the wire 328.

In this state, the wire 328 is pressed against the ingot 13.

This enables the wire saw 326 to slice the ingot 13 and produce a plurality of wafers 13*a* simultaneously.

The silicon monocrystals, in the form of ingots, have an accurate lattice structure. Such monocrystals have certain crystal planes and crystal orientations. The physical and chemical characteristics of the ingot are affected by the crystal orientation of the monocrystals. The crystal orientation refers to a direction perpendicular to the crystal plane. Prior to the slicing, the crystal orientation of the ingot with respect to the axis of the ingot differs from one ingot to another. Accordingly, slicing ingots having different crystal orientations in the same manner results in the wafers having differing characteristics since the relationship between the sliced surface and the crystal plane is not constant in each wafer.

To cope with this problem, an ingot angle setting device is arranged on the wire saw. The support plate holding the ingot is secured to the angle setting device by bolts. In this state, the displacement of the ingot's crystal orientation with respect to the ingot's axis in horizontal and vertical directions is measured by a goniometer. The angle setting device then appropriately aligns the ingot's crystal orientation with the wire traveling direction. More specifically, the angle setting device pivots the ingot along a horizontal plane and along a vertical plane so as to align the crystal orientation of the ingot with a vertical plane perpendicular to each winding of the wire. In other words, as shown in the flowchart of FIG. 50, in the slicing step of the prior art, the ingot, to which the support plate is adhered, is first mounted on the wire saw. The crystal orientation of the ingot is then measured. Afterwards, the ingot is sliced apart into wafers.

However, it is required that each wire saw be provided with an angle setting device. Thus, when using a plurality of wire saws, the cost of the entire system including the wire saws is increased. Furthermore, the attachment of the ingots to the angle setting device is performed manually. This is burdensome for the operator and takes a great deal of time. As a result, attaching the ingots decreases the operational time of the wire saws.

A typical wafer production system includes an adhering step in which the above plates are adhered to the ingot, a mounting step in which the ingots are mounted on the wire saws, an adjusting step in which the crystal orientation of the ingots is measured and adjusted, and a slicing step in which the ingots are sliced. The wafer production system may further include a separating step in which the sliced wafers are separated from one another, a washing step in which the wafers are washed, an inspecting step in which the wafers are inspected, and other steps. In prior art production systems, these steps are performed in an off-line manner. Thus, the mounting, removing, and transporting of the ingots and wafers with respect to the associated apparatus is often performed manually.

However, there is a recent trend in production systems in which the dimensions (diameter and length) of the ingots are becoming larger. This has resulted in the manual mounting, removing, and transporting of the ingots and wafers becoming more burdensome. In addition, since the management of each step is performed manually, it is difficult to increase the manufacturing efficiency of the wafers while upgrading the quality of the wafers.

SUMMARY OF THE INVENTION

Accordingly, it is an object of the present invention to reduce the costs required for the entire wafer production system.

It is another object of the present invention to increase the operational time of an ingot slicing apparatus.

It is a further object of the present invention to automate the wafer production system to increase the manufacturing efficiency of the wafers and upgrade the quality of the wafers.

To achieve the above objects, a method for adhering support members to a cylindrical ingot is proposed. The ingot has a crystal orientation. A support plate is mounted on a machine for slicing the ingot. The method comprises rotating the ingot about a center axis thereof, the center axis being held to be parallel to a prescribed first plane so that the crystal orientation is placed in a plane parallel to the first plane, adjusting a position of one of the support plate and the ingot in the plane parallel to the first plane so that a mounting axis extending along a longitudinal direction of the support plate is aligned to the crystal orientation, and adhering the ingot to the support plate.

According to another aspect of the present invention, an apparatus for adhering support members to a cylindrical ingot is proposed. The ingot has a crystal orientation. A support plate is mounted on a machine for slicing the ingot. The apparatus has a measuring device for measuring the crystal orientation of the ingot based on a diffraction of X-rays. Based on the measured crystal orientation, a rotating device rotates the ingot about a center axis thereof which is kept parallel to a prescribed first plane so that the crystal orientation is placed in a plane parallel to the first plane.

Based on the measured crystal orientation, an adjusting device adjusts a position of one of the support plate and the ingot in the plane parallel to the first plane so that a mounting axis extending along a longitudinal direction of the support plate is aligned to the crystal orientation. An adhering device adheres the ingot to the support plate.

According to a further aspect of the present invention, a method for slicing a cylindrical ingot by a wire of a wire saw is proposed. The ingot has a crystal orientation. The method comprises rotating the ingot about a center axis thereof, the center axis being held to be parallel to a prescribed first plane so that the crystal orientation is placed in a plane parallel to the first plane, adjusting a position of one of the support plate and the ingot in the plane parallel to the first plane so that an mounting axis extending along a longitudinal direction of a support plate to be mounted to the wire saw is aligned to the crystal orientation, adhering the ingot to the support plate after the adjusting step, transferring the ingot carrying the support plate to the wire saw, mounting the support plate carried by the ingot to the wire saw with the mounting axis being perpendicular to the wire, and slicing the ingot mounted to the wire saw by way of the support plate.

According to a further aspect of the present invention, a system for simultaneously manufacturing a plurality of wafers by slicing a cylindrical ingot is proposed. The ingot is sliced by means of a wire saw with a support mounted thereto. The ingot has a crystal orientation. A measuring device measures the crystal orientation of the ingot. An adhering device adheres the support to a predetermined position in an outer peripheral surface of the ingot based on the measured crystal orientation. A dryer dries and solidifies an adhesive interposed between the ingot and the support.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 37(*b*) is a perspective view showing the pallet and the ingot;

DETAILED DESCRIPTION OF THE PREFERRED EMBODIMENTS

An automated wafer production system according to a first embodiment of the present invention will hereafter be described with reference to FIGS. 1–17. A flowchart illustrated in FIG. 17 shows the operational flow of the production system. Each step of the production system will now be described in accordance with the flowchart.

Figure 1:
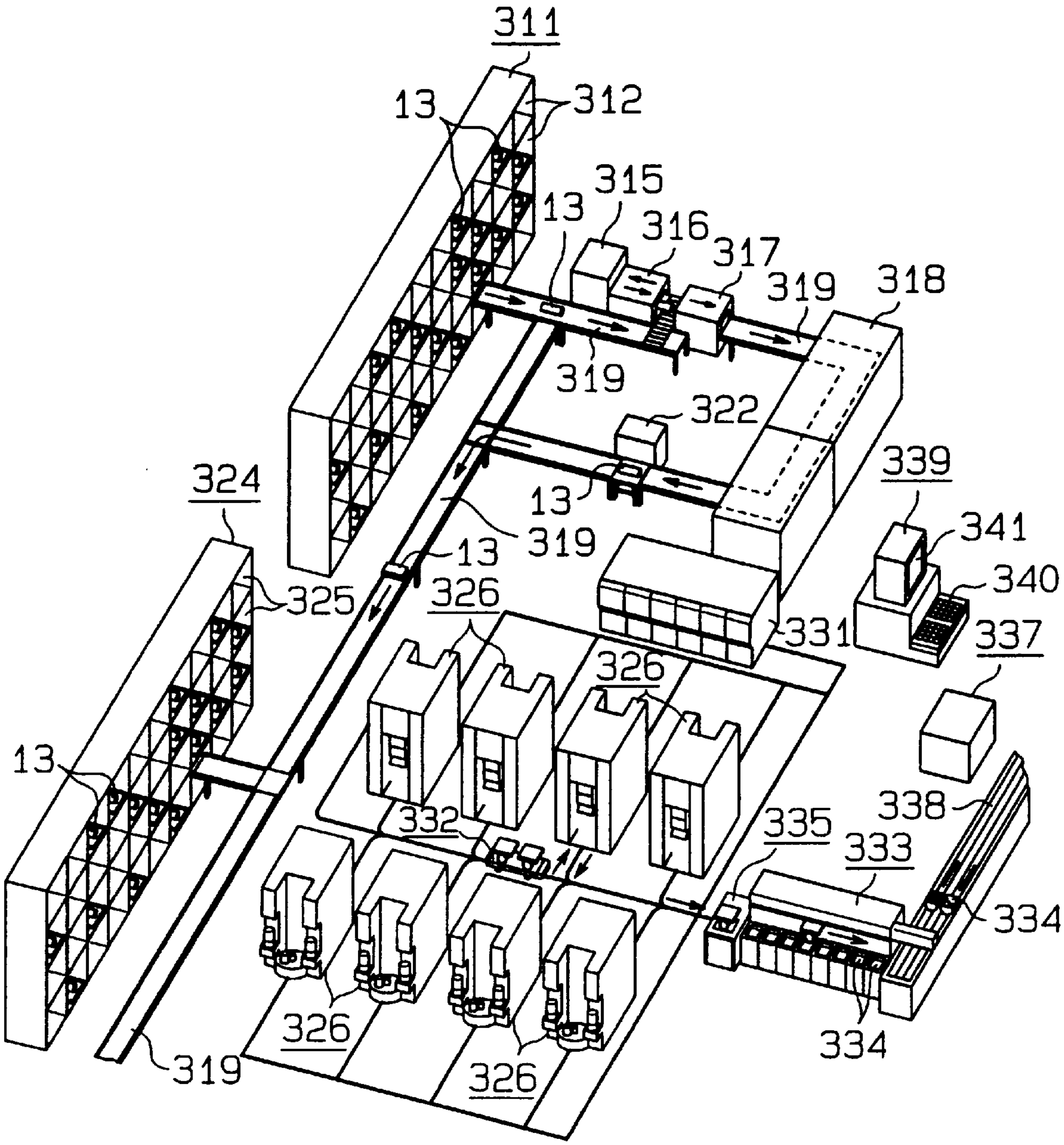
FIG. 1 is a perspective view showing a wafer production system according to a first embodiment of the present invention.
Figure 3:
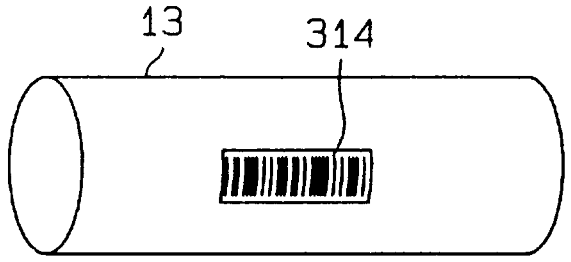
FIG. 3 is a perspective view showing an ingot that is stored in the first stocker.

As shown in FIG. 1, the first stocker 311 has a plurality of racks 312. An ingot 13 constituted by silicon monocrystals is temporarily stored on each rack 312. As shown in FIG. 3, the peripheral surface of each ingot 13 is machined cylindrically at a prior step. A bar code 314, on which production management data of the associated ingot 13 is recorded, is provided on the cylindrical surface of each ingot 13. The production management data includes information such as the lot number, the ingot dimensions, and the ingot serial number.

Figure 11:
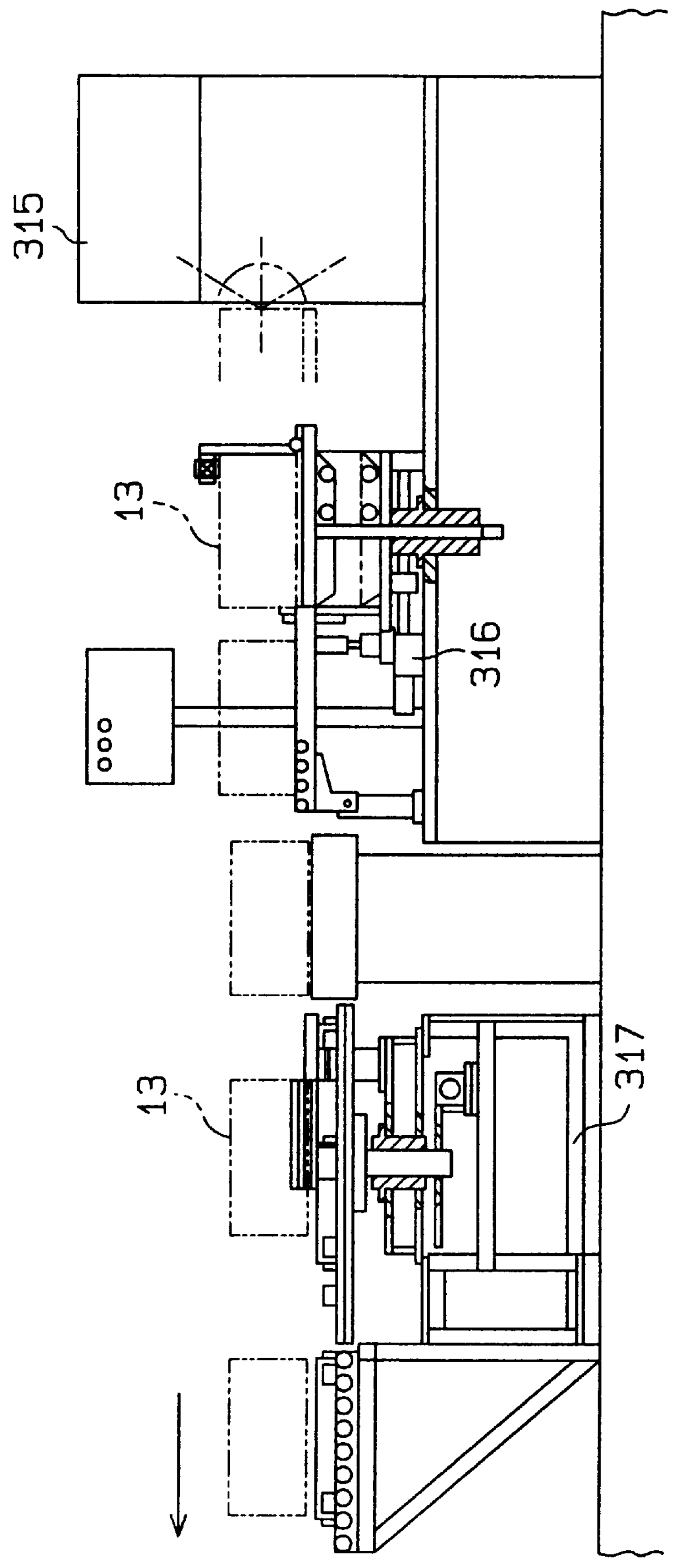
FIG. 11 is a front view showing a goniometer, a first adhering apparatus, and a second adhering apparatus.

As shown in FIGS. 1 and 11, a goniometer 315, a second adhering apparatus 316, a first adhering apparatus 317, and a drying apparatus 318 are arranged in front of the first stocker 311. A belt conveyor 319 connects the first stocker 311 to the apparatuses 315, 316, 317, 318.

The first stocker 311 includes a loading/unloading apparatus (not shown). When the loading or unloading of each ingot 13 is required, the loading/unloading apparatus performs the so-called first in first out processing. The loading/unloading apparatus transfers the ingot 13 from each rack 312 of the first stocker 311 onto the belt conveyor 319.

Figure 4:
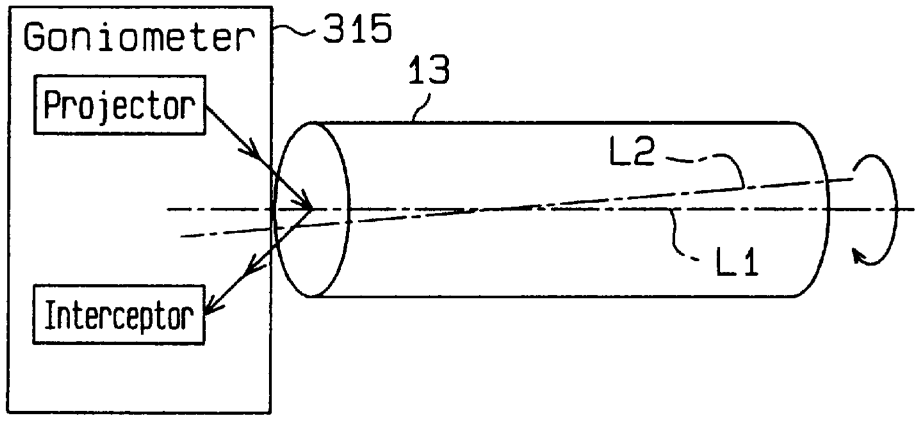
FIG. 4 is an explanatory drawing showing how the crystal orientation of the ingot is measured.

The goniometer 315 measures the crystal orientation of each ingot 13 that is conveyed by the conveyor 319 from the associated rack 312 of the first stocker 311. As shown in FIG. 4, the goniometer 315 irradiates the end face of the ingot with X-rays to measure the displacement of the crystal orientation (the direction indicated by line L2 in FIG. 4) with respect to the center axis L1 of the ingot 13 in horizontal and vertical directions.

Figure 5:
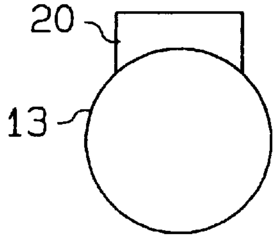
FIG. 5 is a side view showing an intermediate plate adhered to the ingot.

Based on the crystal orientation measured by the goniometer 315, the second adhering apparatus 316 applies an adhesive to several sections on the cylindrical surface of the ingot to adhere an intermediate plate 20, which is made of carbon or the like, onto the ingot, as illustrated in FIG. 5. More specifically, the second adhering apparatus 316 adheres the intermediate plate 20 onto the ingot 13 so as to have the crystal orientation of the ingot 13 aligned along a horizontal plane when the ingot 13 is mounted on a wire saw 326.

Figure 6:
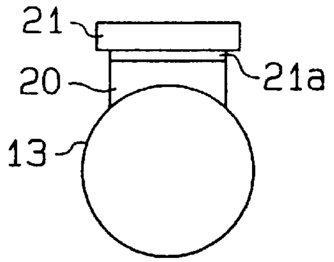
FIG. 6 is a side view showing a support plate adhered to the intermediate plate.
Figure 7:
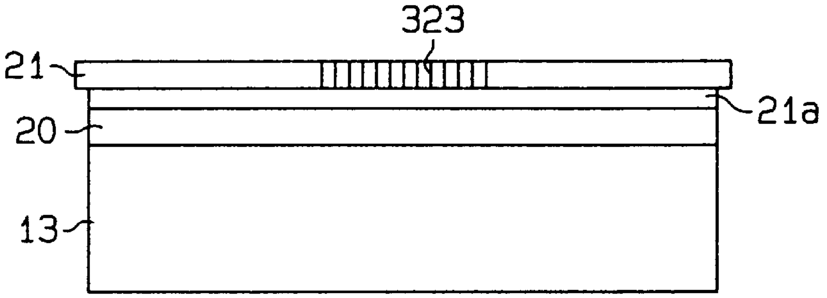
FIG. 7 is a front view showing the support plate adhered to the intermediate plate.

Based on the crystal orientation measured by the goniometer 315, the first adhering apparatus 317 applies an adhesive to the intermediate plate 20 to adhere a support plate 21 onto the intermediate plate 20 with a glass insulating plate 21*a* arranged in between, as illustrated in FIGS. 6 and 7. More specifically, the first adhering apparatus 317 adheres the support plate 21 to the intermediate plate 20 so as to have the crystal orientation of the ingot 13 aligned with a plane that is perpendicular to each winding of a wire 328 when the ingot 13 is mounted on the wire saw 326. There are cases in other embodiments of the present invention in which the insulating plate 21*a*, which is arranged between the intermediate plate 20 and the support plate 21 in this embodiment, may not be provided.

As shown in FIGS. 1, 6, and 7, the drying apparatus 318 blows heated air against the ingot 13 after the plates 20, 21, 21*a* are adhered thereto to dry the ingot 13. The drying apparatus 318 then blows cool air against the ingot 13 to solidify the adhesive.

As shown in FIGS. 1, 3, and 7, a first data writing apparatus 322 is arranged near the outlet of the drying apparatus 318. The writing apparatus 322 reads the production management data from the bar code 314 provided on the ingot 314. The data is written into another bar code 323 and applied to the side surface of the support plate 21. During this procedure, a computer 339, which serves as a central management apparatus, judges which wire saw 326 is most appropriate for slicing the ingot 13 based on the management data. The writing apparatus 322 then adds the datum containing the number of the designated wire saw 326 to the bar code 323.

A second stocker 324 is arranged adjacent to the first stocker 311 and along the belt conveyor 319. The second stocker 324 is provided with a plurality of racks 325. The ingots 13, which the plates 20, 21, 21*a* are adhered to, are stored on the racks 325. The second stocker 324 is provided with a loading/unloading apparatus (not shown). When the loading or unloading of each ingot 13 is required, the loading/unloading apparatus performs the first in first out processing.

Figure 8:
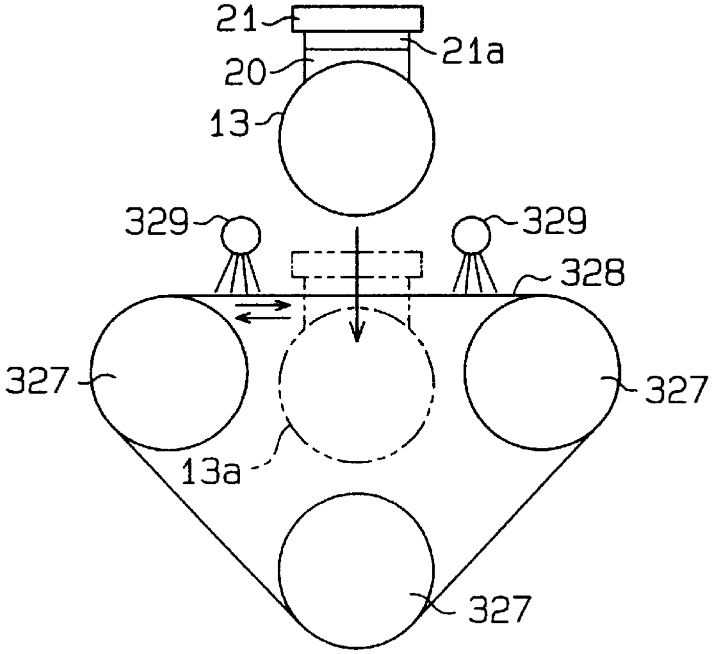
FIG. 8 is an explanatory drawing showing how the ingot is sliced by the wire saw.
Figure 9:
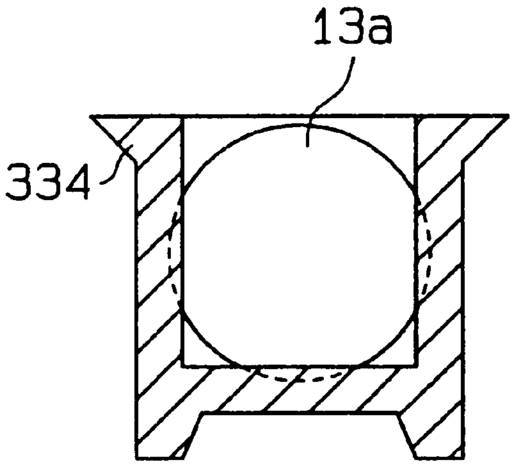
FIG. 9 is a cross-sectional side view showing the wafers stored in a cassette.
Figure 13:
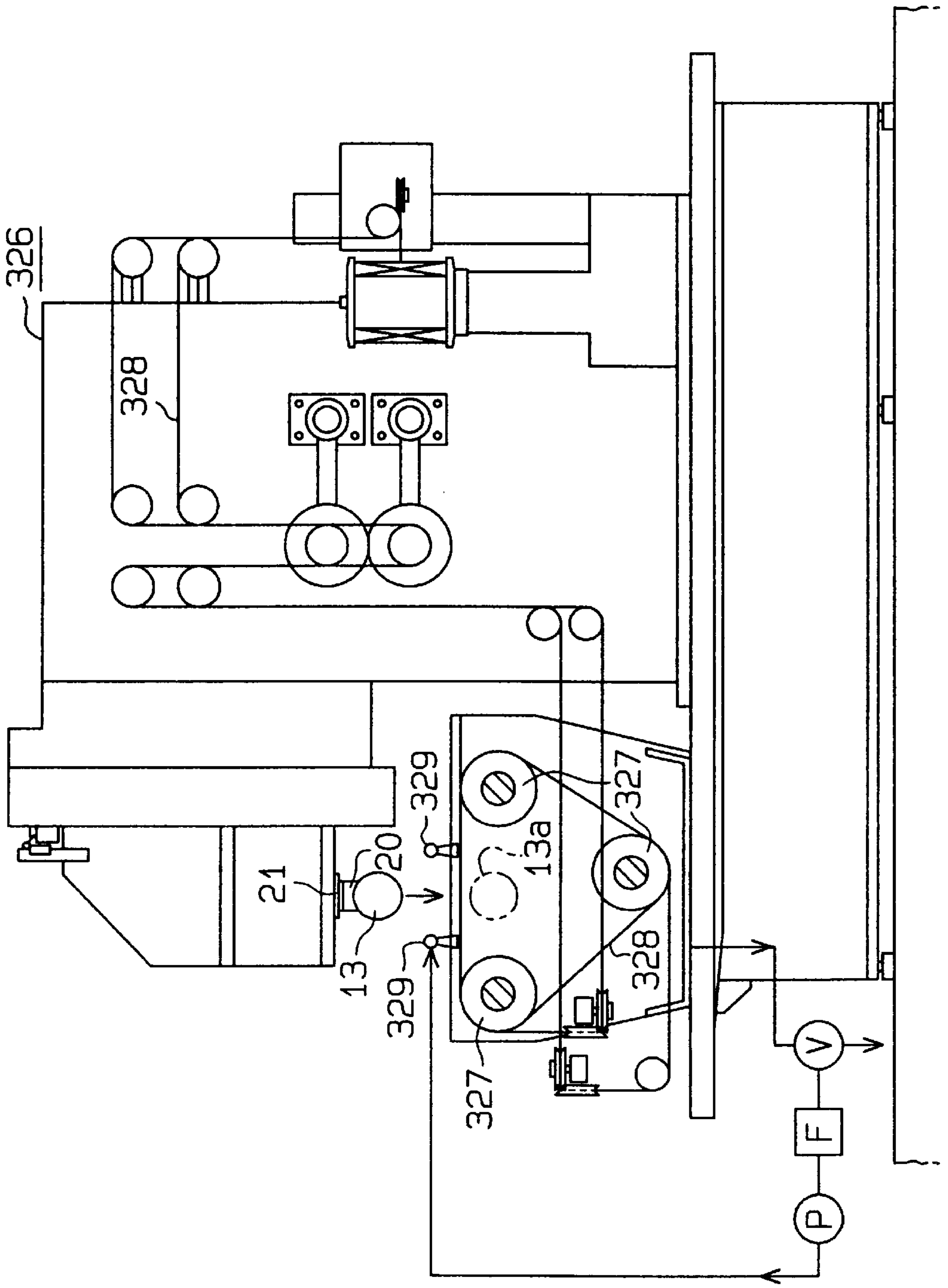
FIG. 13 is a front view showing a wire saw.

The plurality of wire saws 326 is arranged in two rows with a predetermined interval between one another on the opposite side of the conveyor 319 with respect to the second stocker 324. As shown in FIGS. 8 and 13, each wire saw 326 includes a plurality of rollers 327, a wire 328 wound spirally around the rollers 327 with a predetermined pitch between each winding, and supply pipes 329 through which slurry containing abrasive grains is supplied to the horizontally extending wire 328. The wire 328 is drawn in either a single direction or two directions while the slurry, which includes abrasive grains, is supplied to the wire 328. In this state, the wire 328 is pressed against the ingot 13. This enables the wire saw 326 to slice the ingot 13 and produce a plurality of wafers 13*a* simultaneously with each wafer 13*a* having a predetermined thickness.

Figure 14:
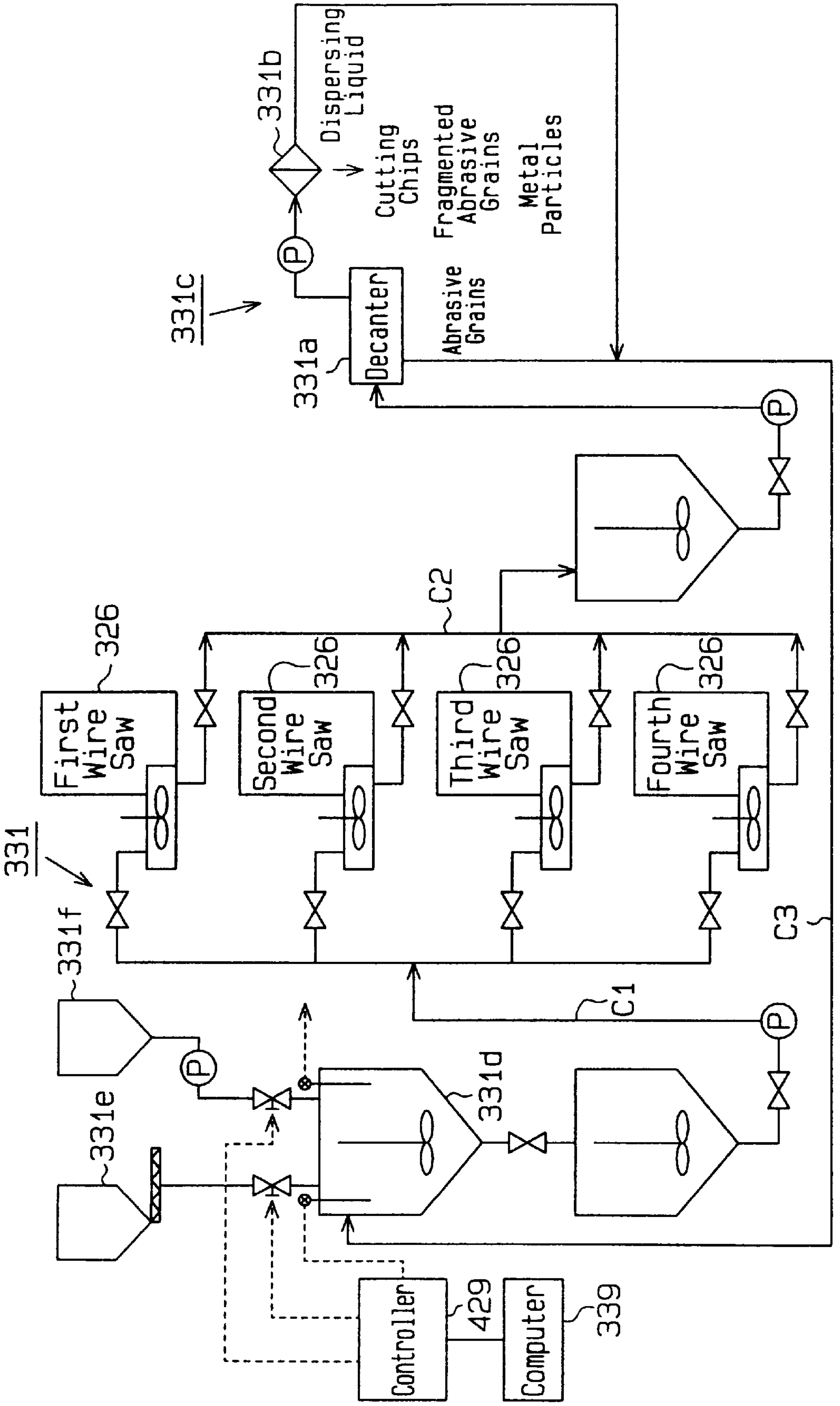
FIG. 14 is a diagrammatic view showing a slurry management system.

As shown in FIGS. 1 and 14, a slurry management system 331 is arranged near the wire saws 326 to manage the slurry supplied to each wire saw 326 in a centralized manner. The slurry discharged from the wire saws 326 is sent to a recovering apparatus 331*c*, which includes a decanter 331*a* and a filter 331*b*, through a pipe C2. The decanter 331*a* receives the slurry sent through the pipe C2 and separates the granular components that are smaller than the abrasive grains (cutting chips, fragmented abrasive grains, metal particles, etc.) and dispersing liquid from the slurry to recover abrasive grains, which may be recycled. The dispersing liquid containing the small granular components is strained by the filter 331*b*. This sieves out the granular components and recovers the dispersing liquid.

The abrasive grains and the dispersing liquid recovered by the recovering apparatus 331c is sent to a mixing tank 331d through a pipe C3. A hopper 331e is provided to reserve abrasive grains that are supplied to the mixing tank 331d. An oil tank 331f is provided to reserve dispersing liquid that is supplied to the mixing tank 331f. The computer 339 controls the percentage content of the abrasive grains contained in the slurry through a controller 429. The controller 429 adjusts the amount of the abrasive grains from the hopper 331e and the amount of the dispersing liquid from the oil tank 331f that are supplied to the mixing tank 331d. This enables the slurry, which is produced in the mixing tank 331d and sent to each wire saw 326 through a pipe C1, to maintain a high slicing capability.

Figure 12:
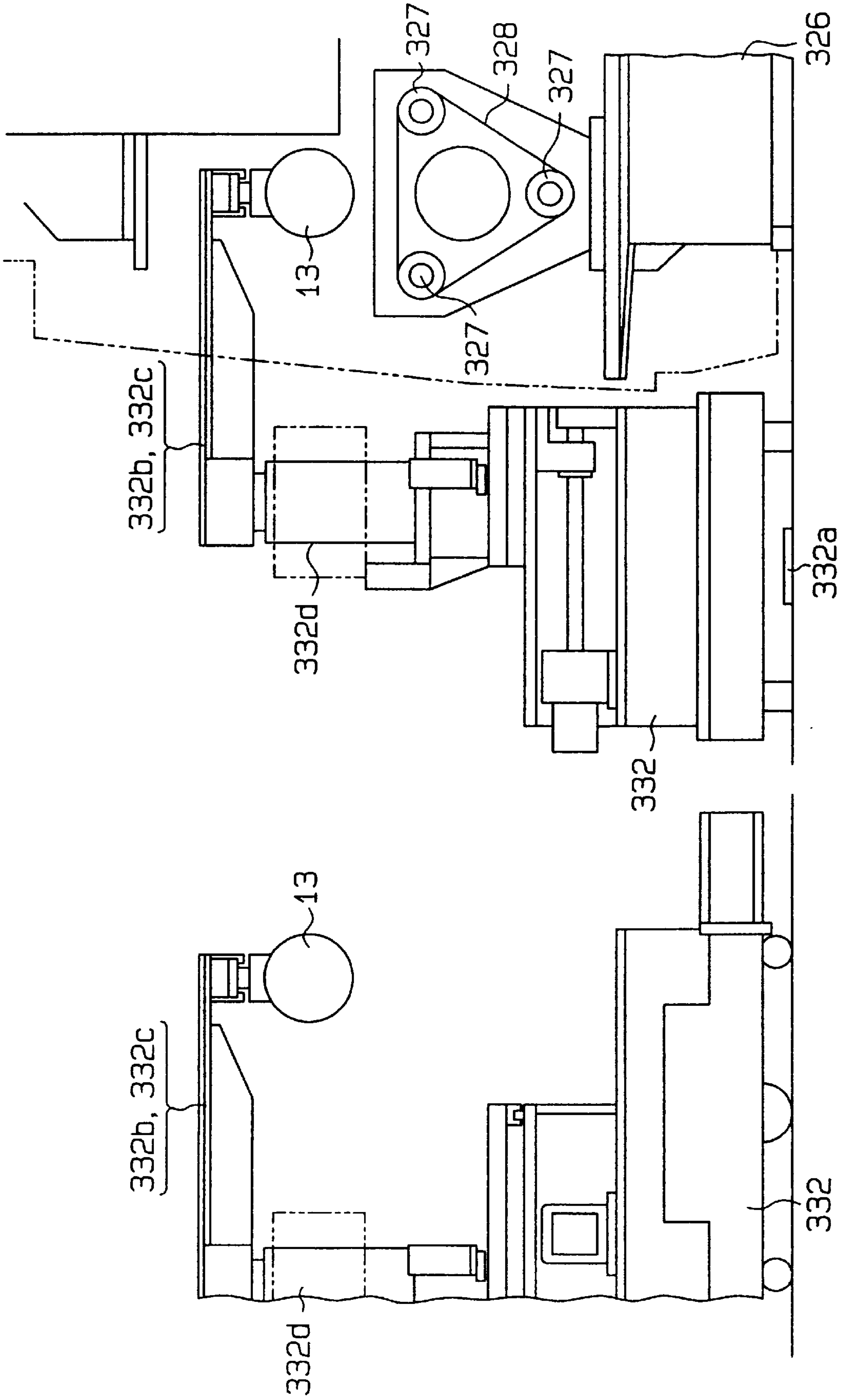
FIG. 12 is an explanatory drawing showing an automated guided vehicle.

As shown in FIGS. 1 and 12, a transporter 332, or an automated guided vehicle (AGV), is provided in the system. A reflective tape 332a (FIG. 12), serving to mark a traveling route, extends between the two rows of the wire saws 326. The transporter 332 travels automatically along the traveling route. A transferring robot 332d having a pair of arms 332b, 332c is mounted on the transporter 332. The computer 339 commands the robot 332d to provide the wire saws 326 with the ingots 13 from the second stocker 324 so that the ingots 13 may be sliced into wafers 13a. The computer 339 also commands the robot 332d to retrieve the sliced ingots 13 (the wafers 13a) from the wire saws 326 and transport them to a wafer processing apparatus 333.

Figure 15:
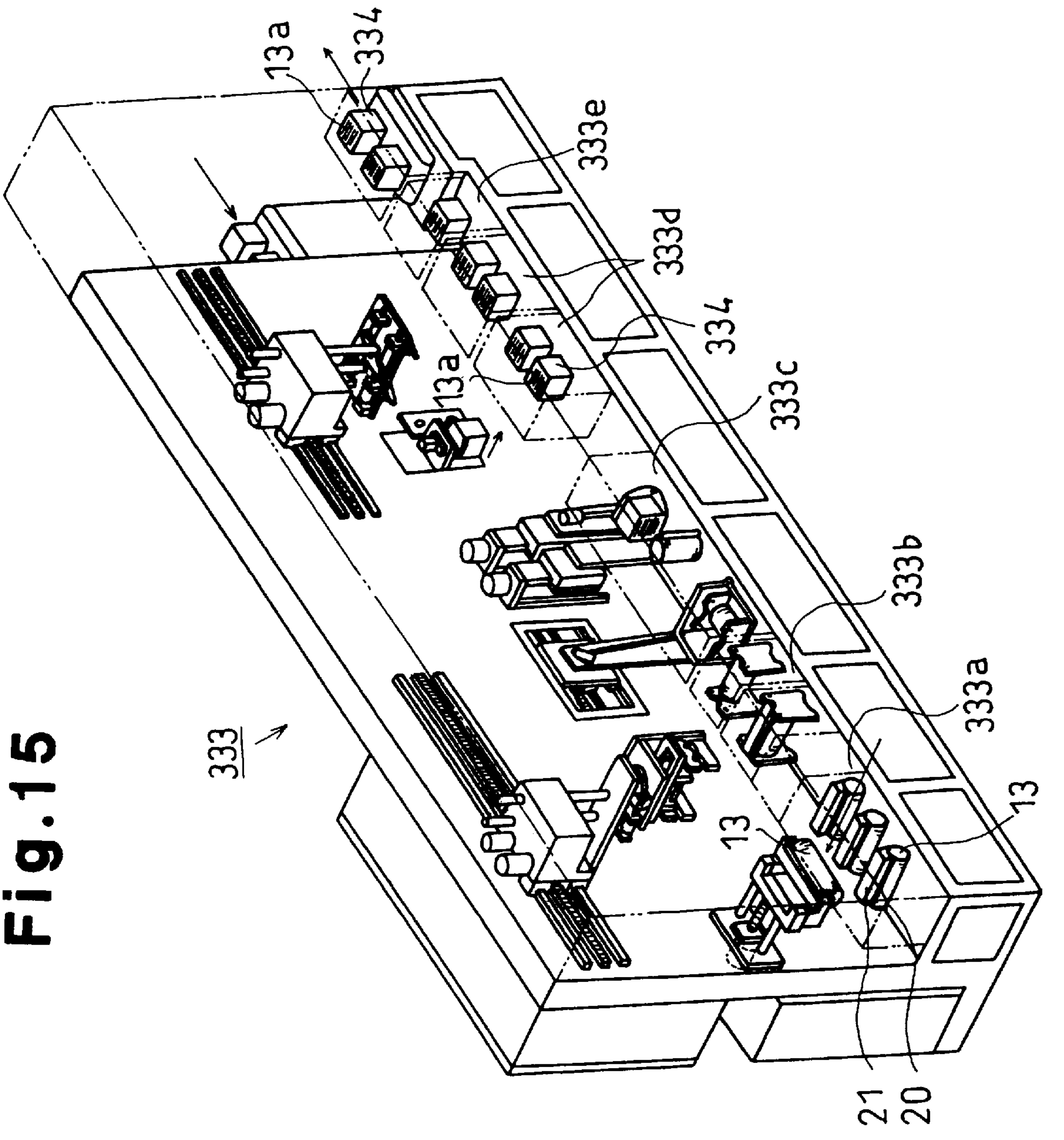
FIG. 15 is a perspective view showing a wafer processing apparatus.

As shown in FIGS. 1 and 15, the wafer processing apparatus 333 is located adjacent to the wire saws 326. The ingots 13 that have been sliced by the wire saws 326 are sent to the processing apparatus 333 one at a time by the transporter 332. Each ingot 13 is first washed by a prewashing apparatus 333a. A removing apparatus 333b then removes the intermediate plate 20, the insulating plate 21a, and the support plate 21 from the ingot 13. Afterwards, a separating apparatus 333c separates the sliced wafers 13a from one another and stores the wafers 13a in a cassette 334. The wafers 13a accommodated in the cassette 334 are washed by a washing apparatus 333d and then dried by a drying apparatus 333e.

Figure 10:
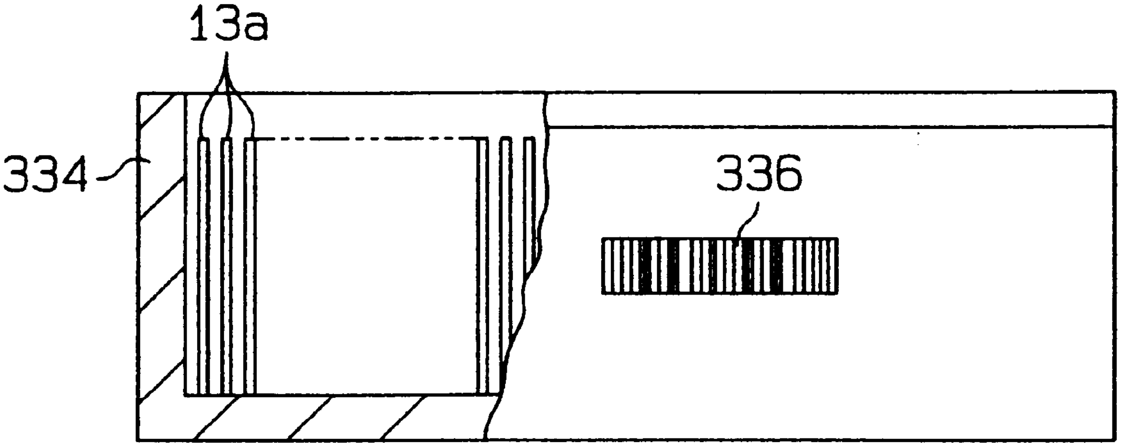
FIG. 10 is a partially cut-away view showing the wafers stored in the cassette.

As shown in FIGS. 1 and 7, a second data writing apparatus 335 is arranged near the inlet of the processing apparatus 333. Before each ingot 13 is processed in the wafer processing apparatus 333, the writing apparatus 335 reads the production management data from the bar code 323 on the support plate 21. The data is written into another bar code 336 and applied to the outer wall of the cassette 334 accommodating the associated wafers 13a, as shown in FIG. 10.

Figure 16:
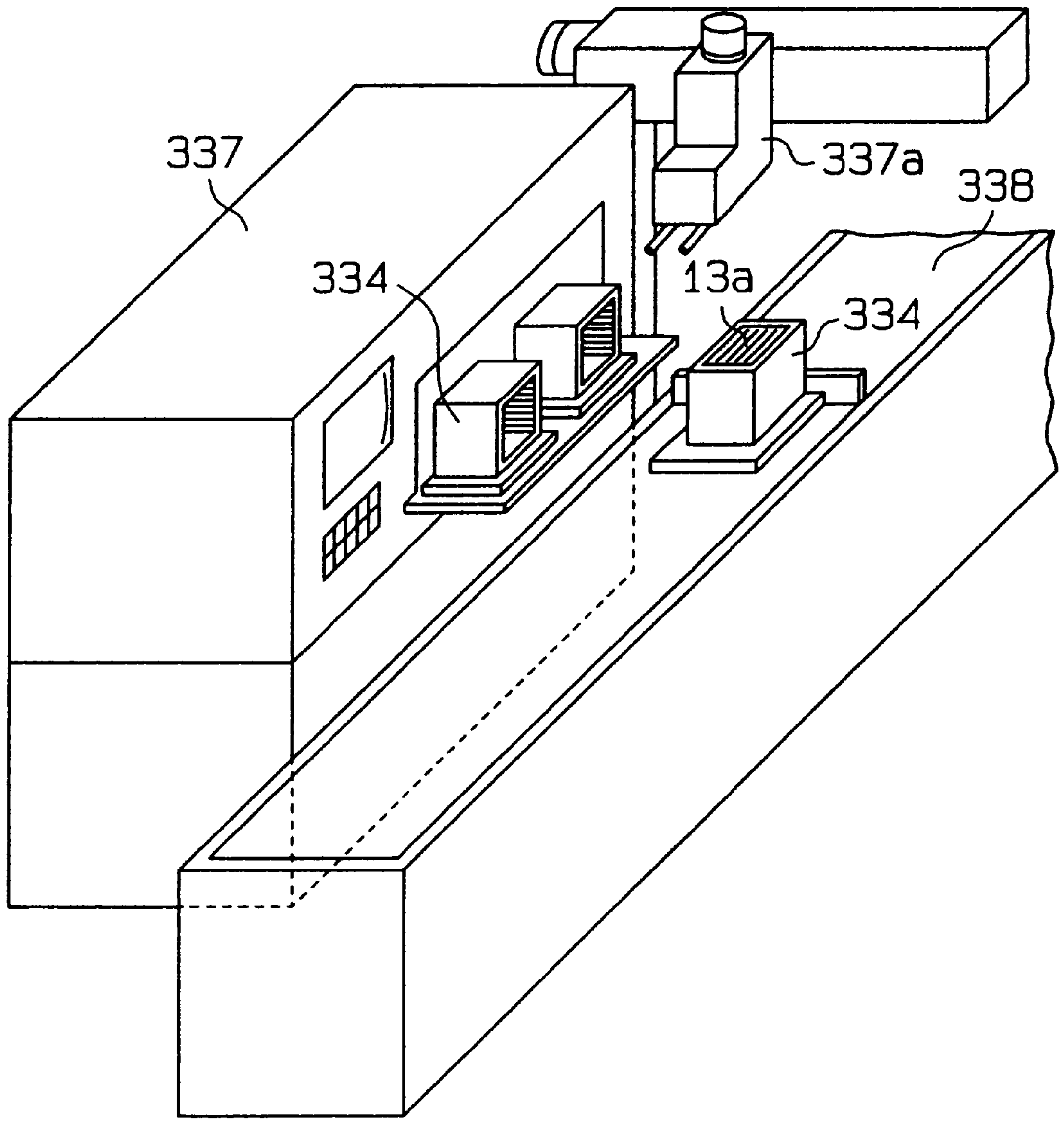
FIG. 16 is a perspective view showing an inspecting apparatus.
Figure 17:
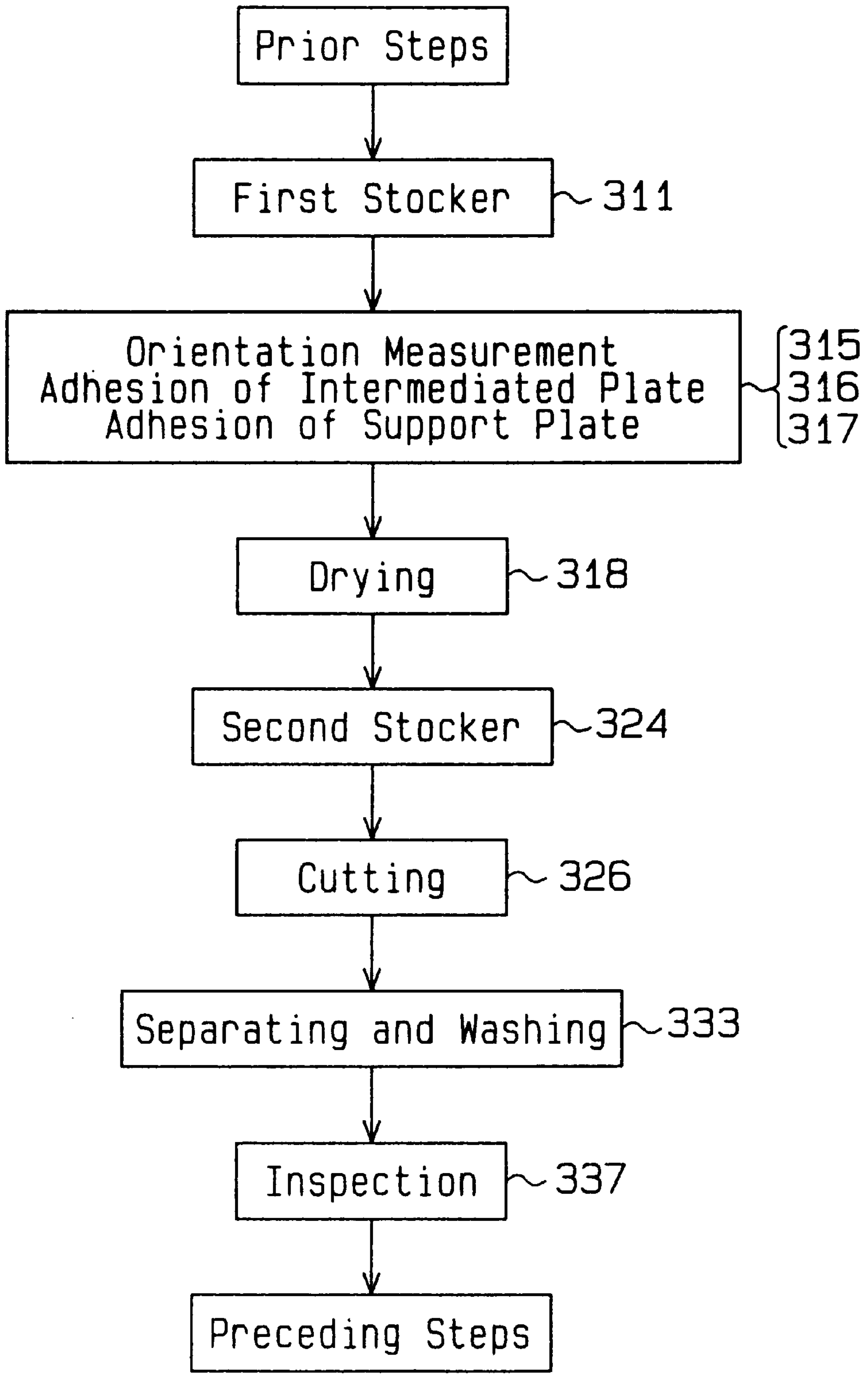
FIG. 17 is a flowchart illustrating the flow of the production system.

As shown in FIGS. 1 and 16, an inspecting apparatus 337 is arranged near the outlet of the processing apparatus 333. A handling robot 337a transfers the cassettes 334, which are conveyed from the processing apparatus 333 by a conveyor 338, to the inspecting apparatus 337 one at a time. The inspecting apparatus 337 removes each wafer 13a from the cassette 334 and inspects its quality. The wafer 13a is returned to the cassette 334 only if it has the required quality. The inspecting apparatus 337 sends data including the inspection results and the number of wafers 13a to the computer 339 each time the inspection of each wafer 13a in a single cassette 334 is completed.

Figure 2:
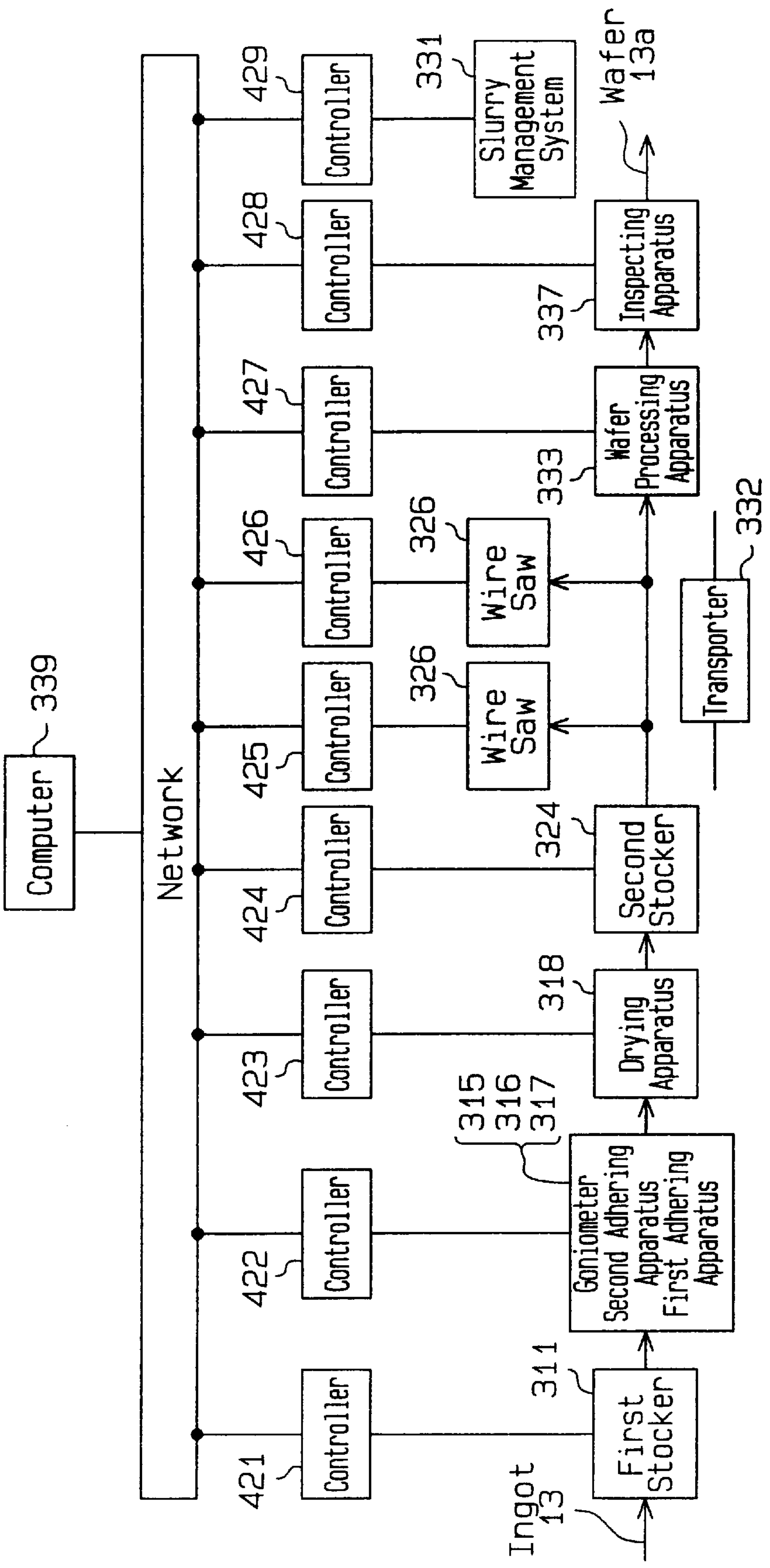
FIG. 2 is a block diagram showing a controlling structure of the production system.

The computer 339 has an operation panel 340 and a display 341. As shown in FIG. 2, the computer 339 is connected to the first stocker 311, the goniometer 315, the second adhering apparatus 316, the first adhering apparatus 317, the drying apparatus 318, the second stocker 324, the wire saws 326, the slurry management system 331, a wafer processing system 333, and the inspecting apparatus 337 by controllers 421, 422, 423, 424, 425, 426, 427, 428, 429, respectively. During production of the wafers 13a, the computer 339 sends command signals to the controllers 421–429 to control the associated apparatuses 311, 315–318, 324, 326, 331, 333, 337. The computer 339 also evaluates the slicing performance of each wire saw 326 by analyzing the inspection data of the wafers 13a that is sent from the inspecting apparatus 337.

The operation of the production system having the above structure will now be described. In the production system, the computer 339 sequentially controls the apparatus associated to each step to obtain the wafers 13a from the ingots 13. That is, the ingots 13 are retrieved one at a time from the first stocker 311 and conveyed sequentially to the goniometer 315, the second adhering apparatus 316, the first adhering apparatus 317, and the drying apparatus 318 by the conveyor 319.

The goniometer 315 irradiates X-rays to measure the crystal orientation of each ingot 13. The second adhering apparatus 316 adheres the intermediate plate 20 to the cylindrical surface of the ingot 13 in accordance with the crystal orientation, as shown in FIG. 5. The first adhering apparatus 317 adheres the support plate 21 and the insulating plate 21a to the intermediate plate 20 in accordance with the crystal orientation, as shown in FIGS. 6 and 7. The drying apparatus 318 dries and solidifies the adhesive applied by the adhering apparatuses 316, 317.

The first data writing apparatus 322 than reads the data contained in the bar code 314 on the ingot 13. The read data and newly added data is written into another bar code 323 and applied to the side surface of the support plate 21. The ingot 13 is then temporarily stored in the second stocker 324 on one of the racks 325 with the plates 20, 21 adhered thereon.

The ingots 13 stored on the racks 325 of the second stocker 324 are retrieved and sent to the designated wire saw 326 by the transporter 332 one at a time. Each ingot 13 is then sliced into wafers 13a by the wire saw 326. During the slicing, the slurry management system 331 supplies slurry, which is produced by the management system 331, to the wire saw 326. The sliced ingot 13 is then transported from the wire saw 326 to the wafer processing apparatus 333 by the transporter 332.

The processing apparatus 333 removes the plates 20, 21 from the sliced ingot 13. The wafers 13a are then separated from one another and placed in one of the cassettes 334. The wafers 13a are washed and dried afterward. The cassette 334 accommodating the wafers 13a therein is conveyed to the inspecting apparatus 337 by the conveyor 338. The inspecting apparatus 337 takes out each wafer 13a from the cassette and inspects its quality. The inspection data obtained by the inspecting apparatus 337 is sent to the computer 339 and analyzed to have the slicing performance of each wire saw 326 evaluated.

The advantageous effects of the above embodiment will now be described.

(1) Since the computer 339 controls the apparatuses associated to each step, the mounting, removing, and transporting may be performed automatically. Accordingly, this reduces the burden imposed on the operator and improves the production efficiency and quality of the wafers 13a.

(2) The ingots 13 are temporarily stored in the first and second stockers 311, 324. Therefore, the ingots 13 may be held in a stand-by state in the stockers 311, 324 when a long period of time is required for the wire saws 326 to slice the ingot 13. Accordingly, the production system may be operated smoothly.

(3) The production management system data and other information related to each ingot 13 is relayed from the bar code 314 on the ingot 13 to the bar code 323 on the support plate 21 and then onto the bar code 336 on the associated cassette 34. As a result, the information included in these bar codes 314, 323, 336 enables each step to be managed properly.

(4) The management of the slurry sent to each wire saw 326 is centralized by the slurry management system 331. That is, the recovering apparatus 331*c* separates the small granular components from the slurry discharged from the wire saws 326 and recovers the abrasive grains and the dispersing liquid that are suitable for the slicing of the ingots 13. Accordingly, the abrasive grains and the dispersing liquid may be recycled. This decreases the necessary amount of the abrasive grains and the dispersing liquid and reduces industrial waste. When the recovered abrasive grains and dispersing liquid are returned to the mixing tank 331*d*, the amount of abrasive grains fed by the hopper 331*e* and the amount of dispersing liquid supplied by the oil tank 331*f* is controlled so that the proportion of the abrasive grains in the slurry in the mixing tank 331*d* is adjusted to an adequate value. This enables the wire saws 326 to be supplied with slurry having a high slicing capability. Furthermore, the slicing of each ingot 13 and the mixing of the slurry may be performed independently in each wire saw 326. Accordingly, the supplying of the slurry to the wire saw 326 and the slicing of the ingots 13 may be performed continuously in each wire saw 326. This improves efficiency of the slicing process.

(5) Each ingot 13 is transported to and from the designated wire saw 326 by the transporter 332. Accordingly, large ingots 13 may be transported automatically between the second stocker 324, the wire saw 326, and the wafer processing apparatus 333. In addition, the employment of the transporter 332 lessens obstacles such as conveyors that are arranged on the floor. This enables the operator to move more freely on the floor and facilitates maintenance of the wire saws 326 and other apparatuses.

(6) The slicing performance of each wire saw 326 may be evaluated through the inspection data from the inspecting apparatus 337. Accordingly, the slicing condition of each wire saw 326 may be maintained optimally.

(7) The intermediate and support plates 20, 21 are adhered to each ingot 13 with respect to the crystal orientation of the ingot 13 outside the wire saws 326. Therefore, it is unnecessary to provide an angle setting device, of the like, for each wire saw 326. Accordingly, equipment costs required for the entire production system is reduced. In addition, the mounting of each ingot 13 to the designated wire saw 326 may be automated. This improves the operational rate of the wire saws 326.

(8) The conveyor 319, which conveys the ingots 13, has a simple structure. The conveyor 319 conveys each ingot 13 to the first and second adhering apparatuses 316, 317 in exactly the same state in which its crystal orientation was measured by the goniometer 315. Accordingly, the intermediate plate 20 is accurately adhered to the ingot 13 in accordance with the measured crystal orientation.

(9) The intermediate plate 20 and the support plate 21 are removed from the sliced ingot 13 in the wafer processing apparatus 333. The wafers 13*a* are separated from one another and then stored in one of the cassettes 334 to be washed and dried. Accordingly, the washing and drying of the wafers 13*a* may be performed efficiently.

A second embodiment according to the present invention will hereafter be described with reference to FIGS. 18–34. In this embodiment, the apparatus employed to adhere the intermediate and support plates 20, 21 to the ingots 13 will be described in detail.

The ingots 13, the intermediate plates 20, the insulating plates 21*a*, and the support plates 21 will be described with reference to FIGS. 24 and 28. The ingots 13 are constituted by silicon monocrystals and the intermediate, insulating, and support plates 20, 21*a*, 21 are made of a material that may be cut by wires such as carbon.

Figure 28:
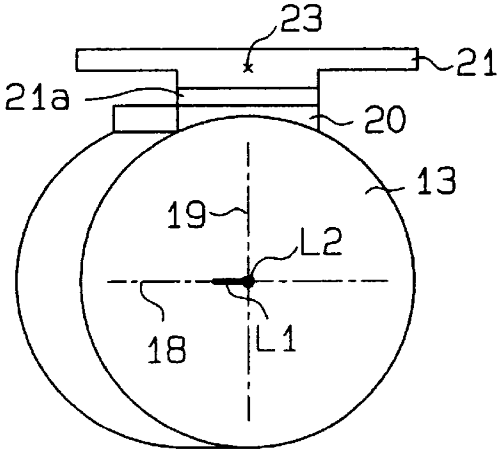
FIG. 28 is a front view showing the support plate adhered to the ingot.

As shown in FIG. 28, an adhesive adheres the arched bottom surface of the intermediate plate 20 to the cylindrical surface of each ingot 13. The glass insulating plate 21*a* is arranged horizontally on the upper surface of the intermediate plate 20 with an adhesive horizontally adhering the support plate 21 to the upper surface of the insulating plate 21*a*. The insulating plate 21*a* is adhered to the support plate 21 beforehand.

Figure 24:
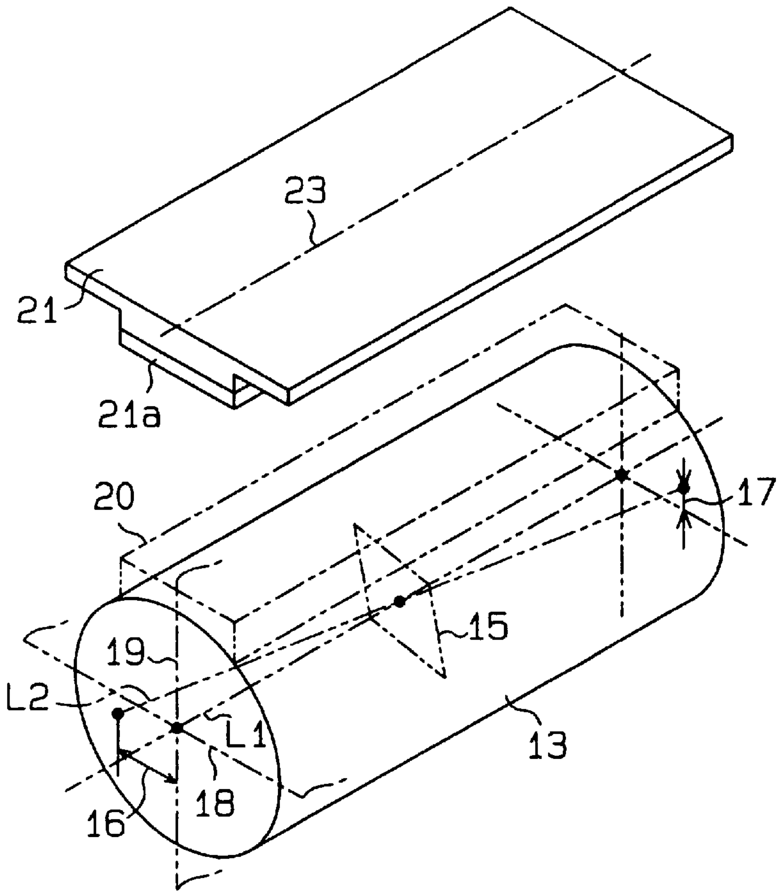
FIG. 24 is a perspective view showing the ingot and the support plate.
Figure 25:
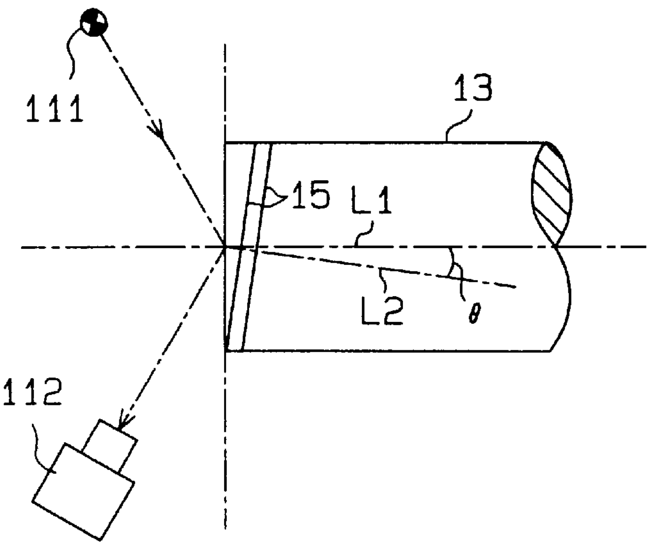
FIG. 25 is an explanatory drawing showing how the crystal orientation of the ingot is measured.

As shown in FIG. 24, the direction perpendicular to the crystal plane 15 of each ingot 13, that is, the crystal orientation L2, is inclined with respect to the axis of the ingot 13, a horizontal plane 18, and a vertical plane 19. The horizontal displacement of the crystal orientation L2 with respect to the center axis L1 on the face ends of the ingot 13 is denoted as 16. The vertical displacement of the crystal orientation L2 with respect to the center axis L1 is denoted as 17. The maximum inclination angle of the crystal orientation with respect to the center axis L1 is actually about ±3 degrees. The support plate 21 includes a hypothetical axis, or a mounting axis 23 that extends in the longitudinal direction of the plate 21. The side surfaces of the support plate 21 extends parallel to the mounting axis 23. An adhering method and an adhering apparatus employed in this embodiment adjusts the relative position of the ingot 13 and the support plate 21 so that the crystal orientation L2 becomes parallel to the mounting axis 23 when adhering the plate 21 to the ingot 13.

Figure 34:
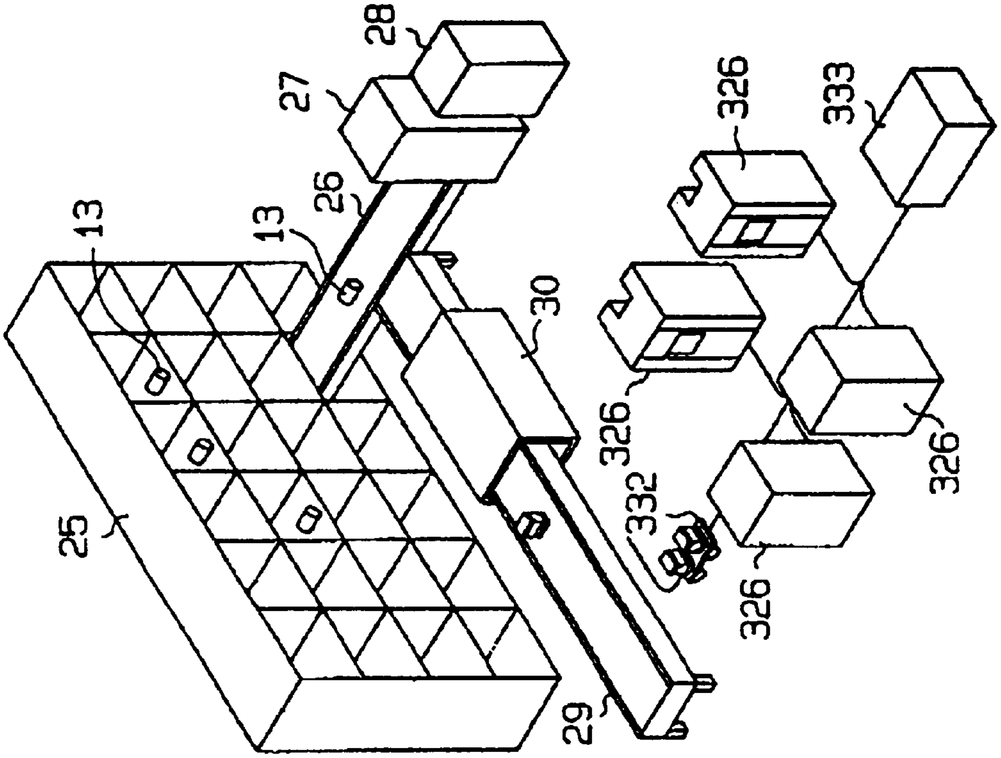
FIG. 34 is a perspective view showing the entire production system schematically.

The production system will now be described with reference to FIG. 34. Ingots 13 that are to undergo slicing are stored in a stocker 25. The stocker 25 is provided with a loading/unloading apparatus (not shown). The loading/unloading apparatus transfers the ingots 13 in the stocker 25 onto a belt conveyor 26. An adhering apparatus 27 is arranged at the distal end of the conveyor 26. The adhering apparatus 27 adjusts the relative position of the crystal orientation L2 of each ingot and the associated intermediate and support plates 20, 21. The adhering apparatus 27 also adheres the intermediate plate 20 and the support plate 21 to the ingot 13. A goniometer 28 is arranged near the adhering apparatus 27 to measure the crystal orientation of each ingot 13.

Another belt conveyor 29 is connected to the middle of the belt conveyor 26. A drying apparatus 30 is arranged along the belt conveyor 29. The drying apparatus 30 dries and solidifies the adhesive applied between the ingot 13 and the intermediate plate 20 and between the intermediate plate 20 and the insulating plate 21*a*. After passing through the drying apparatus 30, each ingot 13 having the support plate 21 adhered thereon is retrieved from the conveyor 29 and transported to the designated wire saw 326 by the transporter 332. The ingot 13 is sliced by the wire saw 326 and then transferred to the wafer processing apparatus 333 by the transporter 332. The processing apparatus 333 removes the plates 20, 21 from the sliced ingot 13, separates the wafers 13*a*, and then washes the wafers 13*a*.

The structure of the transporter 332, the wire saws 326, and the wafer processing apparatus 333 are identical to those employed in the first embodiment and will thus not be described here. Although not shown in FIG. 34, the data writing apparatuses 322, 335, the slurry management system 331, the inspecting apparatus 337, and the computer 339 and other apparatuses that are employed in the first embodiment may also be employed in this embodiment.

The adhering apparatus 27 will now be described with reference to FIGS. 18–23. The adhering apparatus 27 includes a rotating mechanism 38, a carriage 39, a first adjusting mechanism 40, a second adhering mechanism 71, a second adjusting mechanism 91, and a first adhering mechanism 103. The first rotating mechanism 38 rotates the ingot 13 about its center axis L1. The carriage 39 moves the rotating mechanism 38 reciprocally between a position where the adhering of the support plates 20 is carried out and the goniometer 28. The first adjusting mechanism 40 is combined with the rotating mechanism 38 and rotates each ingot 13 so that its crystal orientation L2 becomes horizontal. The second adhering mechanism 71 adheres the intermediate plate 20 to the cylindrical surface of the ingot 13, the position of which has been adjusted by the first adjusting mechanism 40. The second adjusting mechanism 91 moves the mounting axis 23 of the support plate 21 horizontally so that it becomes parallel to the crystal orientation L2 of the associated ingot 13. The first adhering mechanism 103 adheres the support plate 21, the position of which has been adjusted by the second adjusting mechanism 91, to the intermediate plate 20.

Figure 18:
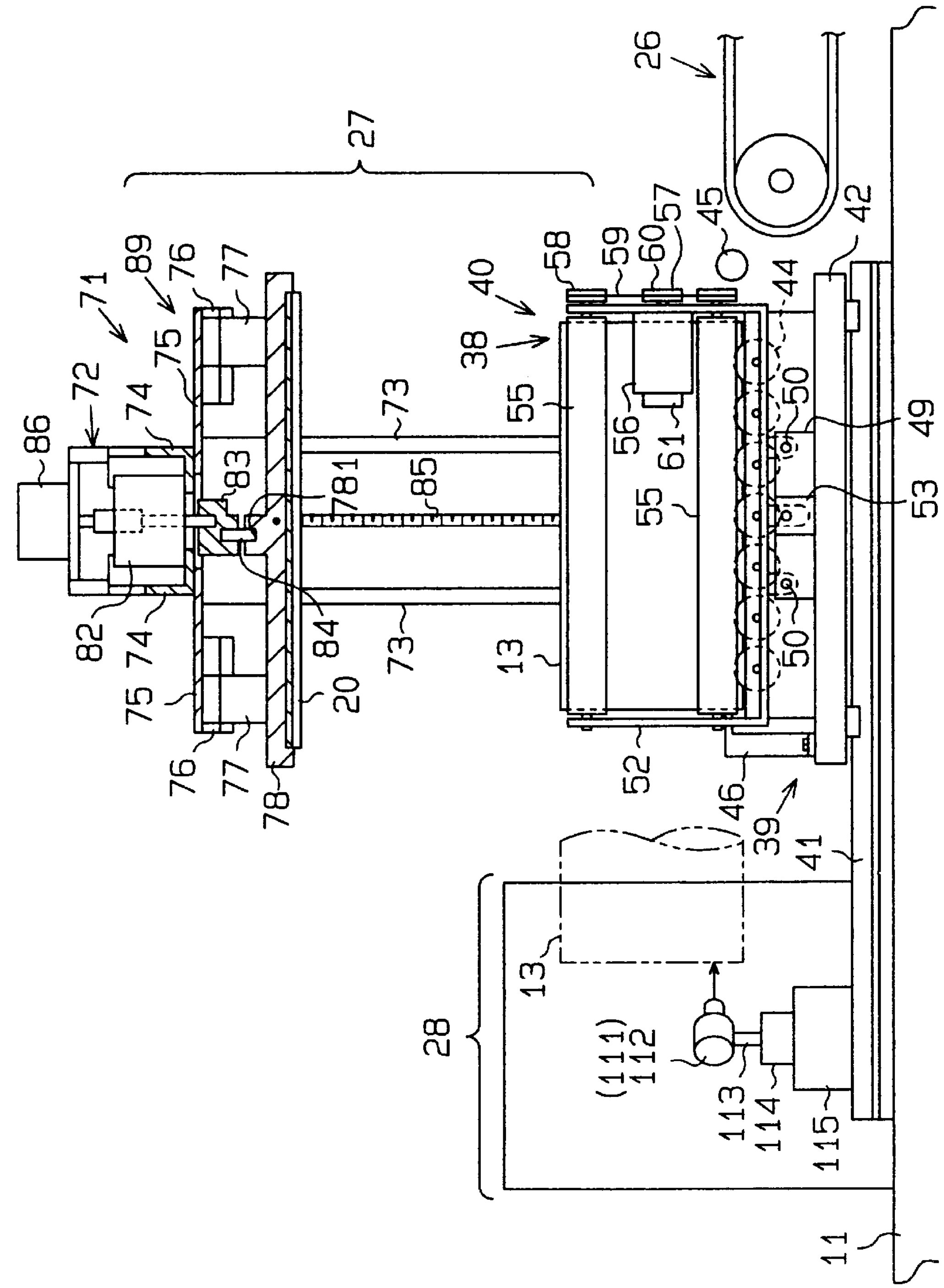
FIG. 18 is a cross-sectional front view showing an adhering apparatus and a goniometer according to a second embodiment of the present invention.
Figure 19:
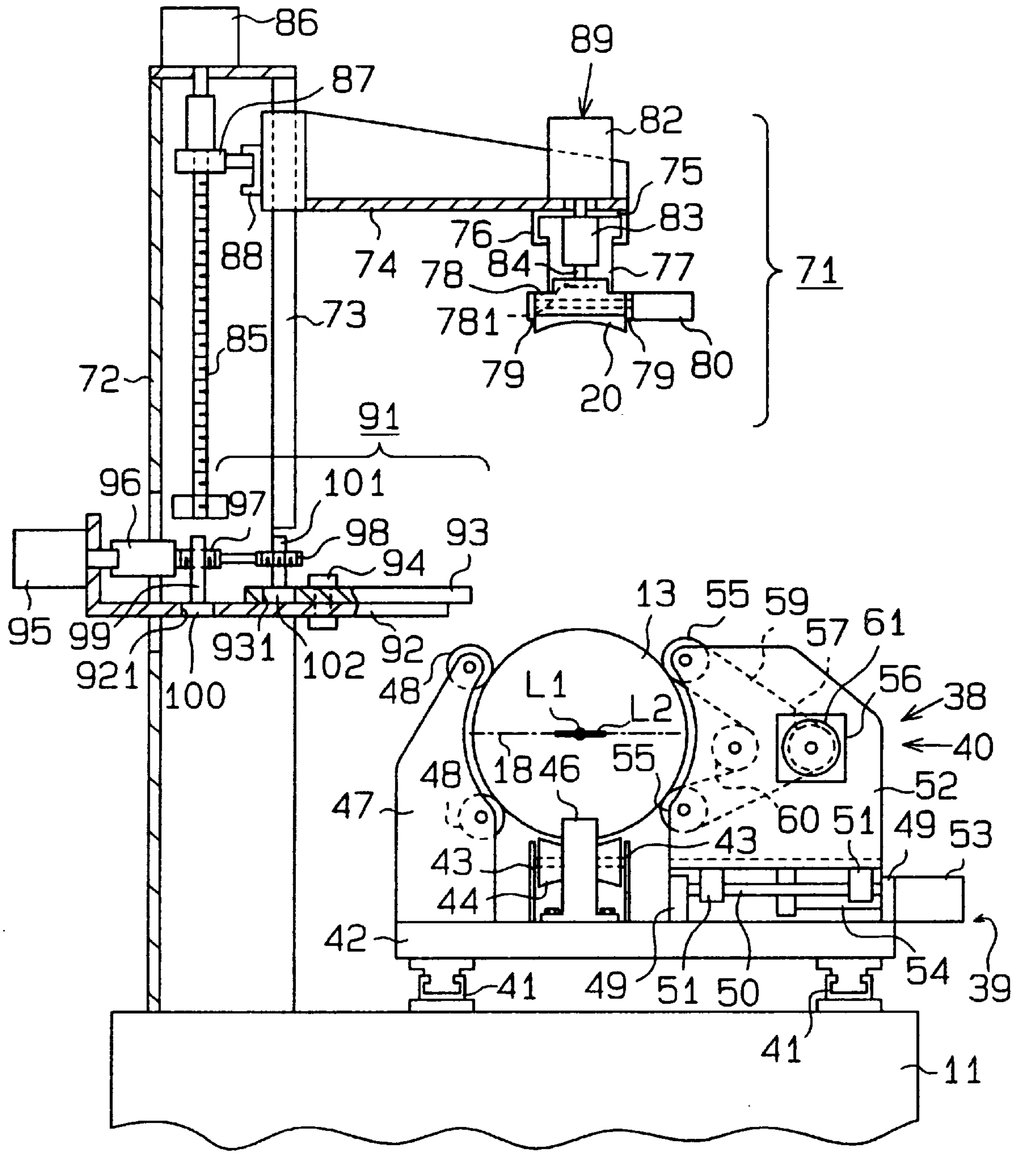
FIG. 19 is a cross-sectional side view showing the adhering apparatus and the goniometer.
Figure 22:
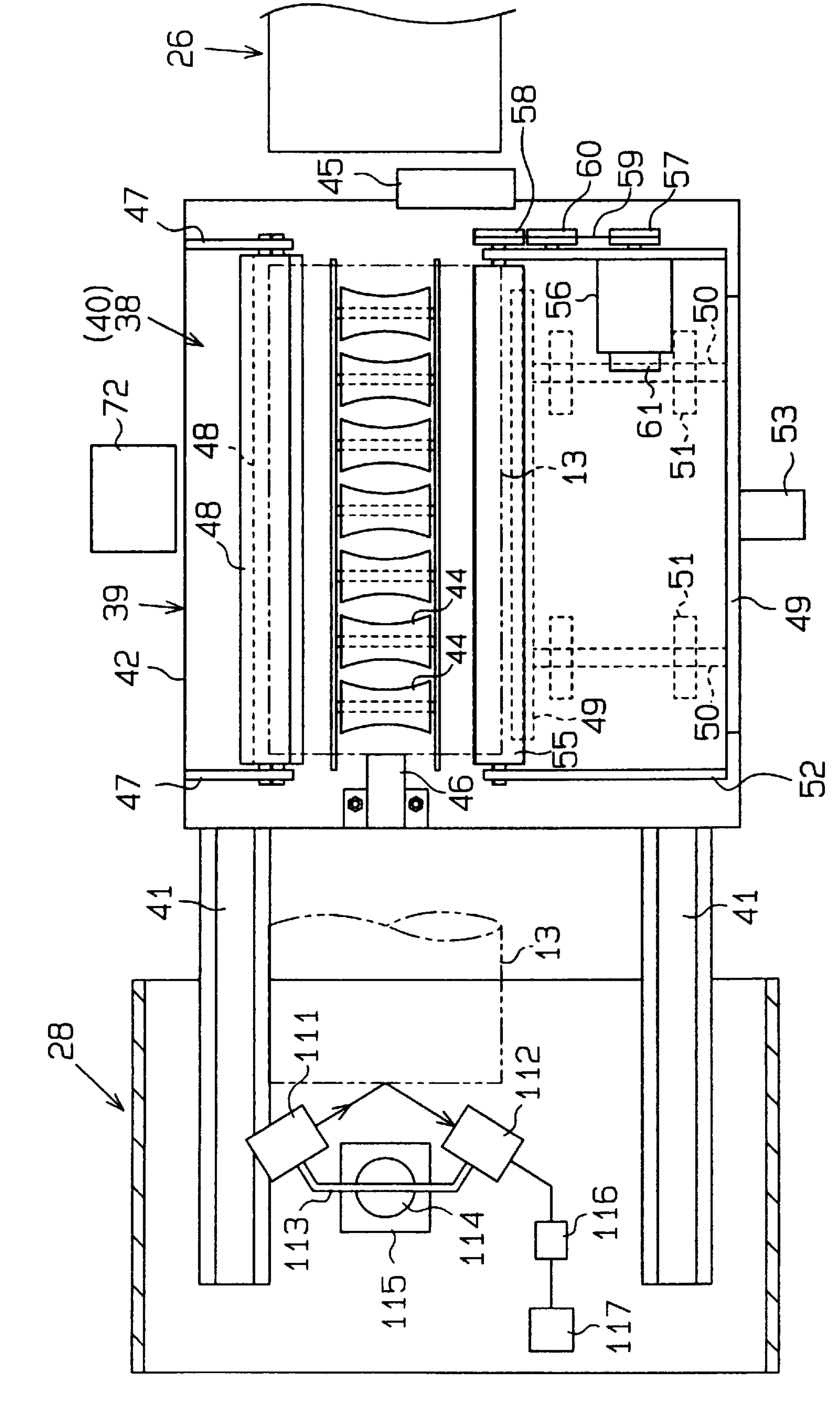
FIG. 22 is a cross-sectional plan view showing a rotating mechanism and a goniometer.

The rotating mechanism 38 and the carriage 39 will now be described in detail. As shown in FIG. 19, a pair of parallel guide rails 41 are fixed to the frame 11. The rails 41 enable a moving platform 42 to move reciprocally in horizontal directions. A pair of shaft holding plates 43 are fixed to the upper surface of the platform 42. A plurality of support rollers 44 (seven are employed in this embodiment, as shown in FIG. 22) are rotatably supported between the plates 43. As shown in FIG. 18, a guide roller 45 is located between the rightmost support roller 44, as viewed in the same drawing, and the distal end of the conveyor 26. The guide roller 45 enables each ingot 13 to be transferred to the support rollers 44 from the conveyor 26. As shown in FIGS. 18 and 22, a restricting piece 46 is fixed to the upper surface at the left end of the platform 42. The restricting piece 46 is abutted by the left end of each ingot 13. This enables positioning of the ingot 13 held on the support rollers 44.

As shown in FIGS. 19 and 22, a pair of support plates 47 are fixed to the upper surface of the platform 42. A pair of clamp rollers 48 are rotatably supported between the two support plates 47. As shown in FIGS. 18 and 19, a pair of support bodies 49 are fixed to the upper surface of the platform 42. A pair of parallel guide rods 50, which extend horizontally and have a predetermined interval between each other, are supported between the support bodies 49. A support frame 52 moves reciprocally in a horizontal direction along the guide rods 50 by way of a plurality of support members 51. The support frame 52 is moved by a rod 54 of a cylinder 53.

A pair of drive rollers 55 are supported between the two side walls of the support frame 52 to rotate the ingot 13. When the ingot 13 is held on the support rollers 44, the cylinder 53 moves the support frame 52 toward the clamp rollers 48. This enables the ingot 13 to be clamped between the clamp and drive rollers 48, 55. The ingot 13 is slightly lifted from the rollers 44 when clamped between the rollers 48, 55. As shown in FIGS. 18, 19, and 22, a servo motor 56 is secured to one of the side walls of the support frame 52. A belt 59 extends between a drive pulley 57, which is coupled to the motor 56, and driven pulleys 58, which are coupled to one end of the shafts supporting the drive rollers 55. Accordingly, the servo motor 56 rotates the drive rollers 55. An idler pulley 60 is provided for the motor 56. A rotary encoder 61 is coupled to the servo motor to detect the rotational angle of the ingot 13.

The second adhering mechanism 71 will now be described in detail. As shown in FIGS. 18 and 19, a column 72 is erected on the frame 11 adjacent to the rotating mechanism 38. A pair of vertically extending guide rails 73 are fixed to the column 72. A support arm 74 extending horizontally is lifted and lowered along each rail 73. A bracket 75 is secured to the ends of each support arm 74. A pair of guide rails 76 are supported by the ends of each bracket 75. The guide rails 76 extend horizontally and are substantially parallel to the center axis L1 of the ingot 13 clamped by the rollers 48, 55. A moving member 77 moves reciprocally along each pair of rails 76. A holder 78 is attached to the moving members 77. A transferring means (not shown) carries each intermediate plate 20 to a position where the plate contacts the bottom surface of the holder 78. In this state, the intermediate plate 20 is clamped by a pair of clamp plates 79 and attached to the bottom surface of the holder 78. The clamp plates 79 are moved toward and away from each other by a cylinder 80 to clamp or release the intermediate plate 20.

A motor 82 extending downward is fixed to the upper end of the support arm 74. An eccentric pin 84 is coupled to the motor 82 by way of a connecting member 83. A groove 781, which extends horizontally and perpendicular to the guide rails 76, is defined in the upper surface of the holder 78. The eccentric pin 84 is engaged with the groove 781. Accordingly, when the motor 82 rotates the connecting member 83, the eccentric pin 84 causes the holder 78 to move along the guide rails 76. The motor 82, the eccentric pin 84, the guide rails 76, and the holder 78, together with other parts constitute an oscillating mechanism 89 that ensures the adhesion between the ingot 13 and the intermediate plate 20.

A ball screw 85 is supported inside the column 72 extending vertically. The ball screw 85 is rotated in forward and reverse directions by a servo motor 86 fixed to the upper end of the column 72. A nut 87 is screwed into the ball screw 85. The nut 87 is engaged with an engaging plate 88, which is attached to the basal end of the support arm 74. Accordingly, when the rotation of the servo motor 86 lowers or lifts the nut 87, the support arm 74 is lowered or lifted along the guide rails 73.

Figure 23:
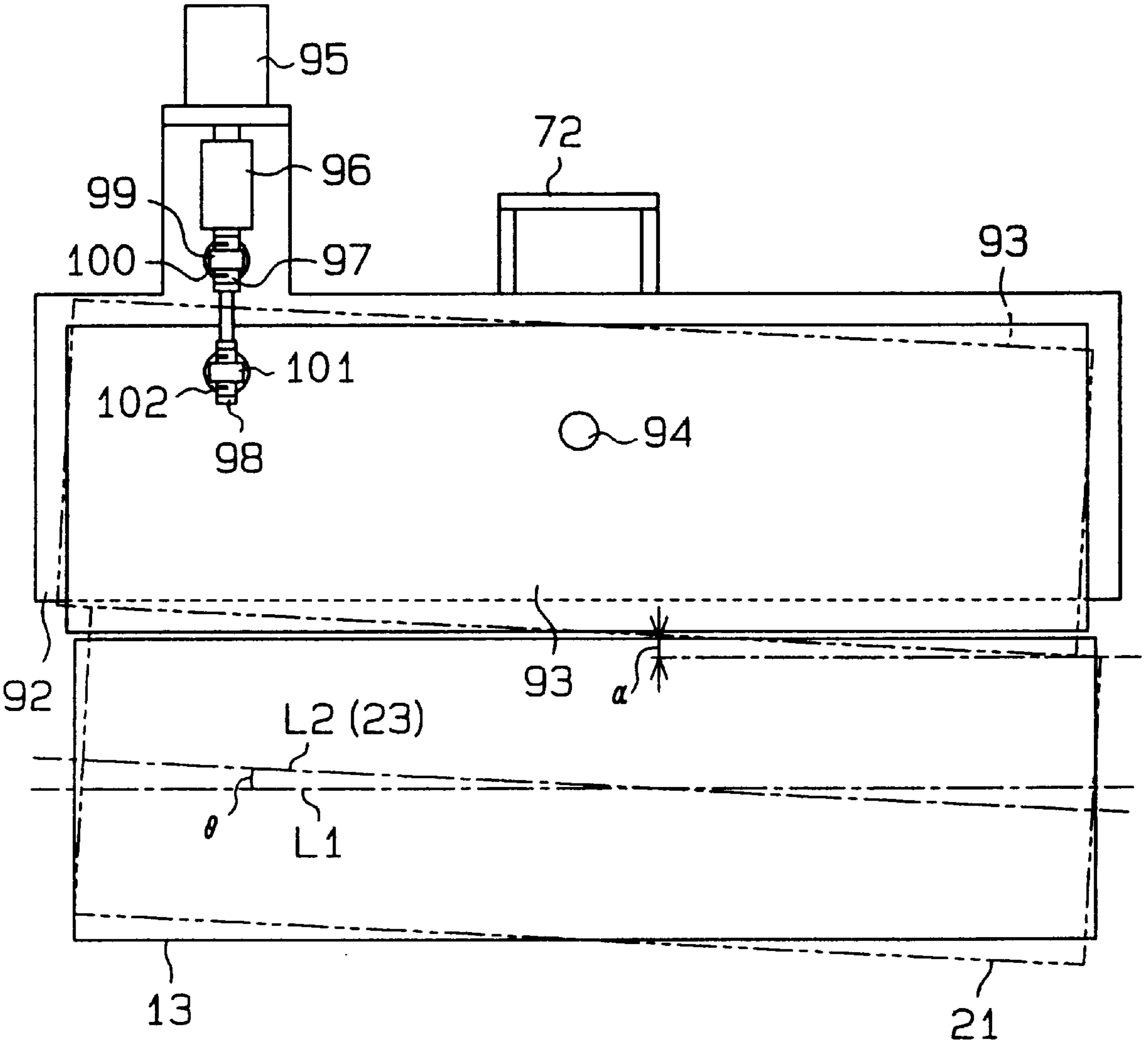
FIG. 23 is a plan view showing an adjusting mechanism.

The second adjusting mechanism 91 will now be described in detail with reference to FIGS. 19 and 23. A support plate 92 extending horizontally is secured to the middle portion of the column 72. An adjusting plate 93 is arranged on the upper surface of the support plate 92. A connecting pin 94 enables the adjusting plate 93 to pivot horizontally. A servo motor 95 extending horizontally is supported on the support plate 92. A screw rod constituted by aligned first and second screws 97, 98 are connected to the output shaft of the motor 95 by way of a universal joint 96. The first screw 97 is screwed through an actuating piece 99. A rotating element 100 fixed to the lower end of the actuating piece 99 is pivotally fit into a hole 921 defined in the support plate 92. The second screw 98 is screwed through an actuating piece 101. A rotating element 102, which is fixed to the lower end of the actuating piece 101, is pivotally fit into a hole 931 defined in the adjusting plate 92. Accordingly, when the motor 95 rotates the first and second screws 97, 98, the adjusting plate 93 is pivoted horizontally about the shaft 94. The screw pitch of the first and second screws 97, 98 differ from each other. This difference enables fine adjustment of the pivoting angle of the adjusting plate 93.

Figure 21:
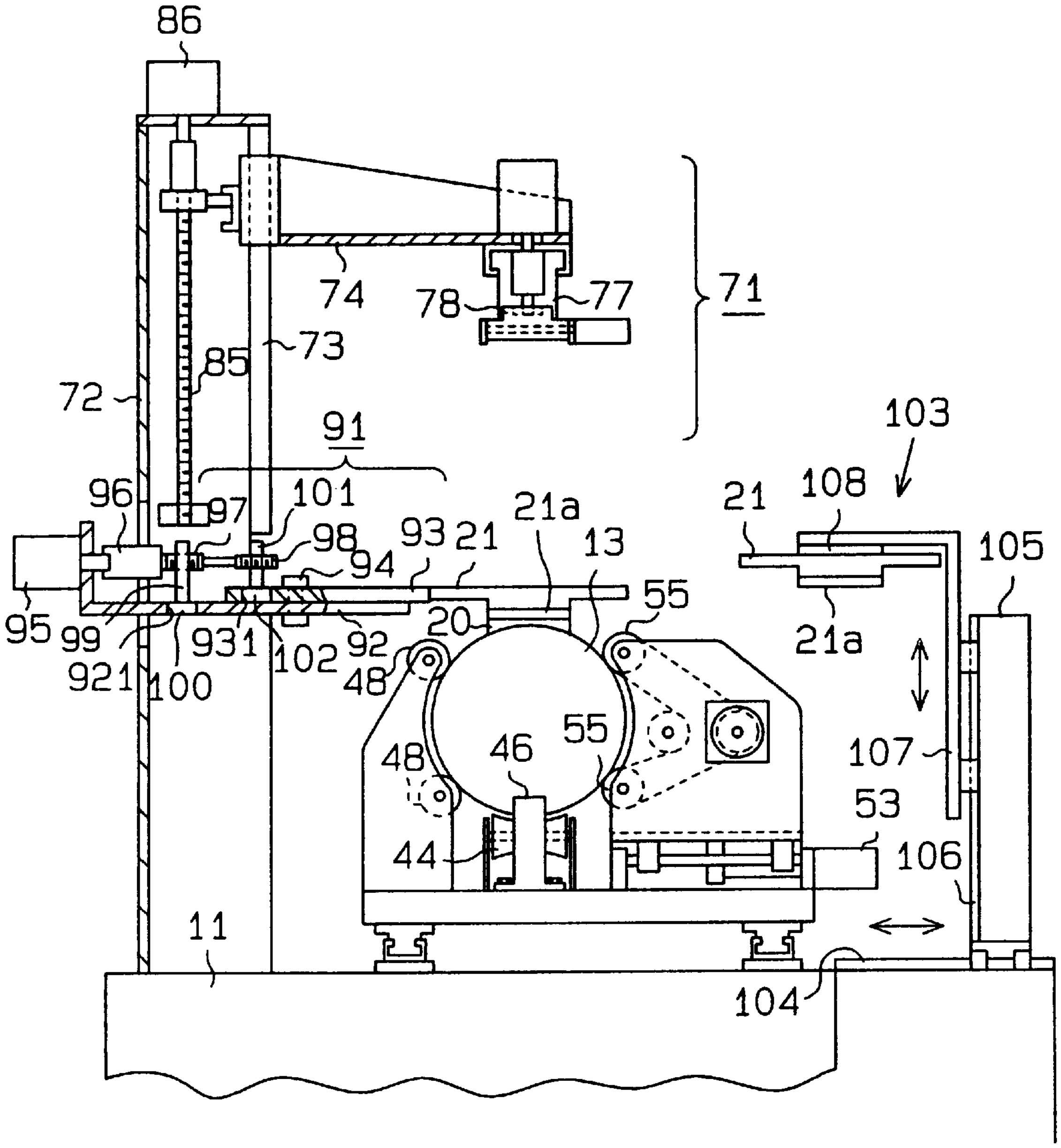
FIG. 21 is a cross-sectional side view showing the adhering apparatus and the goniometer.

The support plate 21 is carried to a position above the ingot 13 by the first adhering mechanism 103, shown in FIG. 21. The first adhering mechanism 103 includes a column 105, an elevating body 107, and an electromagnet 108. The column 105 is moved horizontally by a driving mechanism (not shown) along guide rails 104 extending horizontally. The elevating body 107 is lifted and lowered by an elevating mechanism (not shown) along guide rails 106 that are secured to the column 105. The electromagnet 108 is attached to the bottom surface of the elevating body 107 to lift the support plate 21 with its magnetic force.

The goniometer 28 will now be described in detail. As shown in FIGS. 18 and 22, the ingot 13 held on the support rollers 44 of the rotating mechanism 38 is moved to a measuring position in the goniometer 28 by moving the platform 42 of the carriage 39 along the guide rails 41. An X-ray projector 111, which irradiates X-rays horizontally at a predetermined angle toward the end face of the ingot 13, and an X-ray interceptor 112, which intercepts the irradiated X-rays, are arranged in the goniometer 28. The projector 111 and the interceptor 112 are connected to each other by a bracket 113 so that the angle between the projector 111 and the interceptor 112 coincides with a predetermined angle. The bracket 113 is fixed to a table 114. An adjusting apparatus 115 pivots or lifts and lowers the table 114 to adjust the irradiation angle and irradiation position of the X-rays with respect to the end face of the ingot 13. The interceptor 112 is connected to a judging device 116, which judges whether the output data of the intercepted X-rays is maximum or not, and to an angle computing apparatus 117. The computing apparatus 117 computes the inclination θ of the crystal orientation in the horizontal direction with respect to the center axis L1 of the ingot 13 from the output data obtained by reflecting the X-rays at four sections on the end face of the ingot 13. The inclination e is computed through a method described in, for example, Japanese Unexamined Patent Publication No. 3-255948.

Figure 31:
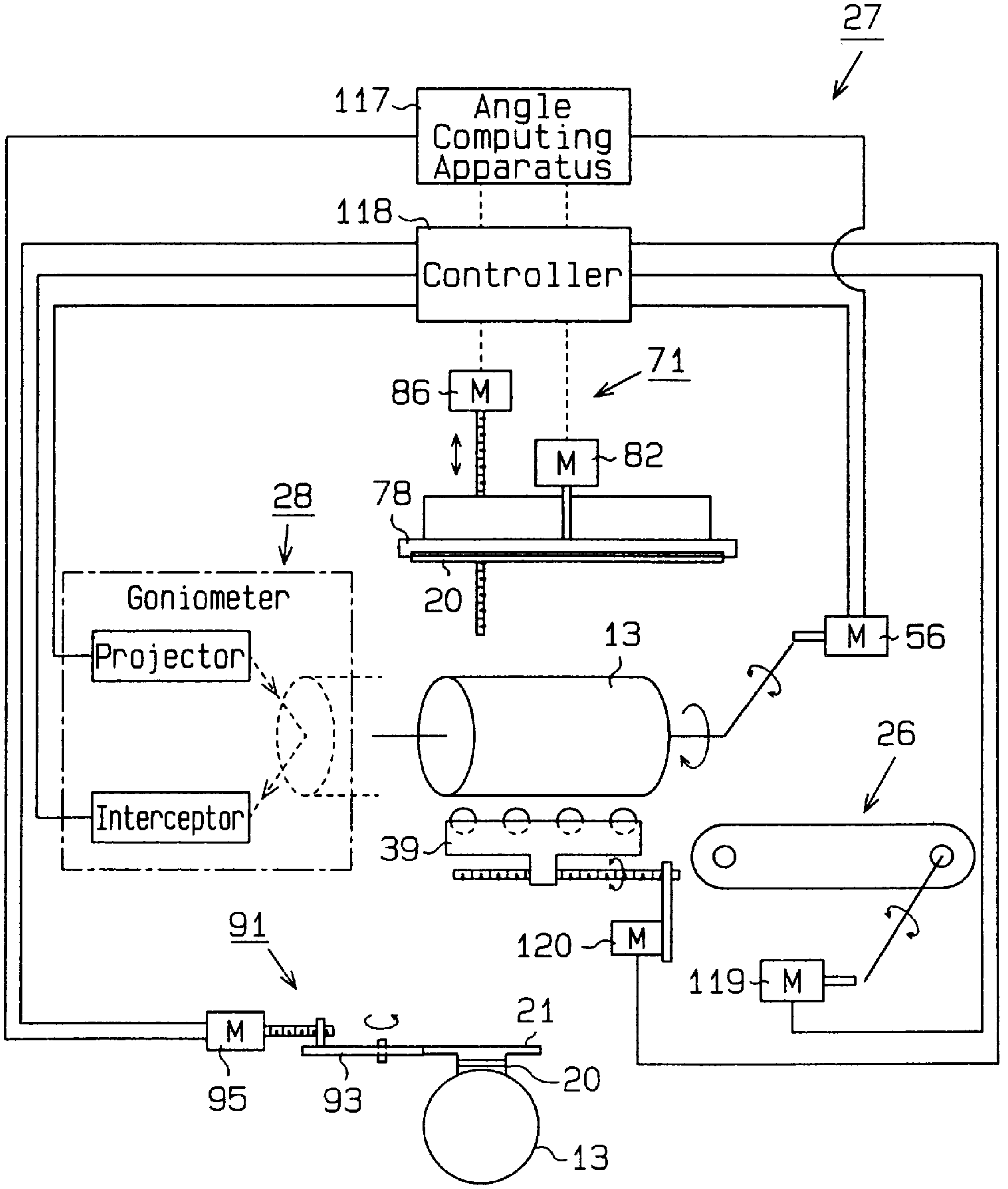
FIG. 31 is a schematic drawing showing a controller.

As shown in FIG. 31, the adhering apparatus 27 includes a controller 118. The controller 118 controls the motors 56, 82, 86, 95, a drive motor 119 of the belt conveyor 26, a motor 120 of the carriage 39, and the goniometer 28. The angle computing apparatus 117 computes the rotational angle of the ingot 13 and the adjusting plate 93 based on the rotation of the motors 56, 95 and sends the computed results to the controller 118.

A mounting mechanism 121 provided for each wire saw 326 will now be described in detail with respect to FIGS. 29 and 30. The mounting mechanism 121 is used to hold the support plate 21, which is adhered to the ingot 13.

Figure 29:
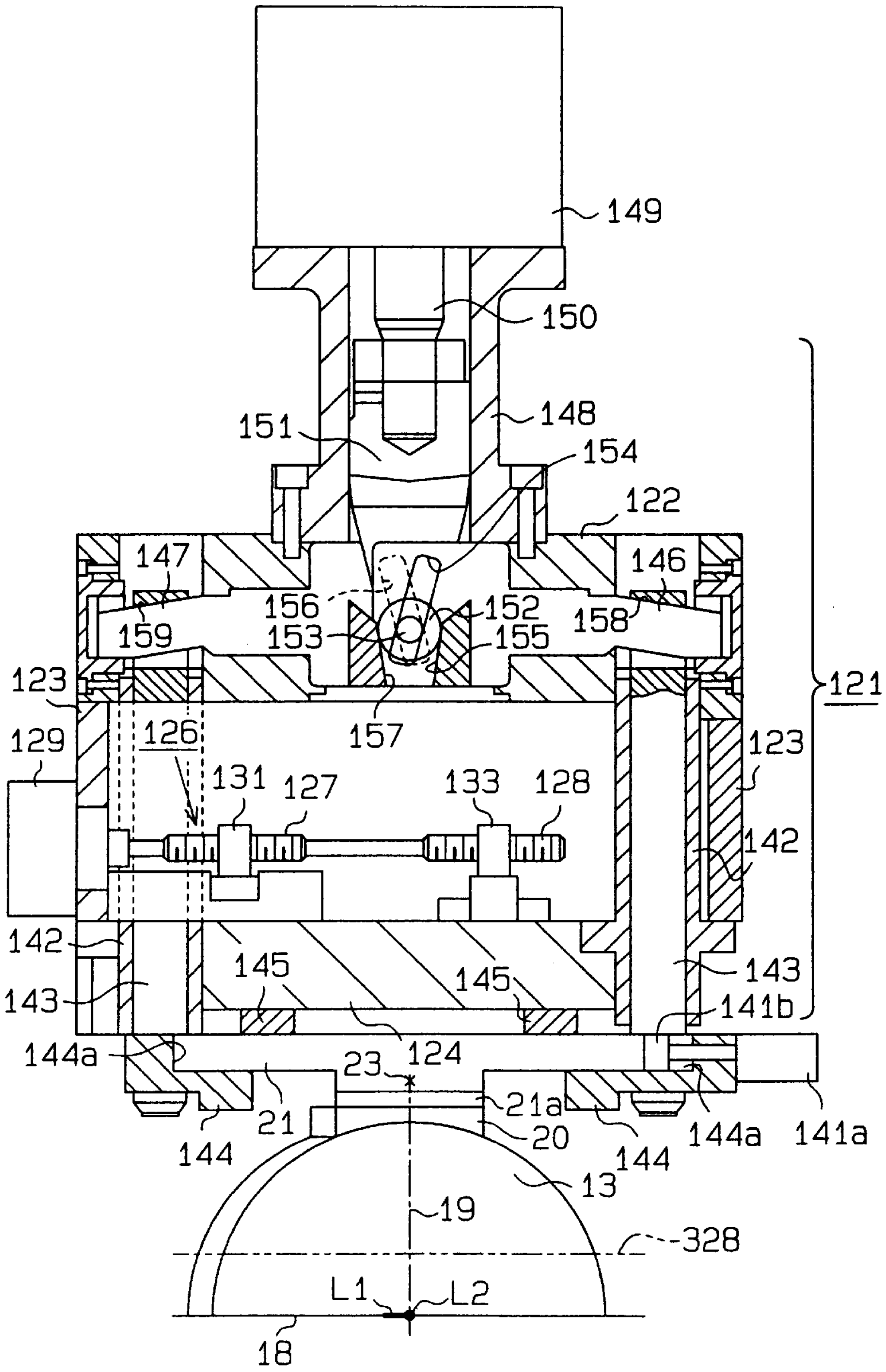
FIG. 29 is a cross-sectional side view showing an ingot mounting mechanism.
Figure 30:
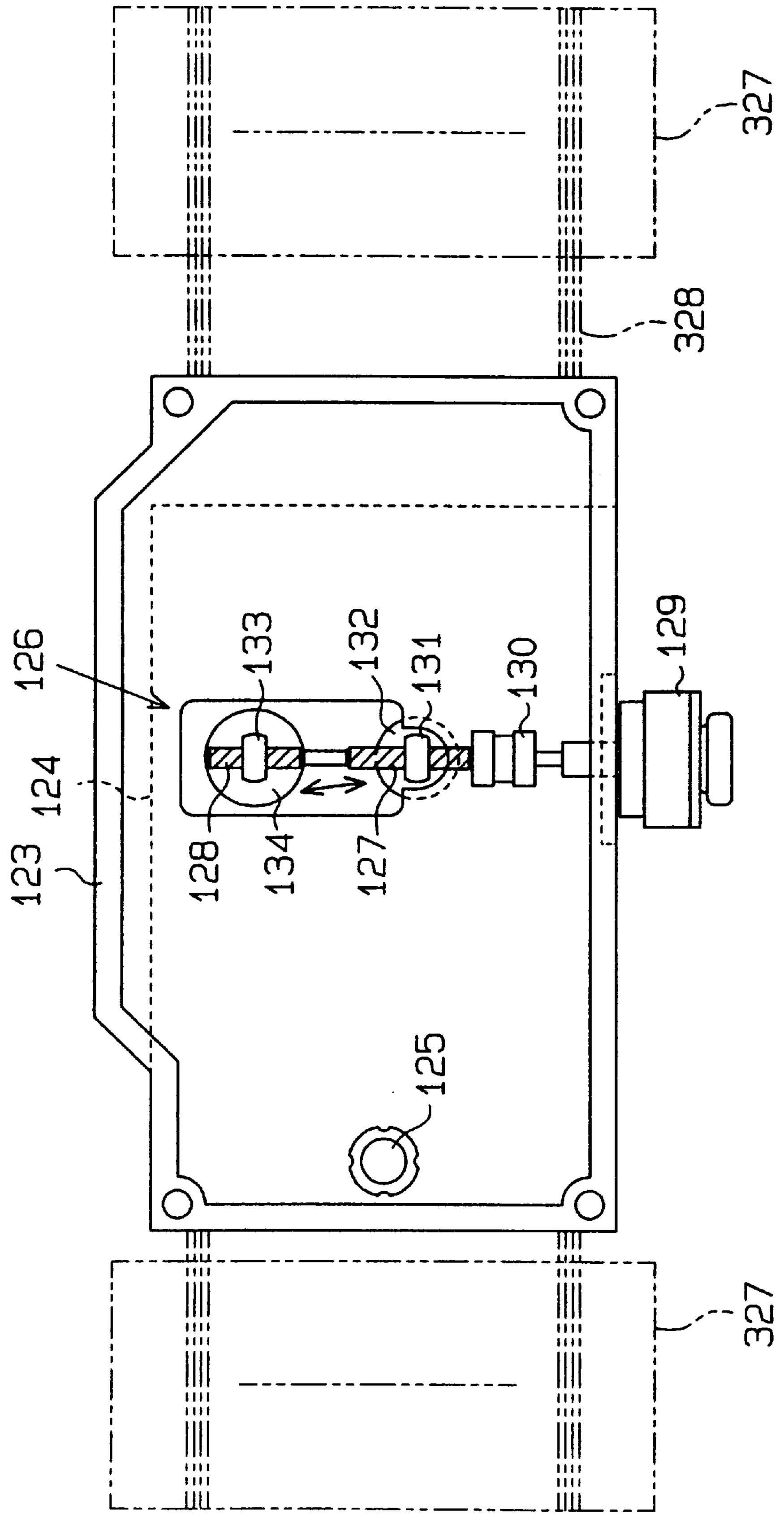
FIG. 30 is a partial plan view showing the ingot mounting mechanism.

As shown in FIGS. 29 and 30, a support block 122 is secured to an elevating column (not shown) of the wire saw 326. A fixed holder 123 is fastened to the support block 122 by bolts, or the like. A movable holder 124 is connected to the bottom surface of the fixed holder 123 by a connecting shaft 125. The movable holder 124 pivots horizontally. An adjusting mechanism 126 is provided between the fixed and movable holders 123, 124 to adjust the rotational angle of the movable holder 124 along the horizontal plane.

The adjusting mechanism 126 has a rotational knob 129 that is supported by the fixed holder 123. A screw rod constituted by aligned first and second screws 127, 128 is connected to the knob 129 by way of a universal joint 130. The first screw 127 is screwed through an actuating piece 131. A rotating element 132 fixed to the lower end of the actuating piece 131 is pivotally supported by the fixed holder 123. The second screw 128 is screwed through an actuating piece 133. A rotating element 134 fixed to the lower end of the actuating piece 133 is pivotally supported by the movable holder 124. Accordingly, when the knob 129 rotates the first and second screws 127, 128, the movable holder 124 is pivoted horizontally about the shaft 125.

The support plate 21, to which the ingot 13 is secured, is attached to the bottom surface of the movable holder 124.

A pair of support cylinders 142 extending downward is fixed to the support block 122. A rod 143 is inserted through each cylinder 142. A mounting piece 144 is formed integrally with the bottom end of each rod 143. Each mounting piece 144 is provided with an attaching groove **144*a*, in which the support plate 121 may be inserted. Spacers 145 are arranged under the bottom of the movable holder 124. A pressing body 141*b* is movably arranged in the right groove 144*a*, as viewed in FIG. 29. A cylinder 141*a* moves the pressing body 141*b* horizontally. The support plate 21 inserted in the grooves 144*a* is pressed by the pressing body 141*b* and abutted against the wall of the left groove 144*a*, as viewed in FIG. 29. This enables the support plate 21** to be positioned horizontally.

As shown in FIG. 29, a pair of cam members 146, 147 are accommodated in the support block 122. A cylinder 148 is fixed to the upper surface of the support block 122. An air cylinder 149 extending downward is fixed to the upper end of the cylinder 148. An actuating rod 151 is connected to a rod 150 of the cylinder 149. A cam follower 152 and a cam pin 153 are coupled to the lower end of the actuation rod 151. An inclined cam groove 154 and cam surface 155 are defined in the cam member 146. In the same manner, an inclined cam groove 156 and cam surface 157 are defined in the cam member 147. The cam follower 152 contacts both cam surfaces 155, 157. A cam pin 153 is engaged with both cam grooves 154, 156.

When the cylinder 149 lowers the actuating rod 151, the cam follower 152 and the cam pin 153 are lowered. This abuts the cam follower 152 against the cam surfaces 155, 157 and causes the cam members 146, 147 to move away from each other. As the cam members 146, 147 move away from each other, the cam surfaces 158, 159 lift the associated rods 143. This lifts the associated mounting piece 144 and causes the support plate 21 to be clamped between the mounting pieces 144 and the spacers 145. The clamping of the support plate 21 positions the plate 21 along the vertical direction.

Contrarily, when the cylinder 149 raises the actuating rod 151, the cam follower 152 and the cam pin 153 are raised. This moves the cam pin 153 along the cam grooves 154, 156 and moves the cam members 146, 147 toward each other. As the cam members 146, 147 move toward each other, the cam surfaces 158, 159 lower the associated rods 143. This lowers the associated mounting piece 144 and causes the support plate 21 to be released.

Rotation of the knob 129 enables fine adjustment of the angles of the movable holder 124 and the attaching pieces 144 with respect to the horizontal plane. The adjustment cancels the dimensional margins of the mounting mechanism 121 that may be produced when assembling its parts.

More specifically, the angles of the movable holder 124 and the attaching plates 144 with respect to the horizontal plane are finely adjusted so that the attaching groove 144*a* of each mounting piece 144 extends perpendicular to the drawing direction of the wire 328 employed by the associated wire saw 326 (FIG. 30).

Figure 32:
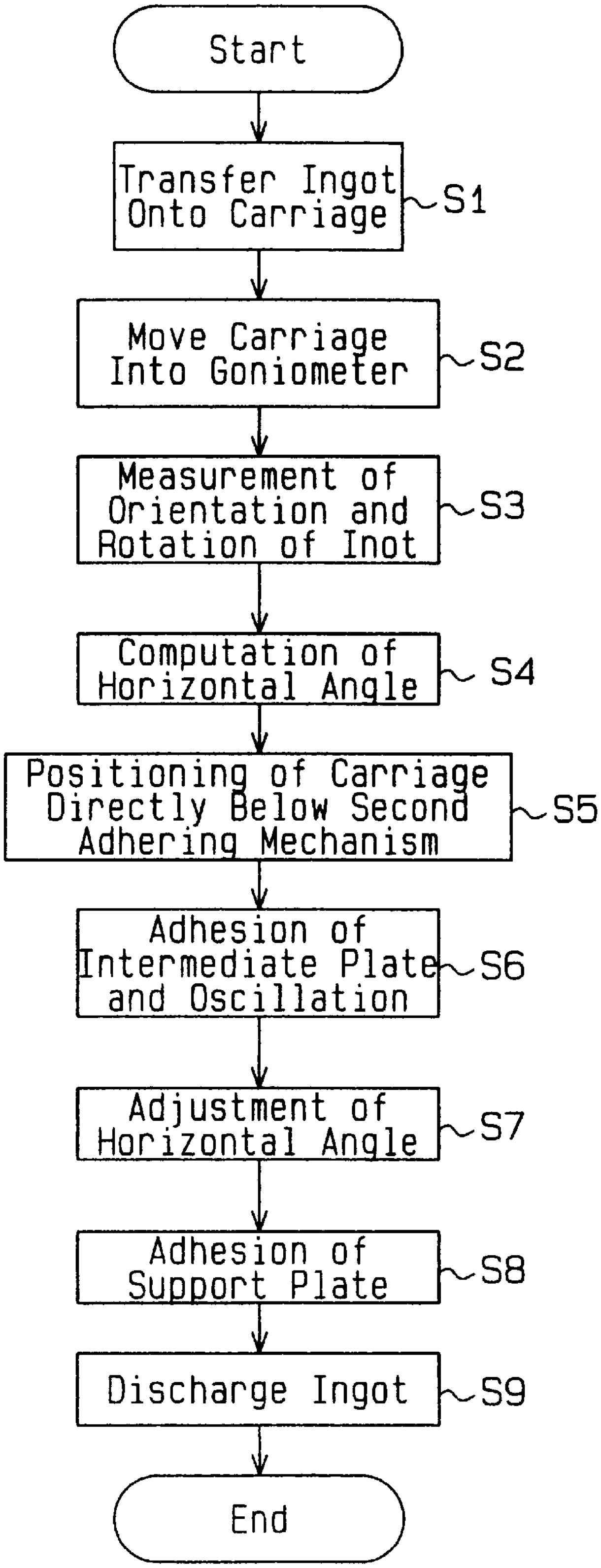
FIG. 32 is a flowchart showing the adhering procedures when adhering the support plate to the ingot.

The method for adhering the intermediate and support plates 20, 21 to the ingot 13 will now be described with reference to FIG. 32.

The ingot 13 retrieved from the stocker 25 is conveyed by the belt conveyor 26 and transferred onto the plurality of support rollers 44 of the carriage 39, as shown in FIG. 18 (step S1). The ingot 13 held on the support rollers 44 is positioned with respect to the carriage 39 when it abuts against the restricting piece 46.

As shown in FIG. 19, the drive rollers 55 are moved toward the clamp rollers 48 to clamp the ingot 13 between the rollers 48, 55. When clamped, the ingot 13 is lifted from the support rollers 44. The carriage 39 holding the ingot 13 is then moved into the goniometer 28 (step S2). When the end face of the ingot 13 reaches a predetermined position at where its crystal orientation is measured (the position shown by the double-dotted line in FIGS. 18 and 22), a braking apparatus (not shown) fixes the position of the platform 42 of the carriage 39.

The ingot 13 is then rotated by the rotating mechanism 38 to measure its crystal orientation L2 (step S3). More specifically, the drive rollers 55 are rotated by the servo motor 56. This, in turn, rotates the ingot 13, which is supported by the four rollers 48, 55. During the rotation, the projector 111 irradiates X-rays against the end face of the ingot 13 while the interceptor 112 intercepts the reflected X-rays. The judging device 116 judges whether the output data of the X-rays intercepted by the interceptor 112 is maximum or not. If maximum, the rotation of the ingot 13 is stopped.

Figure 26:
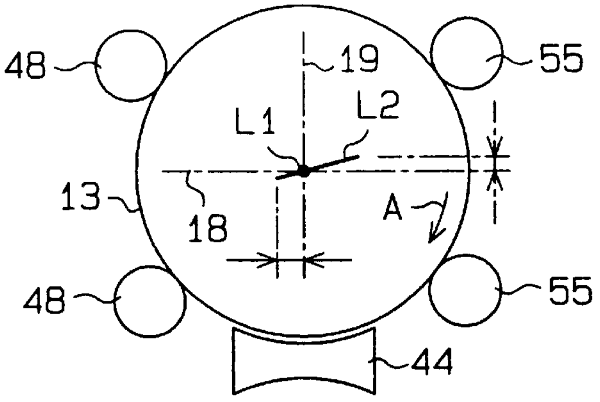
FIG. 26 is an explanatory drawing showing how the crystal orientation of the ingot is measured.
Figure 27:
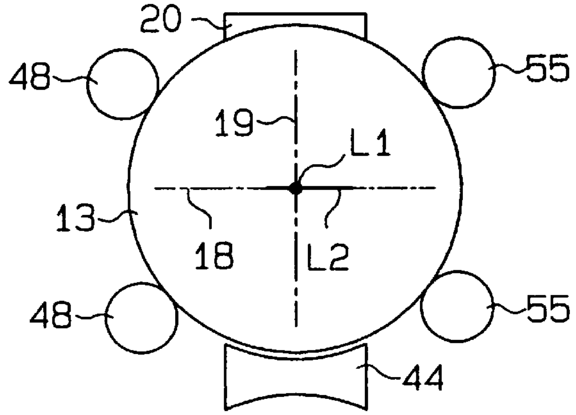
FIG. 27 is an explanatory drawing showing how the crystal orientation of the ingot is measured.

As an example, FIG. 26 shows the crystal orientation L2 of the ingot 13 inclined with respect to the horizontal plane 18. From this state, the ingot 13 is rotated in the direction indicated by arrow A. When the crystal orientation L2 becomes aligned with the horizontal plane 18, as shown in FIG. 27, the output data of the X-rays intercepted by the interceptor 112 becomes maximum. Accordingly, the judging device 116 detects the maximum data and stops the rotation of the ingot 13.

When the rotation of the ingot 13 is stopped, the value detected by the encoder 61, which is coupled to the servo motor 56, is initialized. From this state, the ingot 13 is rotated four times, 90 degrees each time by the motor 56. The output data of the reflected X-rays is read for every 90 degrees. Based on the data taken at four angles, the computing apparatus 117 computes the inclination $\theta$ (FIG. 25) of the crystal orientation L2 of the ingot 13 in the horizontal direction with respect to the center axis L1 of the ingot 13 (step S4).

After the projector 111 stops irradiating X-rays, the carriage 39 supporting the ingot 13 is moved out of the goniometer 28 along the guide rails 41 toward a position located directly below the second adhering mechanism 71 (step S5). The intermediate plate 20 is held by the holder 78 of the second adhering mechanism 71. The ingot 13 on the carriage 39 is located directly below the intermediate plate 20.

Figure 20:
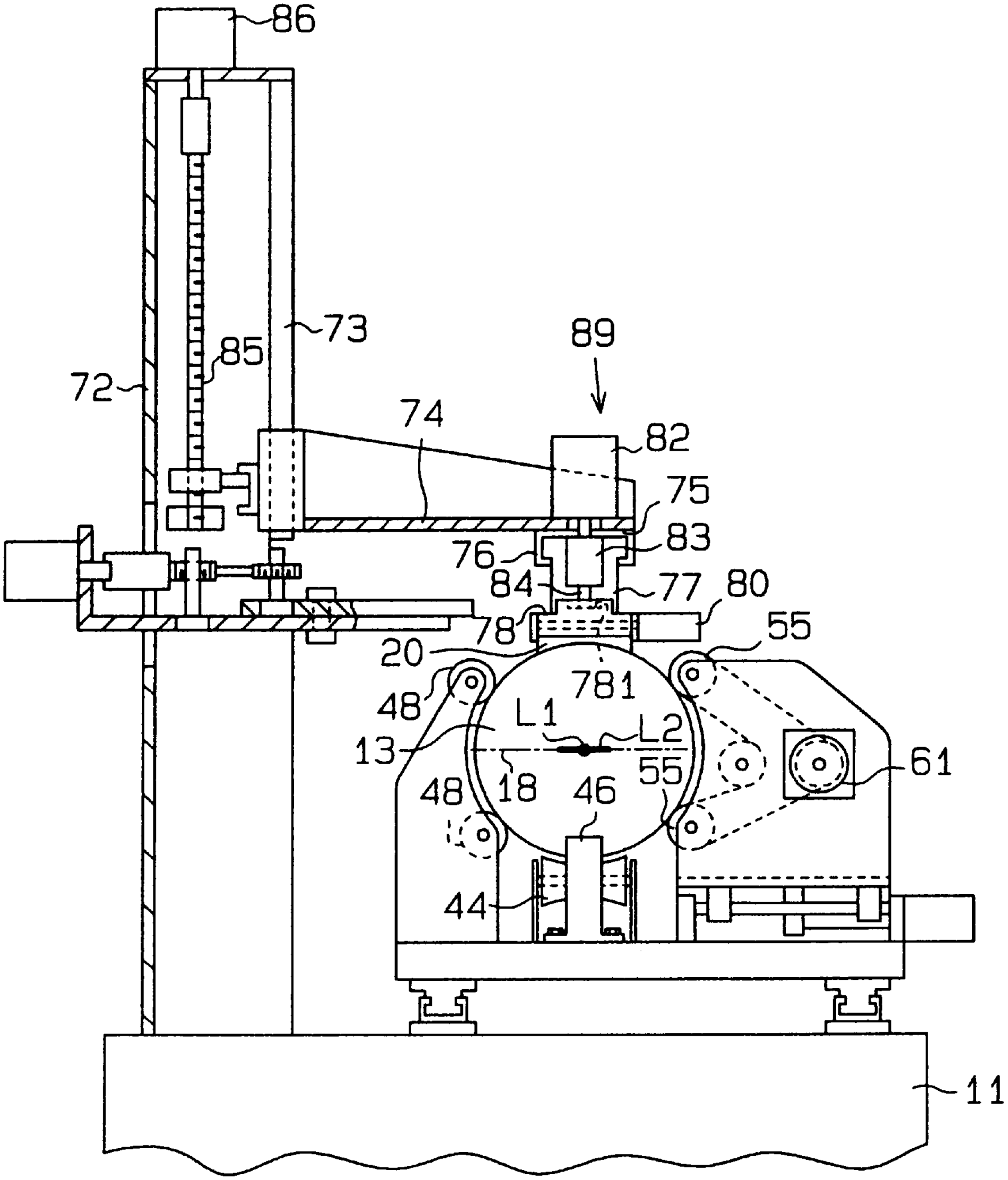
FIG. 20 is a cross-sectional side view showing the adhering apparatus and the goniometer.

The motor 86 than lowers the arms 74, by which the intermediate plate 20 is held, along the guide rails 73. As shown in FIG. 20, when the intermediate plate 20 contacts the ingot 13, the lowering of the arms 74 is stopped. An adhesive is applied to the bottom surface of the intermediate plate 20 beforehand. Thus, the contact adheres the intermediate plate 20 and the ingot 13 to each other with their axes substantially aligned. The motor 82 of the oscillating mechanism 89 reciprocates the holder 78 along the center axis L1 of the ingot 13. The reciprocation eliminates bubbles contained in the adhesive and enables secure adhesion of the intermediate plate 20 within a short period of time (step S6).

When the adhesion of the intermediate plate 20 is completed, the cylinder 80 is actuated to release the intermediate plate 20 from the clamp plates 79. Afterwards, the support arms 74 are lifted by the motor 86 to a stand-by position where the holder 78 becomes located at the top end of the column 72.

The inclination e (FIG. 25) of the crystal orientation L2 of the ingot 13 along the horizontal plane 18 with respect to the center axis L1 of the ingot 13 is computed in step S4. The servo motor 95 of the second adjusting mechanism 91 is driven to adjust the horizontal inclination $\alpha$ of the adjusting plate 93 with respect to the center axis L1 of the ingot 13 so that it coincides with the inclination $\theta$ of the crystal orientation L2 (step S7), as shown by the double-dotted line in FIG. 23.

The support plate 21, to which the insulating plate 21*a* is adhered beforehand, is positioned above the ingot 13 by the first adhering mechanism 103. An adhesive is applied to the bottom surface of the insulating plate 21*a*. The side surface of the support plate 21 is abutted against the side surface of the adjusting plate 93. This enables the crystal orientation L2 of the ingot 13 to be parallel to the mounting axis 23 of the support plate 21. In other words, the crystal orientation L2 of the ingot 13 and the mounting axis 23 of the support plate 21 are aligned along the same vertical plane. In this state, the first adhering mechanism 103 releases the support plate 21 and places the support plate 21 on the intermediate plate 20. This results in the support plate 21 being adhered to the intermediate plate 20 by the insulating plate 21*a* (step S8).

The cylinder 53 then moves the drive rollers 53 away from the ingot 13 and releases the ingot 13 from the rollers 48, 55. This places the ingot 13, to which the support plate 21 is adhered, on the support rollers 44. The ingot 13 is transferred to the belt conveyor 26 by the rotation of the support rollers 44 (step S9).

The ingot 13 is then conveyed to the drying apparatus 30 by the conveyor 29 to dry the adhesive. Afterwards, the ingot 13 is sent to the designated wire saw 326 by the conveyor 29 and the transporter 332.

When the adhesion is completed, the crystal orientation L2 of the ingot 13 and the mounting axis 23 of the support plate 21 is perpendicular to the plane of FIG. 28 and parallel to the horizontal plane 18. The center axis L1 of the ingot 13 is inclined by $\theta$ with respect to the crystal orientation L2 along the horizontal plane 18 (FIG. 23).

The ingot 13 is transferred to the mounting mechanism 121 of the designated wire saw 326 from the transporter 332 by a transferring apparatus (not shown). As shown in FIG. 29, the support plate 21 on the ingot 13 is inserted into the mounting pieces 144 of the mounting mechanism 121. The mounting pieces 144 then clamp and position the support plate 21 in the mechanism 121. The ingot 13 is held by the mounting mechanism 121 so that the crystal orientation L2 of the ingot 13 is horizontal and perpendicular to the wire 328. The ingot 13 is sliced by the wire 328 to simultaneously produce a plurality of thin wafers 13*a*.

Figure 33:
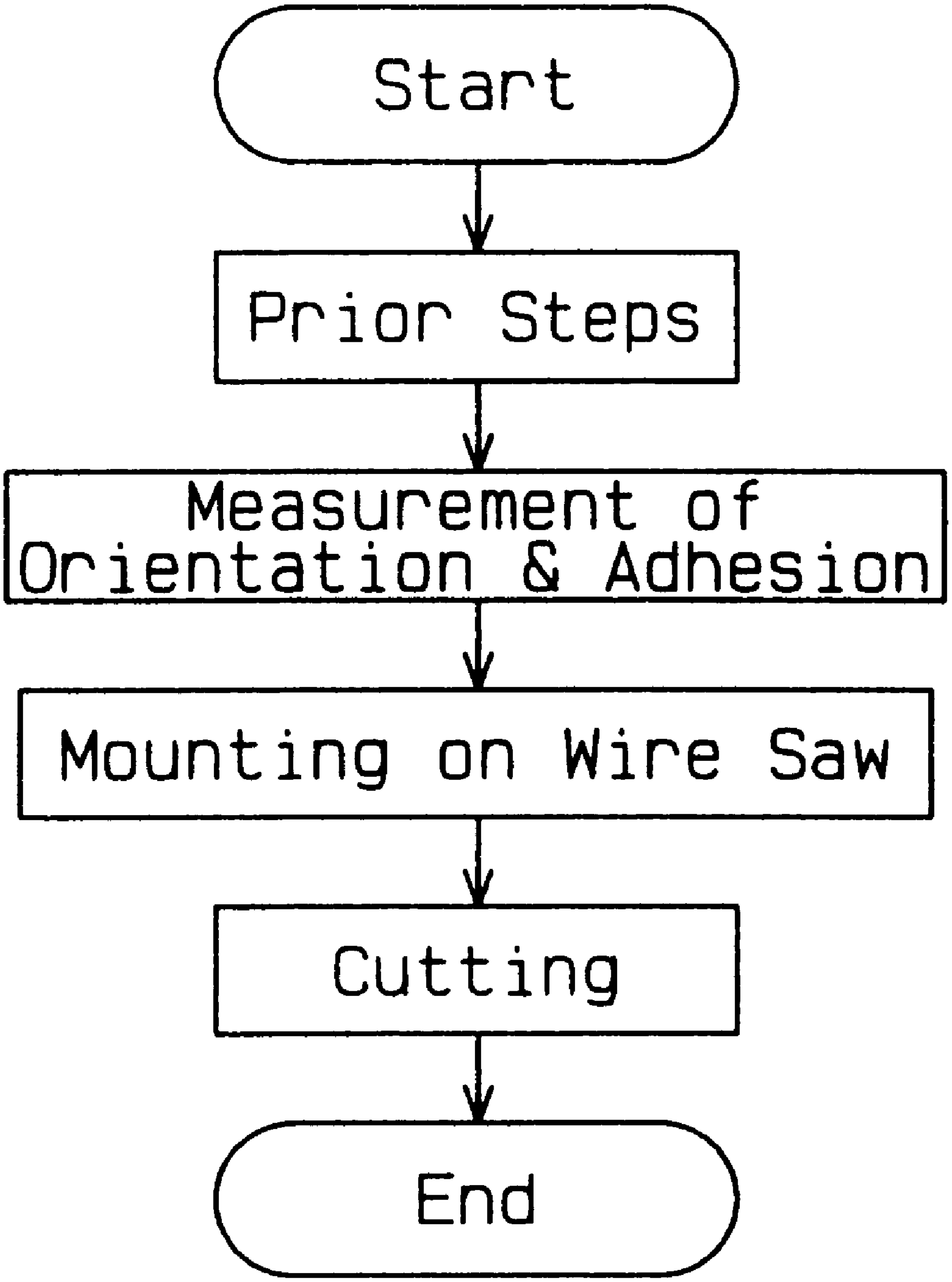
FIG. 33 is a flowchart showing the slicing procedures when slicing the ingots.

The crystal orientation L2 of the ingot 13 is aligned along a vertical plane that is perpendicular to the drawing direction (horizontal direction) of the wire 328 when the support plate 21 is attached to the mounting pieces 144 of the mounting pieces 144 in the wire saw 326. Therefore, the sliced surfaces of each wafer 13*a* is parallel to the crystal plane of the ingot 13. Accordingly, as shown in the flowchart of FIG. 33, the ingot 13 is sliced into wafers 13*a* immediately after the ingot 13 is mounted on the wire saw 326 without adjusting the angle of the ingot 13.

The advantageous effects of the second embodiment will now be described.

(1) The center axis L1 of the ingot 13 is kept horizontal when rotating it to align the crystal orientation L2 of the ingot 13 along a horizontal plane. The ingot 21 and the support plate 21 are then adhered to each other with the crystal orientation L2 of the ingot 13 being parallel to the mounting axis 23 of the support plate 21. Therefore, the ingot 13 may be sliced immediately and accurately merely by attaching the support plate 21 to the mounting mechanism 121 of the designated wire saw 326. Accordingly, each wire saw 326 need not be provided with an angle setting device. As a result, this structure drastically reduces the equipment costs of the entire production system, especially when a plurality of wire saws 326 are employed. In addition, the ingot 13 is automatically attached to the mounting mechanism 121 of the designated wire saw 326 with the support plate 21 adhered thereon. This enables the mounting of the ingot 13 to be performed quickly and thus improves the operational rate of the wire saw 326.

(2) The rotating mechanism 38, which rotates the ingot 13 about its center axis L1 is combined with a portion of the goniometer 28 and the first adjusting mechanism 40, which aligns the crystal orientation L2 of the ingot 13 along a horizontal plane. This simplifies the structure of the production system.

(3) The ingot 13 is positioned at a predetermined position by the clamp-rollers 48 and the drive rollers 55, and lifted from the support rollers 44, simultaneously. This enables smooth rotation of the ingot 13 and allows accurate orientation measurement.

A third embodiment of the present invention will hereafter be described with reference to FIGS. 35–44. The structure of the adhering apparatus 27 in this embodiment differs from that employed in the second embodiment. In the third embodiment, parts that are identical to those employed in the second embodiment are denoted with the same numerals.

Figure 35:
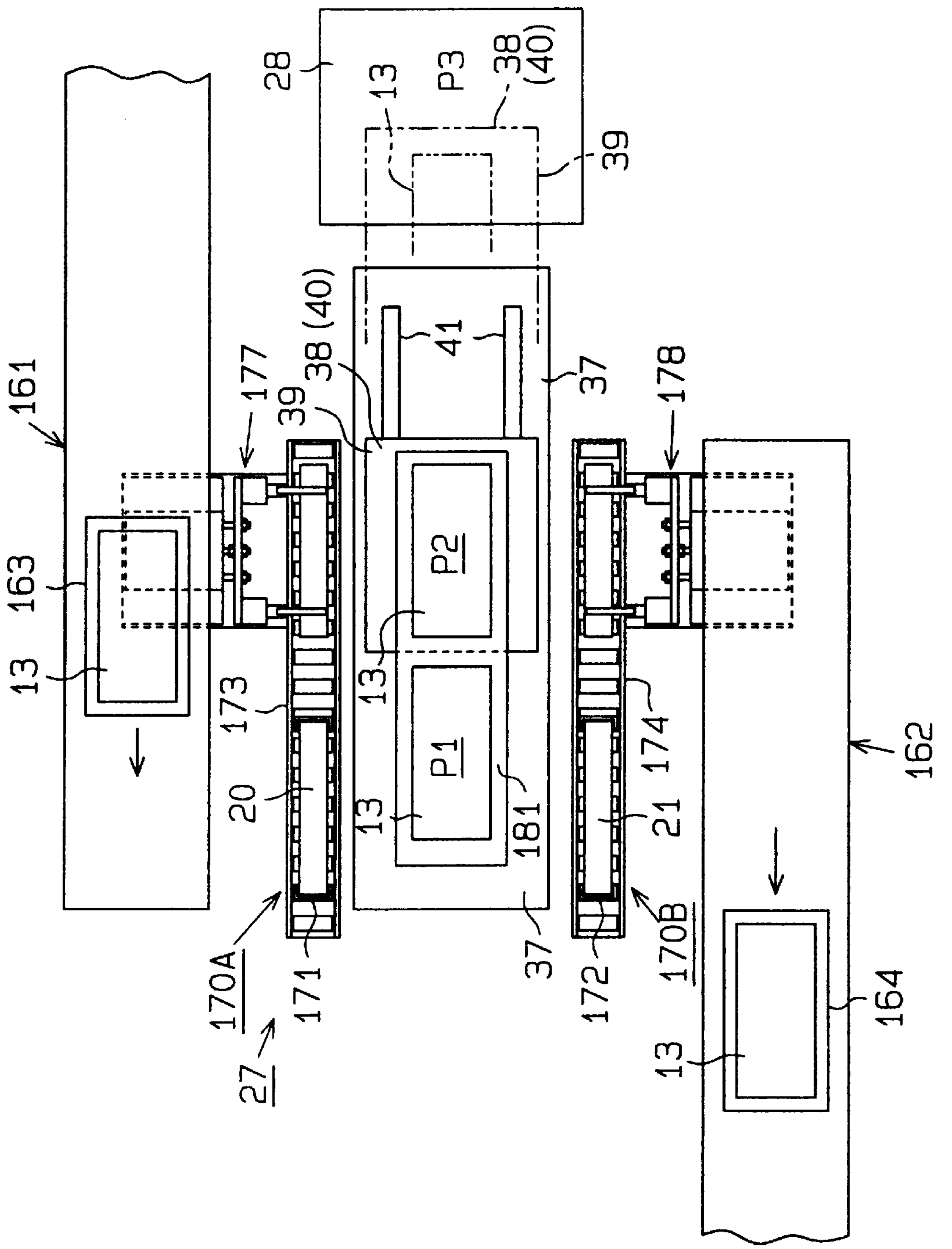
FIG. 35 is a plan view showing a third embodiment of the present invention.
Figure 36:
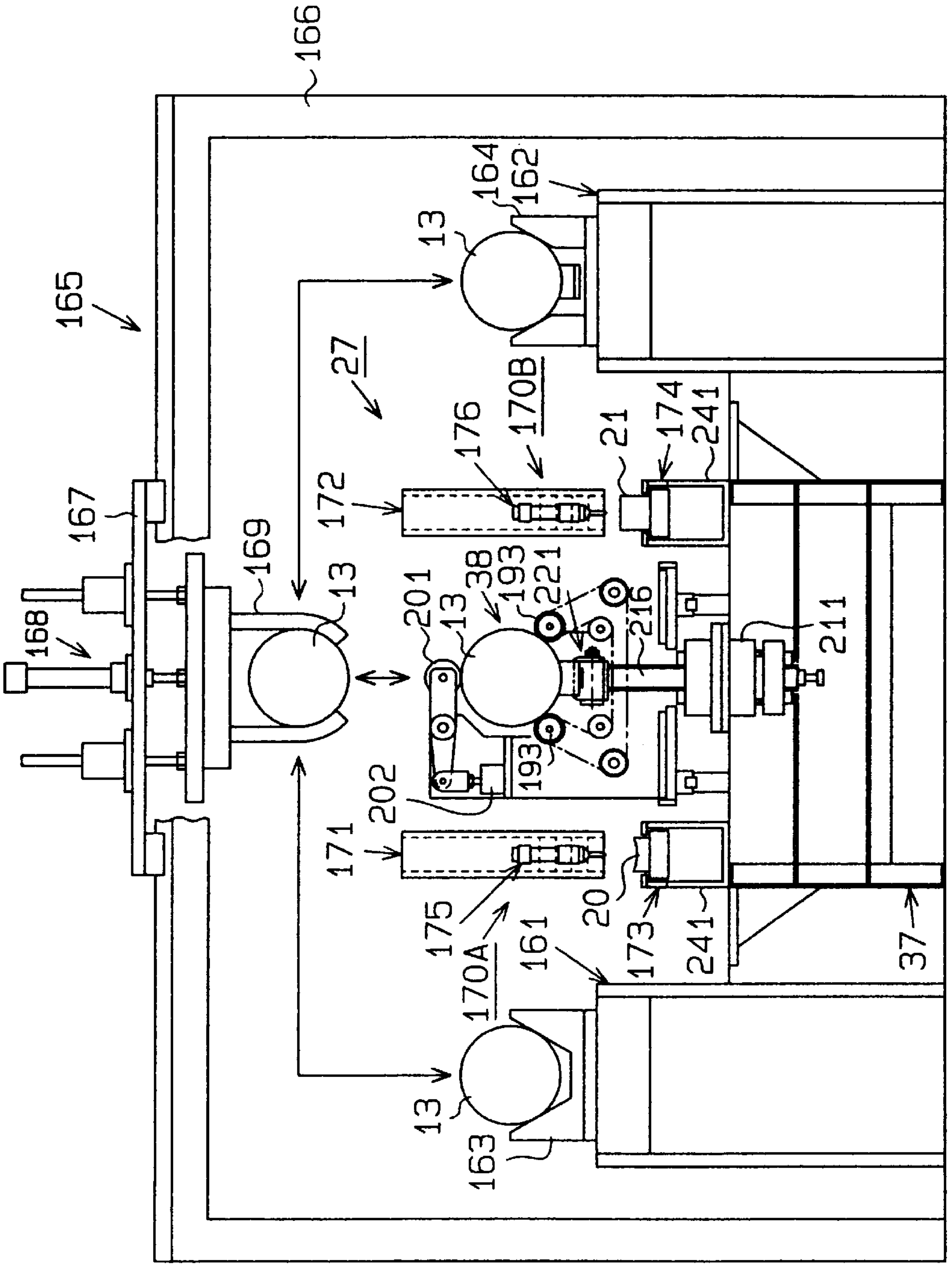
FIG. 36 is a front view showing the third embodiment.
Figure 37:
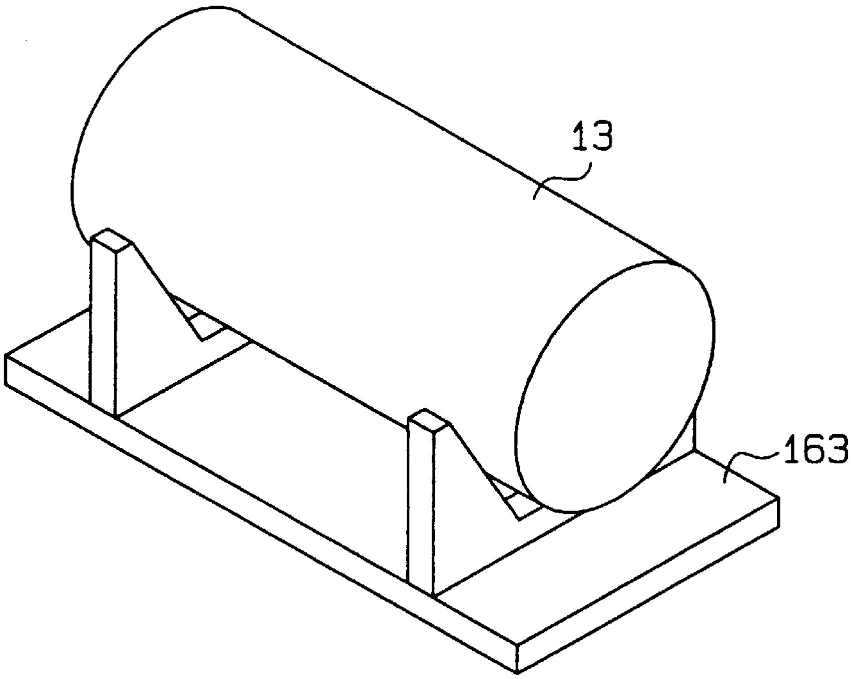
FIG. 37(*a*) is a perspective view showing a pallet and an ingot.
Figure 37:
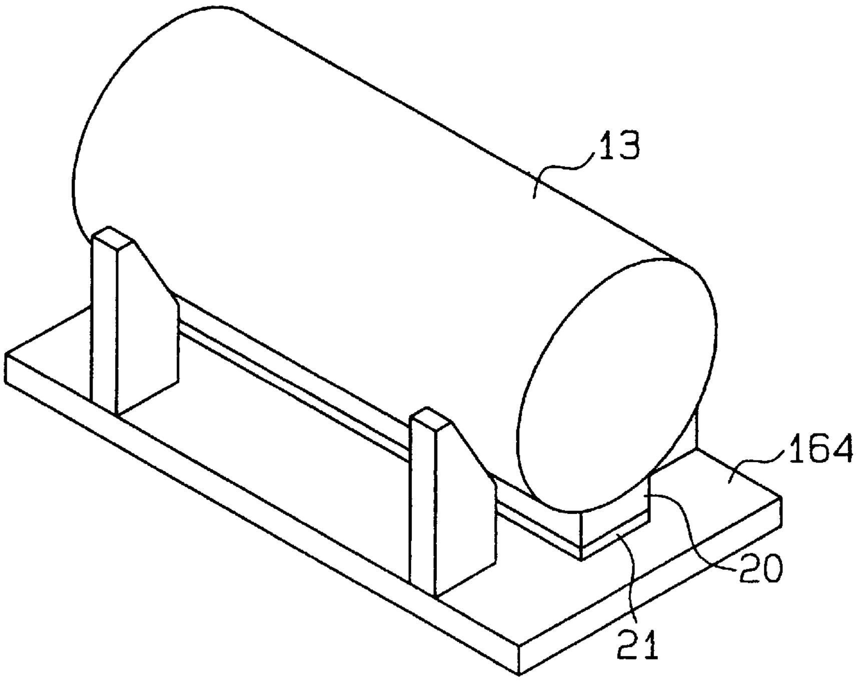

As shown in FIGS. 35 and 36, a loading conveyor 161 and an unloading conveyor 162, which are constituted by belt conveyors, are arranged on each side of the adhering apparatus 27. An ingot 13 is retrieved from a stocker similar to that employed in the second embodiment. The ingot 13 is conveyed by the loading conveyor 161 to a position opposed to the adhering apparatus 27. When conveyed by the loading conveyor 161, the ingot 13 is held on a pallet 163, which is shown in FIG. 37(*a*). After the adhering apparatus 27 adheres the intermediate plate 20 and the support plate 21 to the ingot 13, the unloading conveyor 162 conveys the ingot 13 to a drying apparatus similar to that employed in the second embodiment. When conveyed by the unloading conveyor 162, the ingot 13 is held on a pallet 164, which is shown in FIG. 37(*b*).

A first transferring mechanism 165 is provided above the adhering apparatus 27, the loading conveyor 161, and the unloading conveyor 162. The transferring mechanism 165 includes a U-shaped frame 166, a horizontal moving mechanism 167 supported by the frame 166, an elevating mechanism 168 provided with cylinders and supported by the moving mechanism 167, and a gripping mechanism 169 secured to the bottom end of the elevating mechanism 168. When the pallet 163, which the ingot 13 is held on, is conveyed to the position opposed to the adhering apparatus 27, the gripping mechanism 169 clamps and lifts the ingot 13 from the pallet 163. The first transferring mechanism 165 moves the ingot 13 horizontally to a transferring position P1 (FIG. 39) to transfer the ingot 13 to a second transferring mechanism 181. The first transferring mechanism 165 also retrieves the ingot 13 from the second transferring mechanism 181 at position P1 by using the gripping mechanism 169 to clamp and lift the ingot 13. The first transferring mechanism 165 then moves the ingot 13 horizontally to transfer the ingot 13 to the pallet 164, which is standing by on the unloading conveyor 162.

In the same manner as in the second embodiment, the adhering apparatus 27 includes the rotating mechanism 38, the carriage 39, the first adjusting mechanism 40, the second adhering mechanism 71, the second adjusting mechanism 91, and the first adhering mechanism 103. The adhering apparatus 27 further includes a first feeding mechanism 170A and a second feeding mechanism 170B. The first feeding mechanism 170A feeds intermediate plates 20, to which an adhesive is applied, to the second adhering mechanism 17. The second feeding mechanism 170B feeds support plates 21, to which an adhesive is applied, to the first adhering mechanism 103. The first feeding mechanism 170A is arranged between the rotating mechanism 38 and the loading conveyor 161. The second feeding mechanism 170B is arranged between the rotating mechanism 38 and the unloading conveyor 162.

The first feeding mechanism 170A has a stocker 171, a roller conveyor 173, an applying mechanism 175, and a loading mechanism 177. The stocker 171 has a plurality of intermediate plates 20 stacked therein and sends the plates 20 to the roller conveyor 173 one at a time. The roller conveyor 173 conveys the intermediate plate 20 sent from the stocker 171 to the applying mechanism 175. The applying mechanism 175 applies an adhesive to the upper surface of the intermediate plate 20. The loading mechanism 177 transfers the intermediate plate 20, to which an adhesive is applied, to the second adhering mechanism 71.

In the same manner as the first feeding mechanism 170A, the second feeding mechanism 170B has a stocker 172, a roller conveyor 174, an applying mechanism 176, and a loading mechanism 178. The stocker 172 has a plurality of support plates 21 stacked therein and sends the plates 21 to the roller conveyor 174 one at a time. The roller conveyor 174 conveys the support plate 21 sent from the stocker 172 to the applying mechanism 176. The applying mechanism 176 applies an adhesive to the upper surface of the support plate 21. The loading mechanism 178 transfers the support plate 21, to which the adhesive is applied, to the first adhering mechanism 103.

Figure 39:
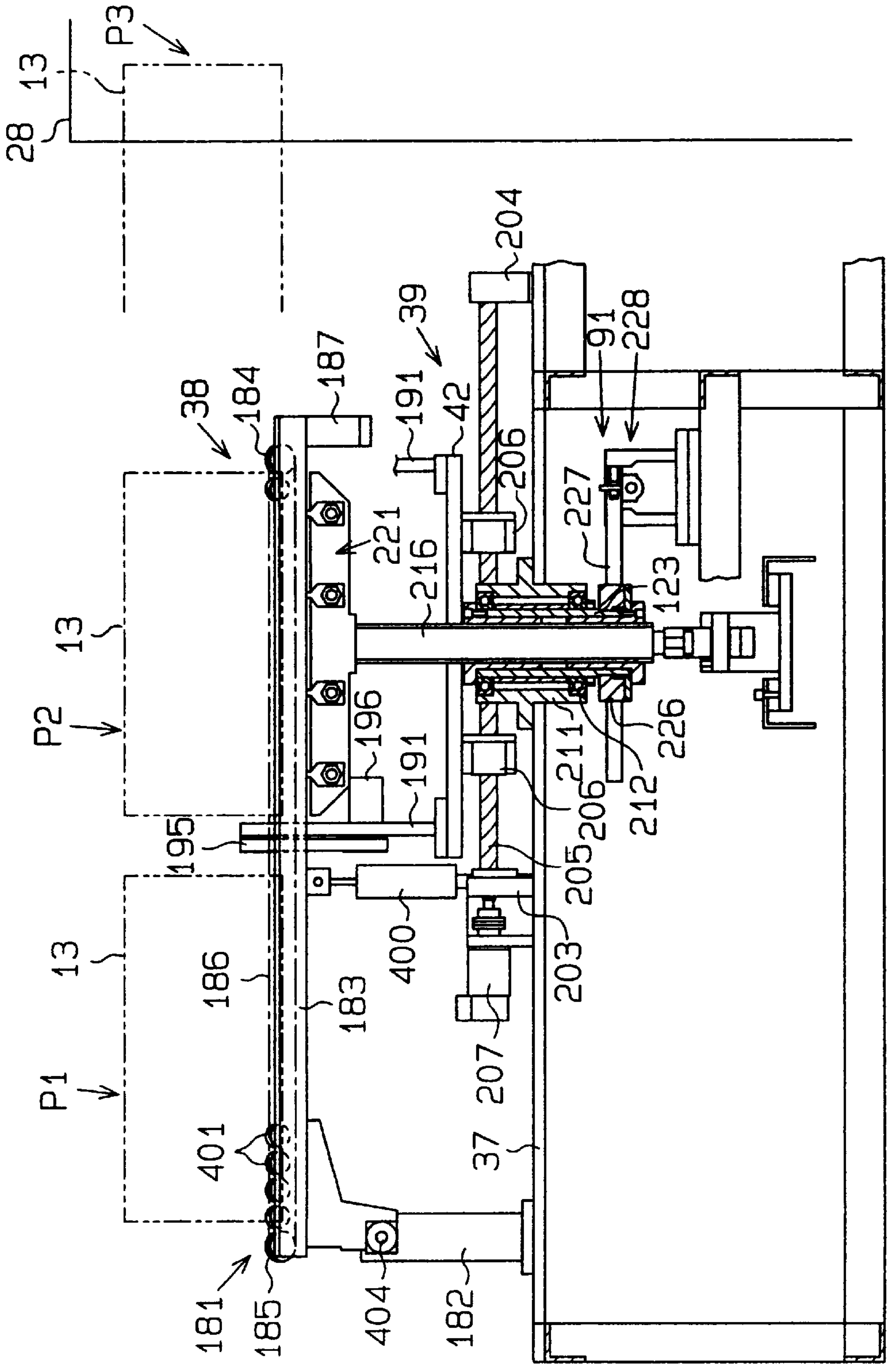
FIG. 39 is a cross-sectional view showing the adhering mechanism.

As shown in FIG. 39, the second transferring mechanism 181 is provided on the upper surface of a base 37. The transferring mechanism 181 transfers the ingot 13, to which the plates 20, 21 are to be adhered, from transferring position P1 to adhering position P2, where the plates 20, 21 are adhered to the ingot 13. The transferring mechanism 181 further transfers the ingot 13, to which the plates 20, 21 have been adhered, back to transferring position P1 from adhering position P2. The transferring mechanism 181 includes a pillar 182 that is erected on the base 37, a pair of horizontal support arms 183 inclinably connected to the pillar 182 by a shaft 404, and a cylinder 400 arranged between the middle of the support arms 183 and the base 37. A drive pulley 184 and a driven pulley 185 are supported on the ends of each support arm 183. An endless belt 186 is wound about each pair of pulleys 184, 185. Each belt 186 is rotated by a motor 187 which drives the associated drive pulley 184. A plurality of rollers 401 are arranged longitudinally on each arm 183 between the drive pulley 184 and the driven pulley 185. The rotation of each belt 186 rotate the associated rollers 401. The ingot 13 held on the rollers 401 is moved by the rotation of the rollers 401 between the transferring position P1 and the adhering position P2.

The rotating mechanism 38 and the carriage 39 will now be described in detail. The rotating mechanism 38 is combined with the first adjusting mechanism 40.

Figure 38:
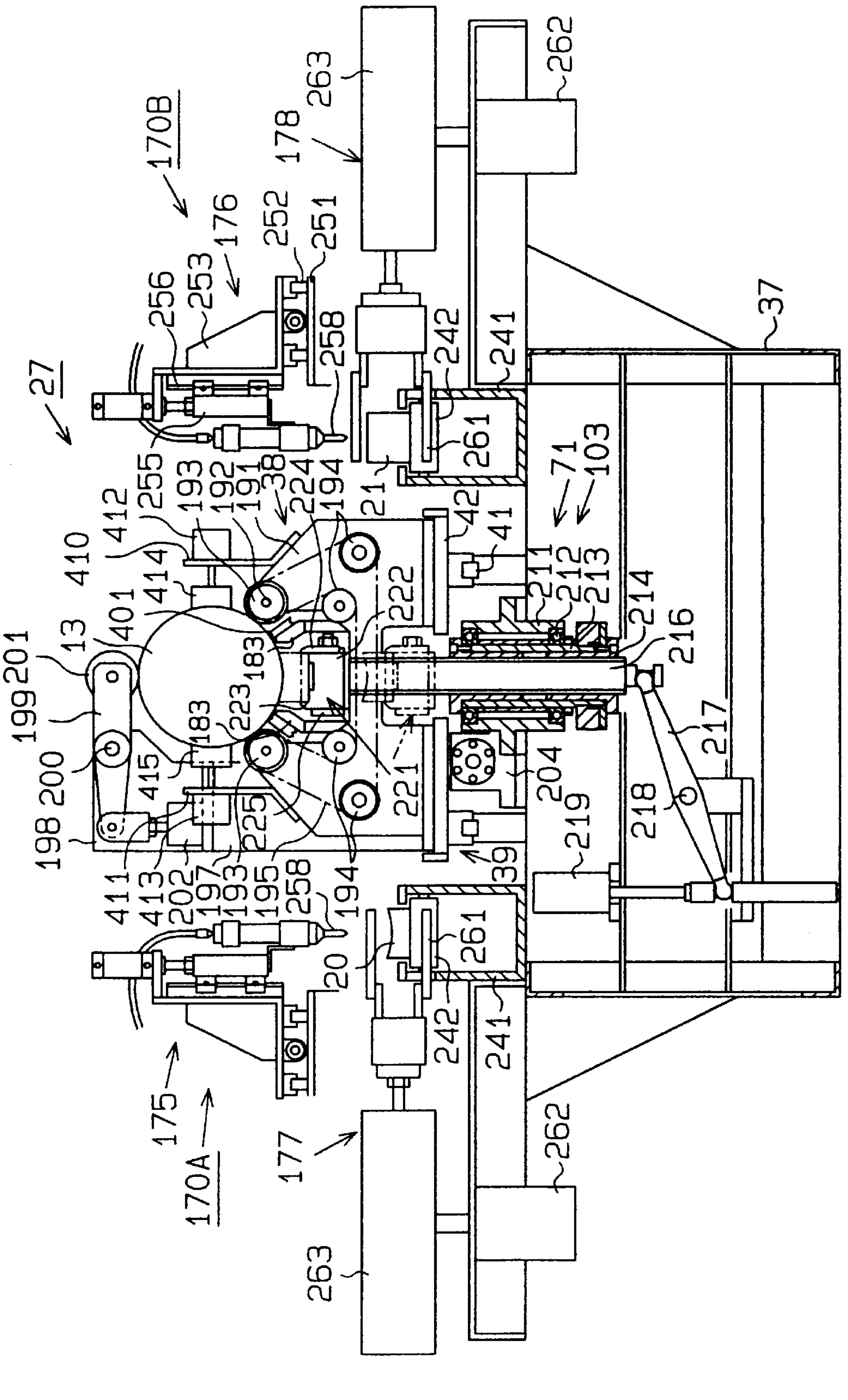
FIG. 38 is a cross-sectional view showing an adhering mechanism.

As shown in FIGS. 38 and 39, a pair of guide rails 41 extend on the base 37. A moving platform 42 moves reciprocally in a horizontal direction along the guide rails 41. A pair of support plates 191 are erected on both sides of the platform 42. A pair of drive rollers 193, each rotatably supported by a shaft 192, extends between both support plates 191. The rollers 193 extend horizontally and are parallel to each other. When the ingot 13 is moved by the rollers 401 of the second transferring mechanism 181 from the transferring position P1 to the adhering position P2, the support arms 183 are pivoted downward about the shaft 404 by the cylinder 400. The downward pivoting enables the ingot 13 held on the rollers 193 to be transferred onto the pair of rollers 193.

A pulley 194 is fixed to an end of the shaft 192 of each roller 193. The pulleys 194 are supported by one of the support plates 191. An endless belt 195 is wound about the pulleys 194. One of the pulleys 194 is rotated by a motor 196. This results in both rollers 193 being rotated by the belt 195. The rotation causes rotation of the ingot held on the rollers 193. The ingot 13 is rotated so as that its crystal orientation L2 becomes horizontal in accordance with the measured results of the goniometer 28. The crystal orientation L2 of the ingot 13 is measured through the measuring method employed in the second embodiment.

As shown in FIG. 38, a support frame 197 is erected on the platform 42. A bracket 198 is secured on the frame 197. A lever 199 is pivotally connected to the bracket 198 by a shaft 200. A pressing roller 201 is supported at the distal end of the lever 199. The lever 199 is pivoted vertically by a cylinder 202. When the ingot 13 is held on the rollers 193, a cylinder 202 is actuated to press the cylindrical surface of the ingot 13 with the pressing roller 201. This enables the ingot 13 to be clamped between the rollers 193 and 201.

Brackets 410, 411 respectively connect cylinders 412, 413 to the support plates 191. Pressing bodies 414, 415 are respectively coupled to the rod of the cylinders 412, 413. When the ingot 13 is clamped between the rollers 193, 201, the cylinders 412, 413 are actuated to clamp the cylindrical surface of the ingot 13 from beside with the associated pressing bodies 414, 415.

As shown in FIG. 39, bearings 203, 204 are arranged on the base 37 with a predetermined interval between each other. A ball screw 205 is supported horizontally between the bearings 203, 204. The ball screw 205 is screwed through a nut 206 fixed to the bottom surface of the platform 42. A motor 207 is arranged near the bearing 203 to rotate the ball screw 205. When the motor 207 rotates the ball screw 205, the rotating mechanism 38 on the platform 42 is moved between the adhering position P2 and a measuring position P3 located in the goniometer 28.

Figure 40:
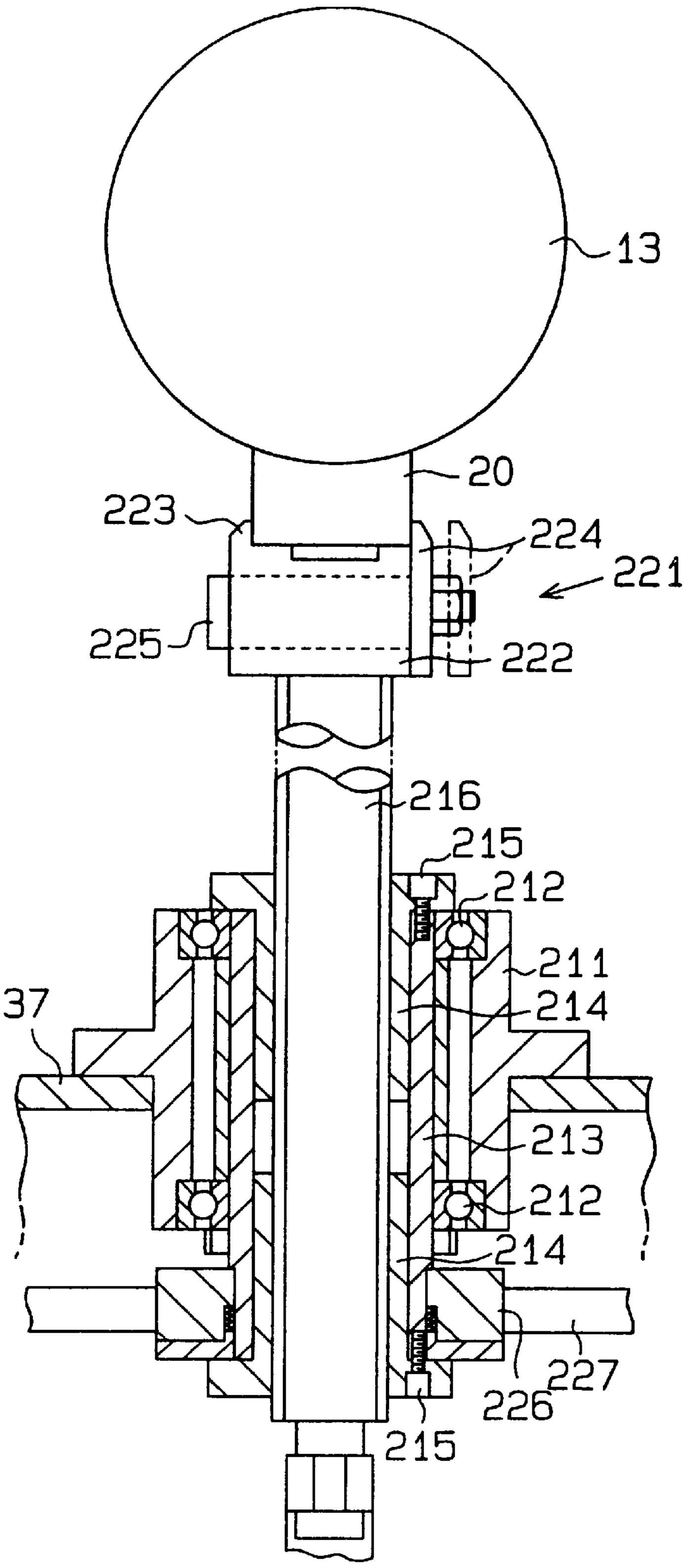
FIG. 40 is an enlarged cross-sectional view showing the vicinity of a support shaft.

The first adhering mechanism 103 and the second adhering mechanism 71 will now be described in detail with reference to FIGS. 38–40. In this embodiment, the first adhering mechanism 103 is combined with the second adhering mechanism 71.

A first cylinder 211, which extends vertically, is fixed to the base 37. A second cylinder 213 is rotatably supported in the first cylinder 211 by a ball bearings 212. A pair of third cylinders 214 are fit in the second cylinder 213. Bolts 215 connect the second and third cylinders 213, 214 to one another and enables integral rotation. A support shaft 216 is inserted through the third cylinders 214. The support shaft 216 moves vertically and rotates integrally with the third cylinders 214. A lever 217 is pivotally supported about a shaft 218 in the base 37. The lower end of the support shaft 216 is connected to the distal end of the lever 217. The support shaft 216 is lifted or lowered when the lever 217 is pivoted vertically by a cylinder 219.

A clamping mechanism 221 is provided on the upper end of the support shaft 216 to clamp the intermediate plate 20 and the support plate 21. The clamping mechanism 221 has a frame 222, a fixed jaw 223, a movable jaw 224, and a cylinder 225. The frame 222 is secured to the upper end of the support shaft 216. The fixed jaw 223 is fixed to the frame 222. The movable jaw 224 is supported on the frame 222 and moves toward or away from the fixed jaw 223. The cylinder 225 is coupled to the frame 222 to move the movable jaw 224. The loading mechanisms 177, 178 of the associated first and second feeding mechanisms 170A, 170B transfers the set of plates 20, 21 to the clamping mechanism 221. The cylinder 225 is actuated to clamp the plates 20, 21 between the movable jaw 224 and the fixed jaw 223.

The second adjusting mechanism 91, which adjusts the horizontal angle of the support plate 21, will now be described in detail with reference to FIGS. 39 and 40.

A ring 226 is secured around the bottom of the second cylinder 213. A lever 227 is coupled to the ring 226. The lever 227 is pivoted horizontally by a pivoting mechanism 228 arranged in the base 37. The pivoting mechanism 228 is constituted by a motor, a ball screw, and other parts (not shown). The pivoting of the lever 227 causes the support shaft 216 and other parts to be pivoted horizontally by a clamping mechanism 221. The pivoting mechanism 228 pivots the clamping mechanism 221 based on the crystal orientation L2 of the ingot 13, which is measured by the goniometer 28, so that the mounting axis 23 of the support plate 21, held by the clamping mechanism 221, is parallel to the crystal orientation L2.

Figure 41:
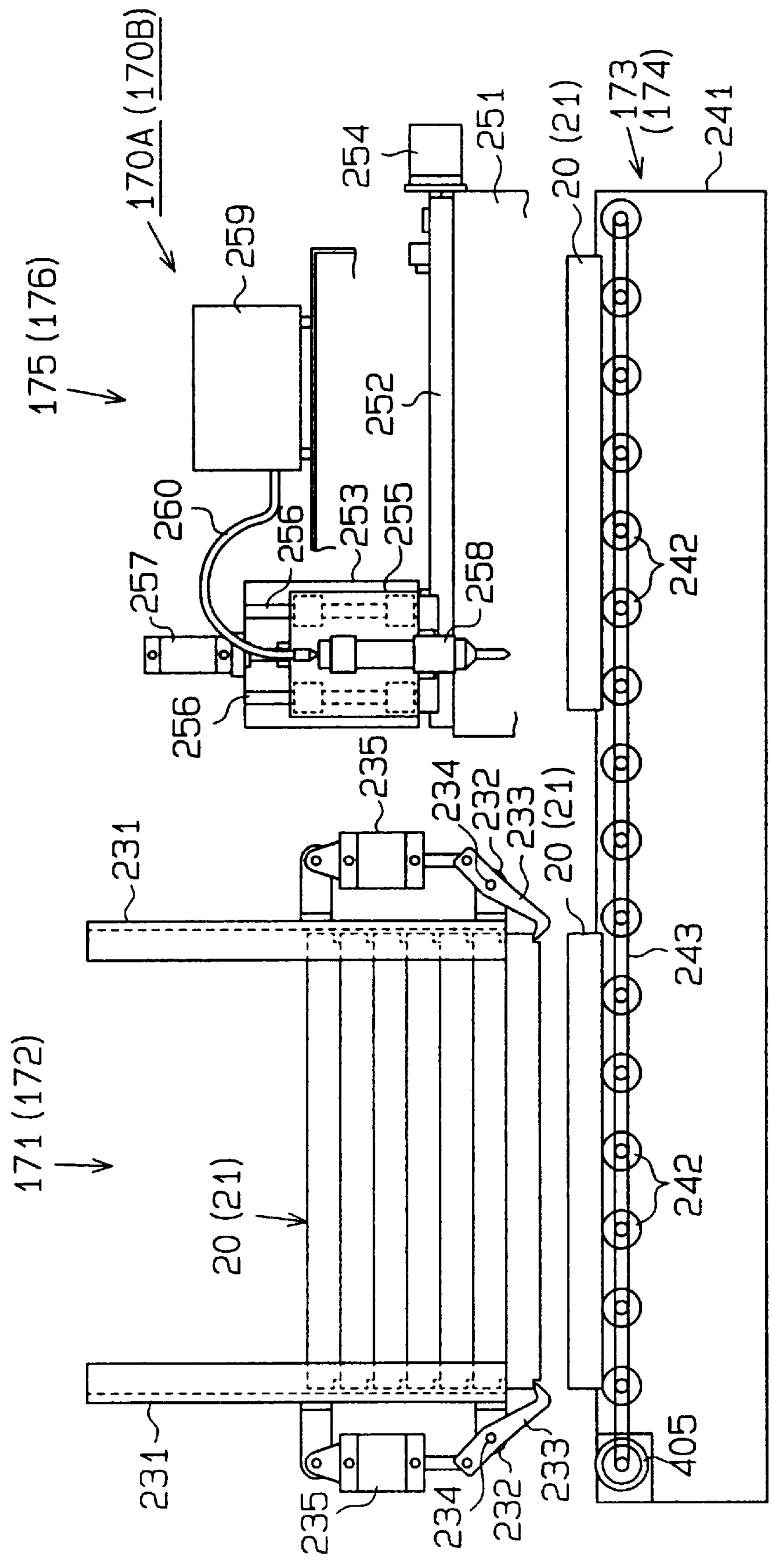
FIG. 41 is a front view showing a plate feeding mechanism and an adhesive applying mechanism.
Figure 42:
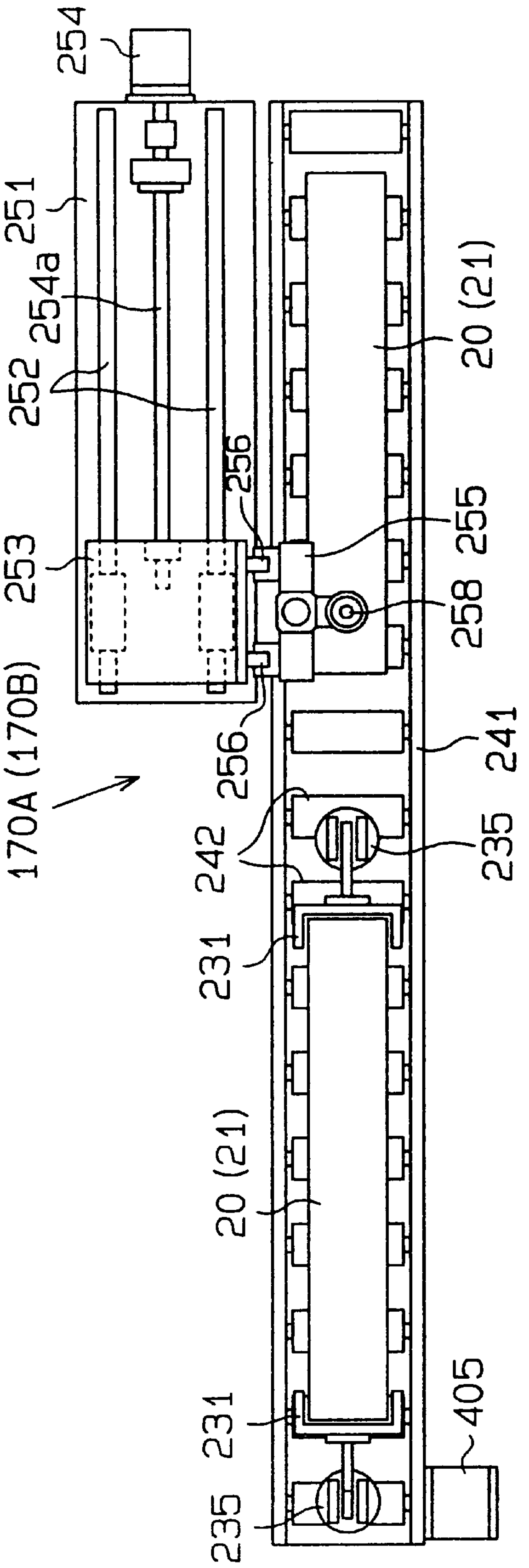
FIG. 42 is a plan view showing the plate feeding mechanism and the adhesive applying mechanism.
Figure 43:
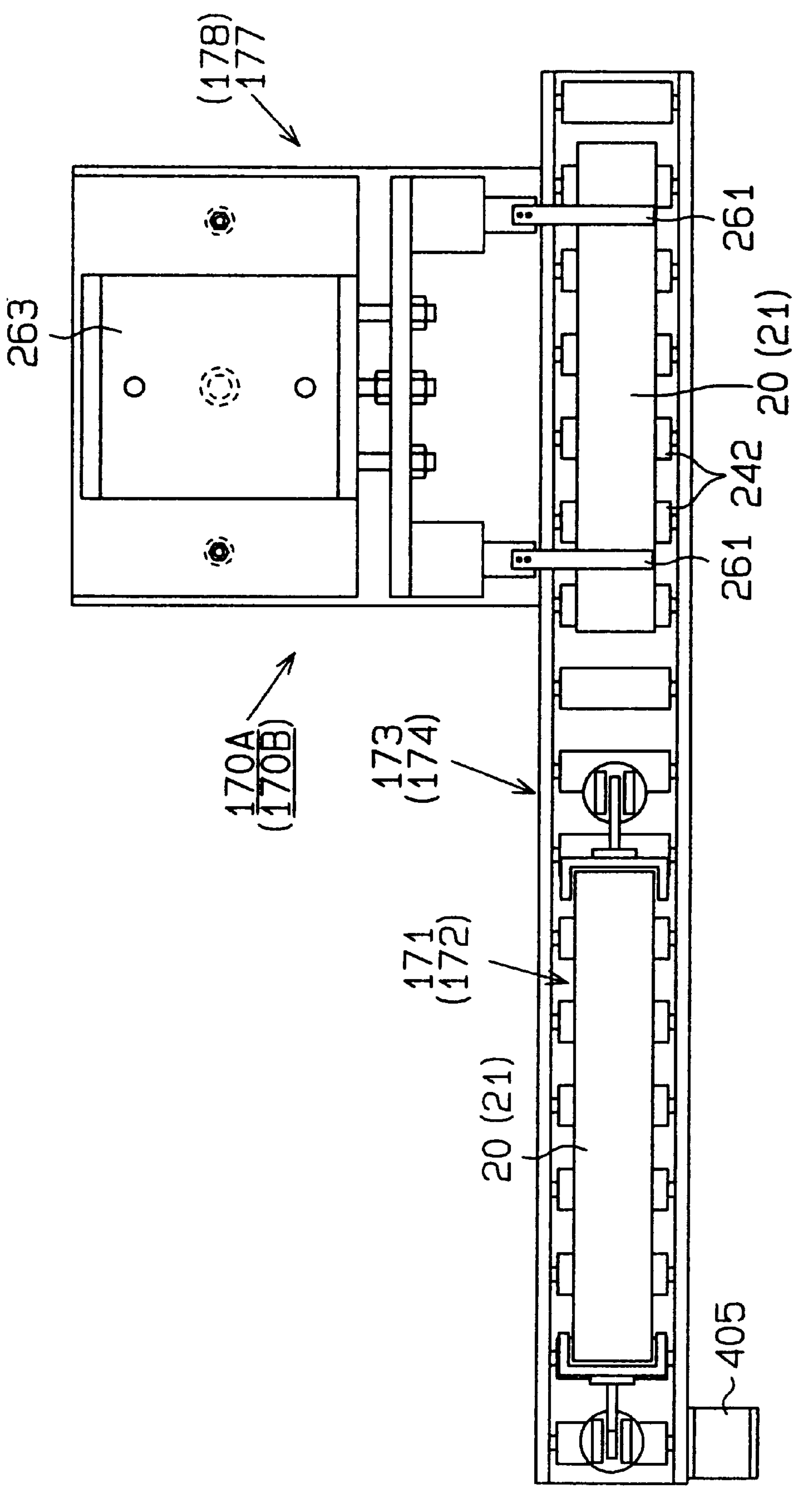
FIG. 43 is a plan view of a plate loading mechanism.

The first and second feeding mechanisms 170A, 170B will now be described in detail with reference to FIGS. 41–43. The structure of the first and second feeding mechanisms 170A, 170B are identical. Therefore, only the first supplying mechanism 170A will be described. The corresponding parts of the second feeding mechanism 170B will be denoted with the same numerals and will not be described.

The stocker 171 has a pair of frames 231, which extend vertically, to stack the plurality of intermediate plates 20. The frames 231 are supported by the base 37. A bracket 232 is secured to the lower end of each frame 231. An engaging lever 233 is pivotally connected to each bracket 232 by a shaft 234. A cylinder 235 is connected to the basal end of each lever 233. The cylinder 235 pivots the lever 233 between a position at which the lever 233 engages the lowermost intermediate plate 20 and a position at which it is separated from the same plate 20.

The roller conveyor 173 has a support frame 241 connected to the base 37, a plurality of rollers 242 supported by the frame 241, a belt 243, and a motor 405. The belt 243 and the motor 405 are employed to rotate the rollers 242. The actuation of the levers 233 enables the intermediate plates 20 to be discharged from the stocker 171 one at a time. Each intermediate plate 20 is placed on the rollers 242 and conveyed toward the applying mechanism 175 when the rollers 242 are rotated.

The applying mechanism 175 will now be described. A frame 251 is provided on the base 37. A moving body 253 is movable along a pair of guide rails 252 provided on the frame 251 in the longitudinal direction of the conveyor 173. A motor 254 cooperates with a ball screw **254*a* to move the moving body 253. A pair of guide rails 256 extending vertically are arranged on the moving body 253. An elevating body 255 is lifted and lowered along the rails 256 by a cylinder 257. A dispenser nozzle 258 extending downward is secured to the front side of the elevating body 255. An adhesive is supplied to the nozzle 258 from a tank 259 arranged near the frame 251 through a flexible pipe 260. When the intermediate plate 20 is conveyed to a position corresponding to the applying mechanism 175, the adhesive is applied through the nozzle 258 to the upper surface of the intermediate plate 20 while the nozzle 258 is moved in the longitudinal direction of the plate 20**.

The structure of the loading mechanism 177 will now be described with reference to FIGS. 38 and 43. The loading mechanism 177 moves the intermediate plate 20, to which the adhesive has been applied, to a position directly below the applying mechanism 176. This enables the plate 20 to be transferred to the clamping mechanism 221. The loading mechanism 177 has a clamping body 261, which clamps the intermediate plate 20, a cylinder 262, which lifts and lowers the clamping body 261, and a cylinder 263, which moves the clamping body 261 horizontally.

Figure 44:
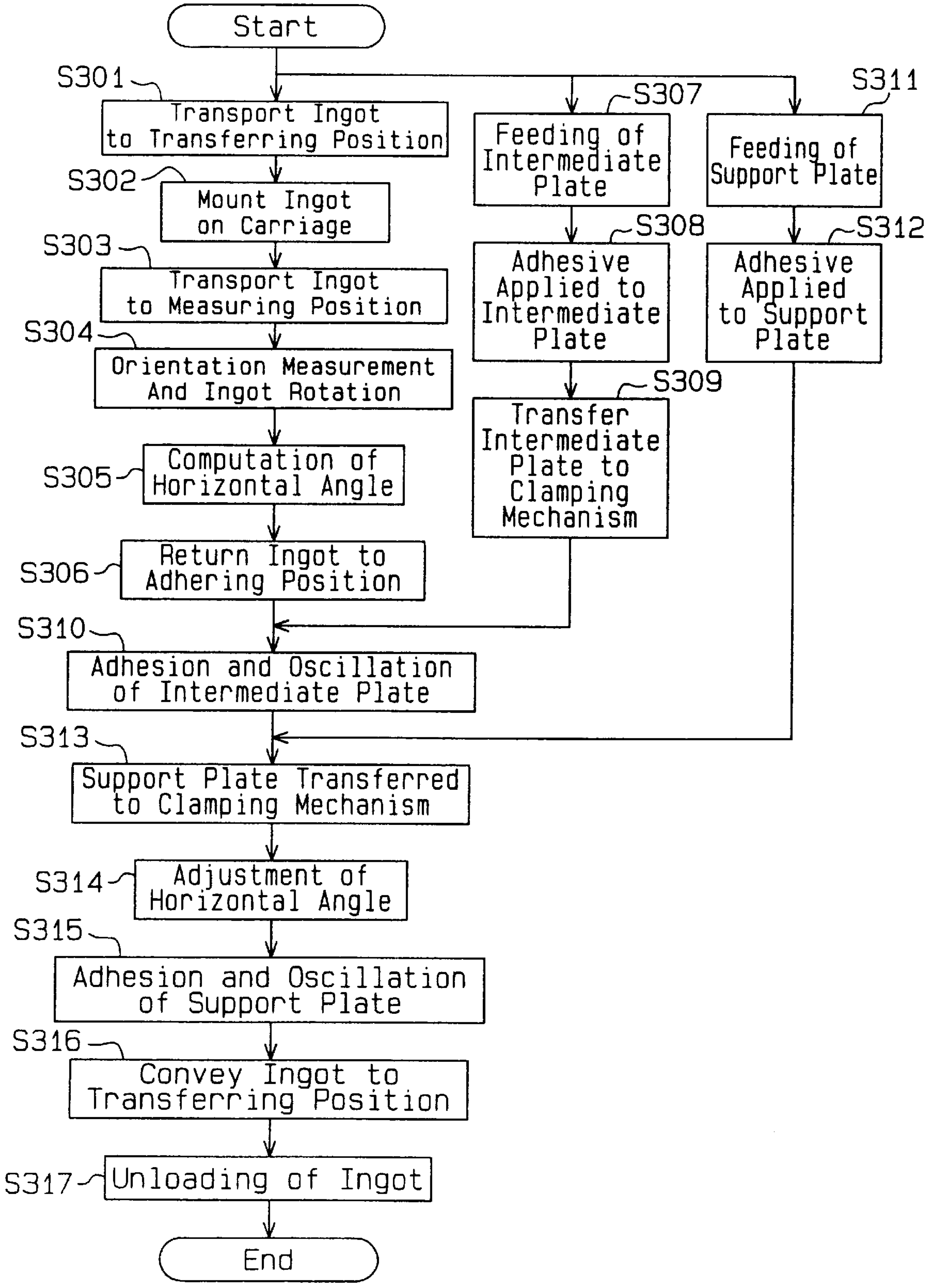
FIG. 44 is a flowchart showing the adhering procedures to adhere the support plate to the ingot.
Figure 45:
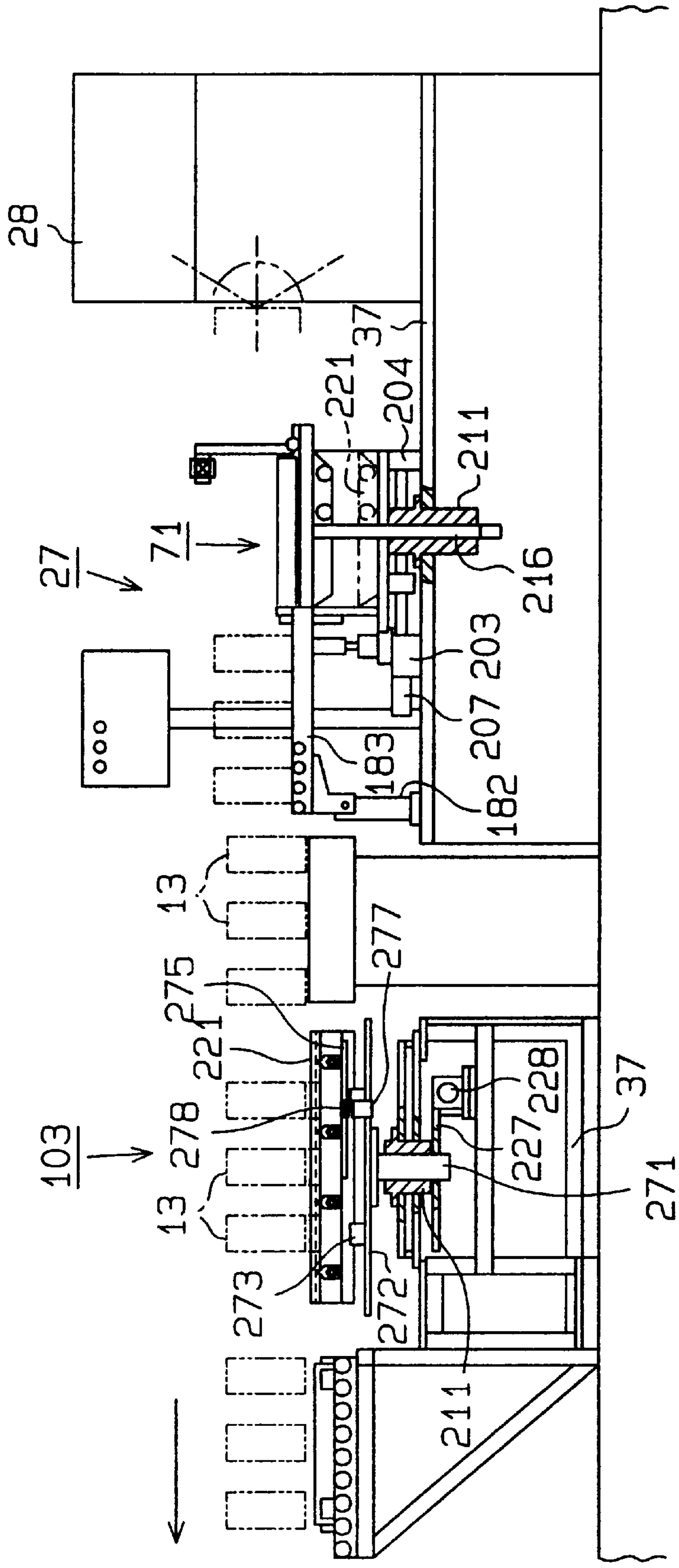
FIG. 45 is a cross-sectional view showing a fourth embodiment according to the present invention.
Figure 46:
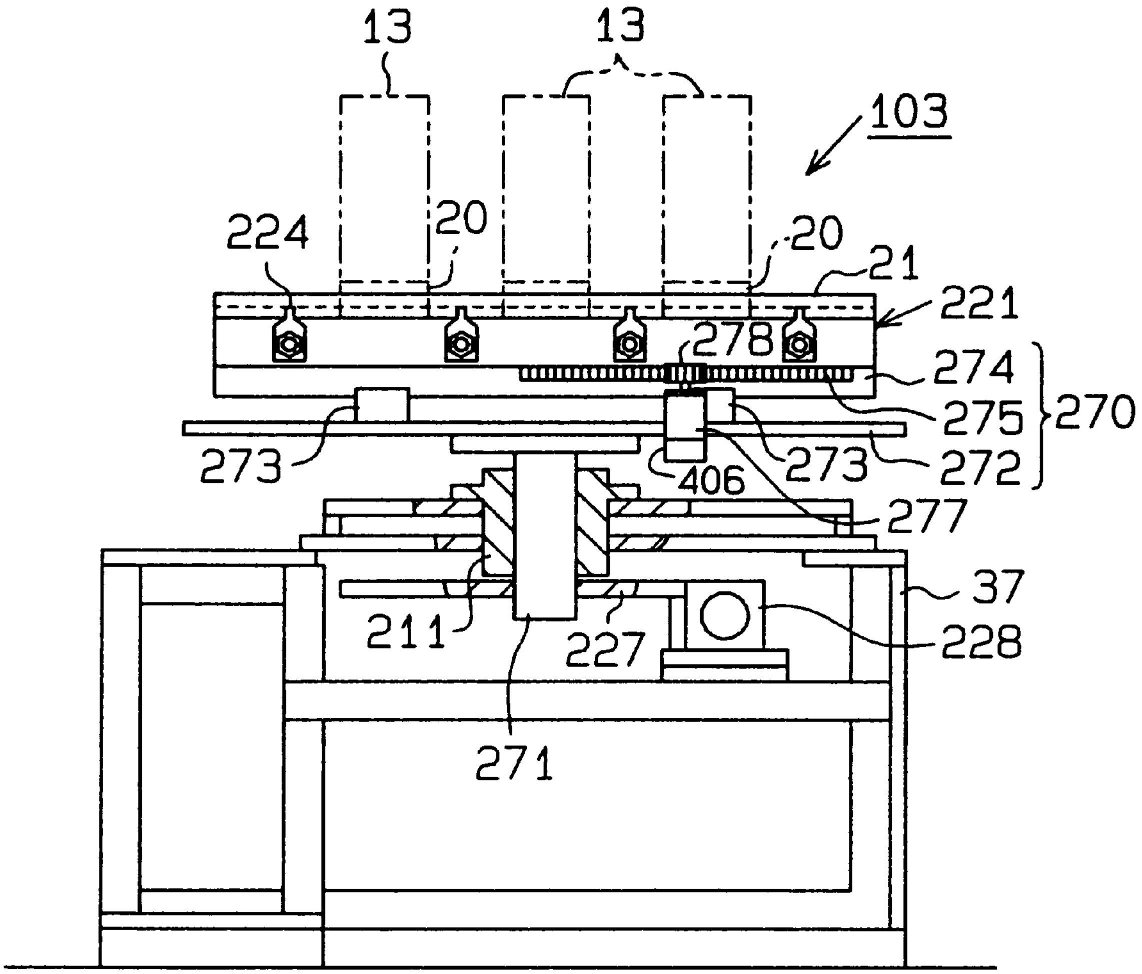
FIG. 46 is a cross-sectional view showing a support plate adhering mechanism.
Figure 47:
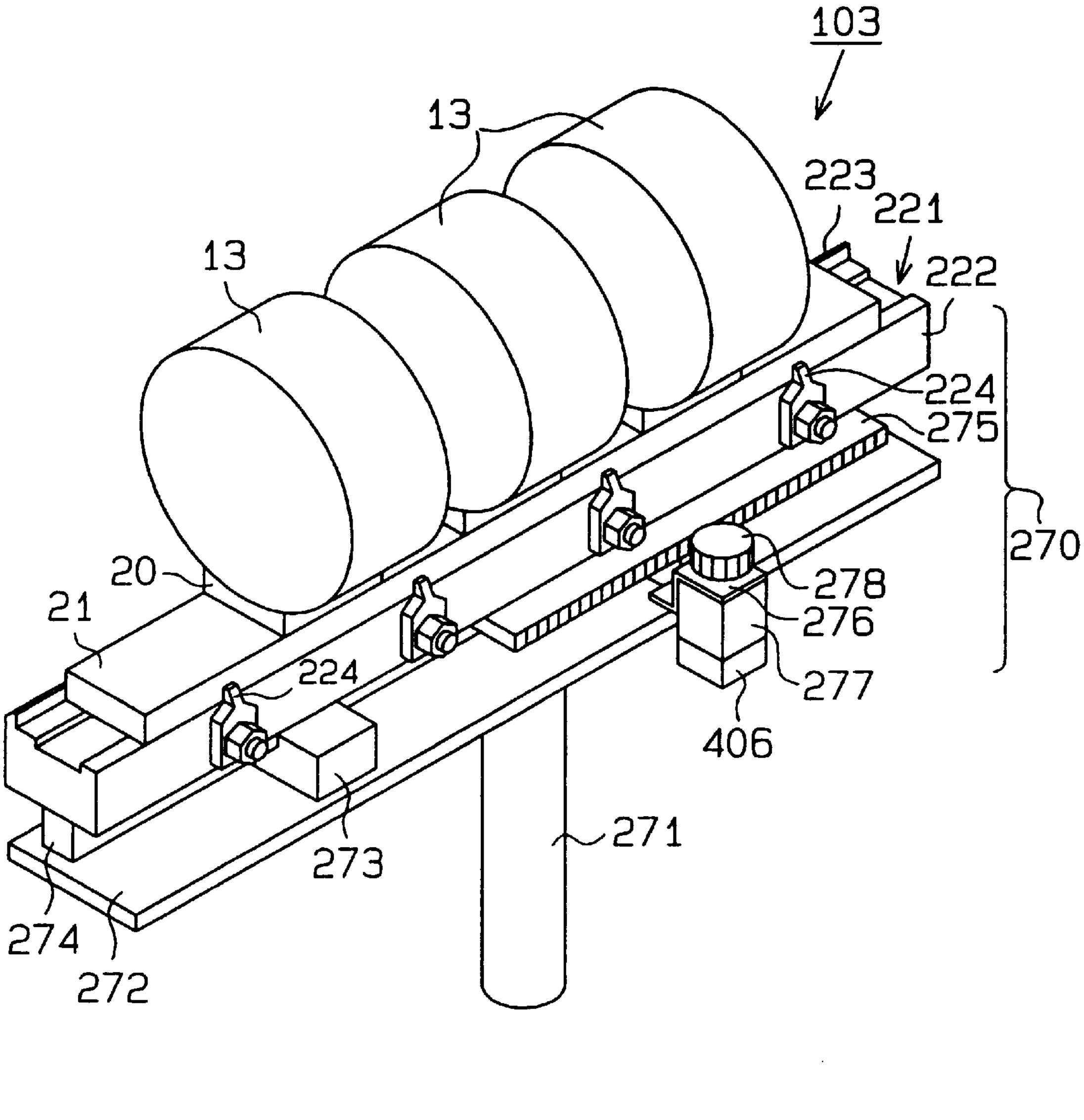
FIG. 47 is a perspective view showing the support plate adhering mechanism.

The operation of the third embodiment will now be described with reference to FIG. 44.

When the loading conveyor 161 conveys the ingot 13 held on the pallet 163 to a position corresponding to the transferring position P1, the conveyor 161 is stopped. The ingot 13 is then carried to the transferring position P1 that is located on the second transferring mechanism 181 by the gripping mechanism 169 of the first transferring mechanism 165 (step S301).

Subsequently, the ingot 13 is transferred from the first transferring mechanism 165 and mounted on the carriage 39 (step S302). More specifically, the rollers 401 of the second transferring mechanism 181 are rotated to convey the ingot 13 from the transferring position P1 to the adhering position P2. The support arms 183 of the transferring mechanism 181 are then inclined downward when pivoted about the shaft 404 by the cylinder 400. The inclination of the arms 183 transfers the ingot 13 held on the rollers 401 onto the rollers 193 of the rotating mechanism 38. The cylinder 202 is then actuated to cause the pressing roller 201 to press the cylindrical surface of the ingot 13. Simultaneously, the cylinders 412, 413 are actuated to clamp the ingot between the associated pressing bodies 414, 415.

The motor 207 is then actuated to move the ingot 13 together with the rotating mechanism 38 from the adhering position P2 to the measuring position P3 (step S303).

Afterward, in the same manner as in the second embodiment, the ingot 13 is rotated by the rotating mechanism 38 at the measuring position P3 to measure the crystal orientation L2 of the ingot 13 with the goniometer 28 (step S304). The ingot 13 is then rotated until the crystal orientation L2 of the ingot 13 becomes horizontal (step S304). Furthermore, the inclination e of the crystal orientation L2 with respect to the center axis L1 of the ingot 13 in the horizontal direction (FIG. 25) is computed from the measurements taken by the goniometer 28 (step 305).

Subsequently, the rotating mechanism 38 holding the ingot 13 is returned to the adhering position P2 from the measuring position P3 (step S306).

While steps S301–S306 are carried out, a single intermediate plate 20 is fed onto the roller conveyor 173 from the stocker 171 by the first feeding mechanism 170A (step S307). The intermediate plate 20 is conveyed to a position corresponding to the applying mechanism 175. At this position, an adhesive is applied to the upper surface of the intermediate plate 20 (step S308). After the application of the adhesive, the intermediate plate 20 is clamped by the clamp body 261 of the loading mechanism 177 and sent to the clamping mechanism 221, which is located at a stand-by position (indicated by the double-dotted line in FIG. 38). The cylinder 225 is then actuated to move the movable jaw 224 and clamp the intermediate plate 20 between the fixed jaw 223 and the movable jaw 224 (step S309).

The cylinder 219 is then actuated to lift the support shaft 216. This adheres the upper surface of the intermediate plate 20, which is held by the clamping mechanism 38, to the cylindrical surface of the ingot 13, which is held by the clamping mechanism 221. During the adhesion, the forward and reverse rotation of the motor 207 reciprocally moves the rotating mechanism 38 along the center axis L1 of the ingot 13 within a short stroke. The reciprocation eliminates bubbles included in the adhesive and enables secure adhesion of the intermediate plate 20 within a short period of time (step S310).

Furthermore, while steps S301–S306 are carried out, a single support plate 21 is fed onto the roller conveyor 174 from the stocker 172 by the second feeding mechanism 170B (step S311). The support plate 21 is conveyed to a position corresponding to the applying mechanism 176. At this position, an adhesive is applied to the upper surface of the support plate 21 (step S312). After the application of the adhesive and the completion of step S310, the support plate 21 is clamped by the clamp body 261 of the loading mechanism 178 and sent to the clamping mechanism 221, which is located at a stand-by position. The support plate 21 is then clamped by the clamping mechanism 221 (step S313).

The inclination θ of the crystal orientation L2 of the ingot 13 with respect to its center axis L1 along the horizontal plane is computed in step S305. Based on the inclination θ, the clamping mechanism 221 is rotated horizontally by the pivoting mechanism 228 by way of the support shaft 216 (step S314).

In the same manner as step S310, the support plate 21 is adhered to the intermediate plate 20 (step S315).

After the support plate 21 is adhered, the clamping mechanism 221 releases the support plate 21. The cylinder 219 then lowers and returns the support shaft 216 and the clamping mechanism 221 to the stand-by position.

The ingot 13, to which the intermediate and support plates 20, 21 are adhered, is sent from the adhering position P2 to the transferring position P1 (step S316). More specifically, the ingot 13 is first released from the pressing roller 201. The support arms 183 of the second transferring mechanism 181 is pivoted about the shaft 404 and inclined upward by the cylinder 400. The inclination enables the ingot 13 held on the rollers 193 of the rotating mechanism 38 to be transferred onto the rollers 401 of the transferring mechanism 181. The rollers 401 are then rotated to convey the ingot 13 from the adhering position P2 to the transferring position P1.

Afterward, the ingot 13 located at the transferring position P1 is placed on the pallet 164 that is held on the unloading conveyor 162 by the gripping mechanism 169 of the first transferring mechanism 165. The ingot 13, to which the plates 20, 21 are adhered, is then conveyed to the drying apparatus by the unloading conveyor 162 (step S317).

The advantageous effects of the third embodiment will now be described.

(1) The first adhering mechanism 103 and the second adhering mechanism 71 are combined with each other to perform the adhering of the intermediate plate 20 and the support plate 21 at the same position. This simplifies the structure of the adhering mechanism 27 and improves the operational efficiency.

(2) The first feeding mechanism 170A and the second feeding mechanism 170B automates the application of the adhesive to the intermediate plate 20 and the support plate 21, and the transferring of the plates 20, 21 to the gripping mechanism 221. Accordingly, this improves the operational efficiency.

(3) The transferring of the ingot 13 prior to the adhesion of the plates 20, 21 from the loading conveyor 161 to the transferring position P1 and the transferring of the ingot 13 after the adhesion of the plates 20, 21 from the transferring position P1 to the unloading conveyor 162 is performed automatically by the first transferring mechanism 165. Accordingly, this improves the operational efficiency.

(4) The first adhering mechanism 103, which adheres the support plate 21, the second adhering mechanism 71, which adheres the intermediate plate 20, and the second adjusting mechanism 91, which adjusts the angle of the support plate 21 along the horizontal plane, are constituted integrally. Accordingly, this simplifies the structure of the adhering mechanism 27.

A fourth embodiment of the present invention will hereafter be described with reference to FIGS. 45–48. The structure of the adhering apparatus 27 in this embodiment differs from that employed in the previous embodiments. In the fourth embodiment, parts that are identical to those employed in the third embodiment are denoted with the same numeral.

In this embodiment, the first adhering mechanism 103 and the second adhering mechanism 71 that are employed in the third embodiment are separated from each other. In addition, the first adhering mechanism 103 is provided with a mechanism 270 that enables the adhesion of a plurality of ingots 13 to a single support plate 21.

The mechanism 270 has a support shaft 271 that is provided on the base 37. The support shaft 271 is rotatably and liftably supported by the first cylinder 211. The support shaft 271 is pivoted by the pivoting mechanism 228 and lifted or lowered by an elevating mechanism (not shown). A support plate 272 is fixed to the upper end of the support shaft 271. A pair of guides 273 are fastened to the support plate 272. A guide rail 274, which engages the guides 273, is secured to the bottom surface of the frame 222 of the clamping mechanism 221. Accordingly, the clamping mechanism 221 may be moved reciprocally along the support plate 272 by way of the guide rail 274.

A rack 275 is secured to the bottom surface of the frame 222. The rack 275 extends in the longitudinal direction of the frame 222. A motor 277, which has a brake 406, is coupled to the support plate 272 by way of a bracket 276. A pinion 278, which is meshed with the rack 275, is secured to the output shaft of the motor 277. Accordingly, the rotation of the motor 277 moves the clamping mechanism 221 reciprocally along the support plate 272.

The operation of the fourth embodiment will now be described with reference to FIGS. 48(*a*)–(*c*).

Figure 48:
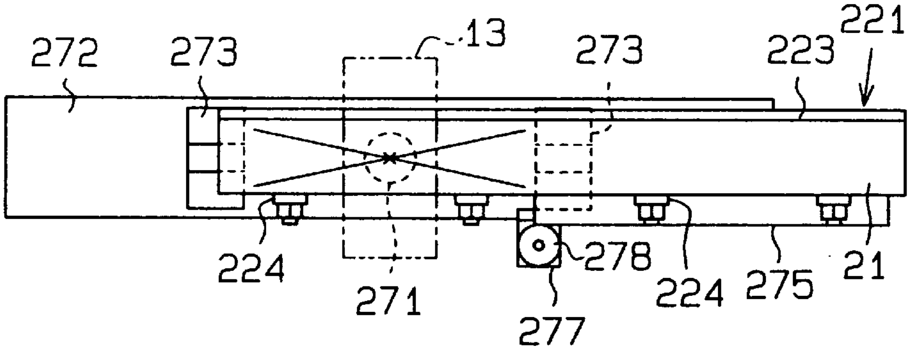
FIGS. 48(*a*)–(*c*) are plan views showing the adhering procedures of the support plate.
Figure 48:
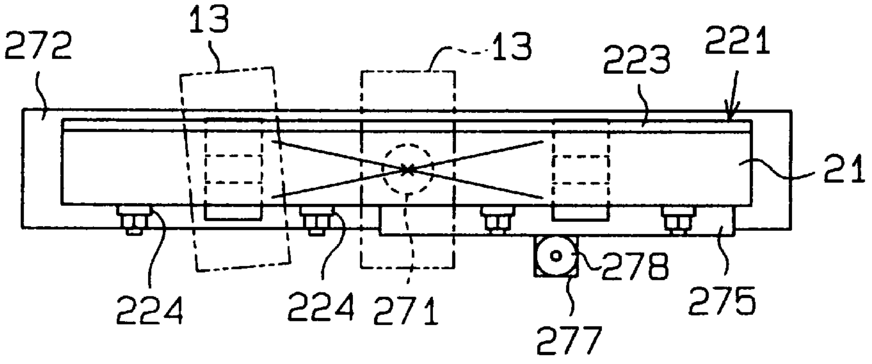
Figure 48:
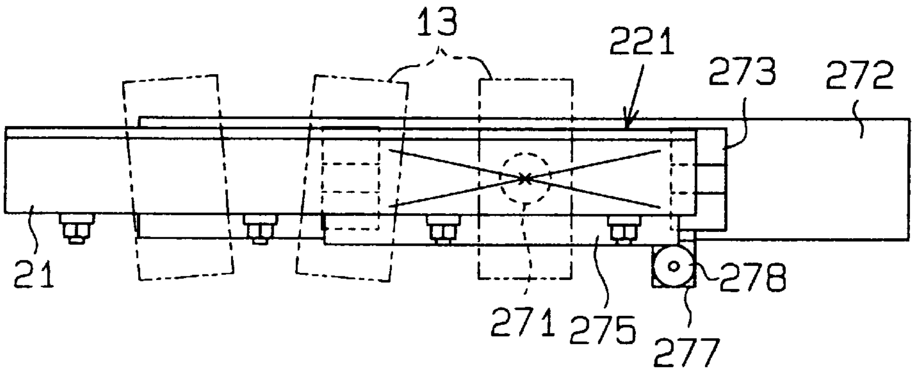

FIG. 48(*a*) shows a first ingot 13, to which an intermediate plate 20 is adhered, held by the rotating mechanism 38 that is also employed in the third embodiment. The ingot 13 is positioned above the left side of the support plate 21, which is held by the clamping mechanism 221. In this state, the clamping mechanism 221 is rotated horizontally by the pivoting mechanism 228 and the support shaft 271 so that the mounting axis of the support plate 21 becomes parallel to the crystal orientation of the first ingot 13 in accordance with the measurement data taken by goniometer 28. The clamping mechanism 221 is then lifted to adhere the support plate 21 to the lower surface of the intermediate plate 20.

After the adhesion of the first ingot 13, the brake 406 of the motor 277 is released. The motor 277 then rotates the pinion 278 along the rack 275 so that the clamping mechanism 221 is moved toward the left, as viewed in the drawing. When the substantially middle section of the support plate 21 becomes located directly above the support shaft 271 as illustrated in FIG. 48(*b*), the motor 277 is stopped and the brake 406 is actuated. A second ingot 13, to which another intermediate plate 20 is adhered, is positioned directly above the intermediate plate 20. In the same manner as the first ingot 13, the clamping mechanism 221 is rotated horizontally by the pivoting mechanism 228 and the support shaft 271 so that the mounting axis of the support plate 21 becomes parallel to the crystal orientation of the second ingot 13 in accordance with the measurement data taken by goniometer 28. The clamping mechanism 221 is then lifted to adhere the support plate 21 to the lower surface of the intermediate plate 20.

The adhesion of the third ingot 13 is performed in the same manner as the second ingot 13, as shown in FIG. 48(*c*).

In the fourth embodiment, the clamping mechanism 221 is moved along its longitudinal direction by the mechanism 270.

Therefore, a plurality of short ingots 13 may easily be adhered to a single support plate 21 with there crystal orientations adjusted.

Figure 49:
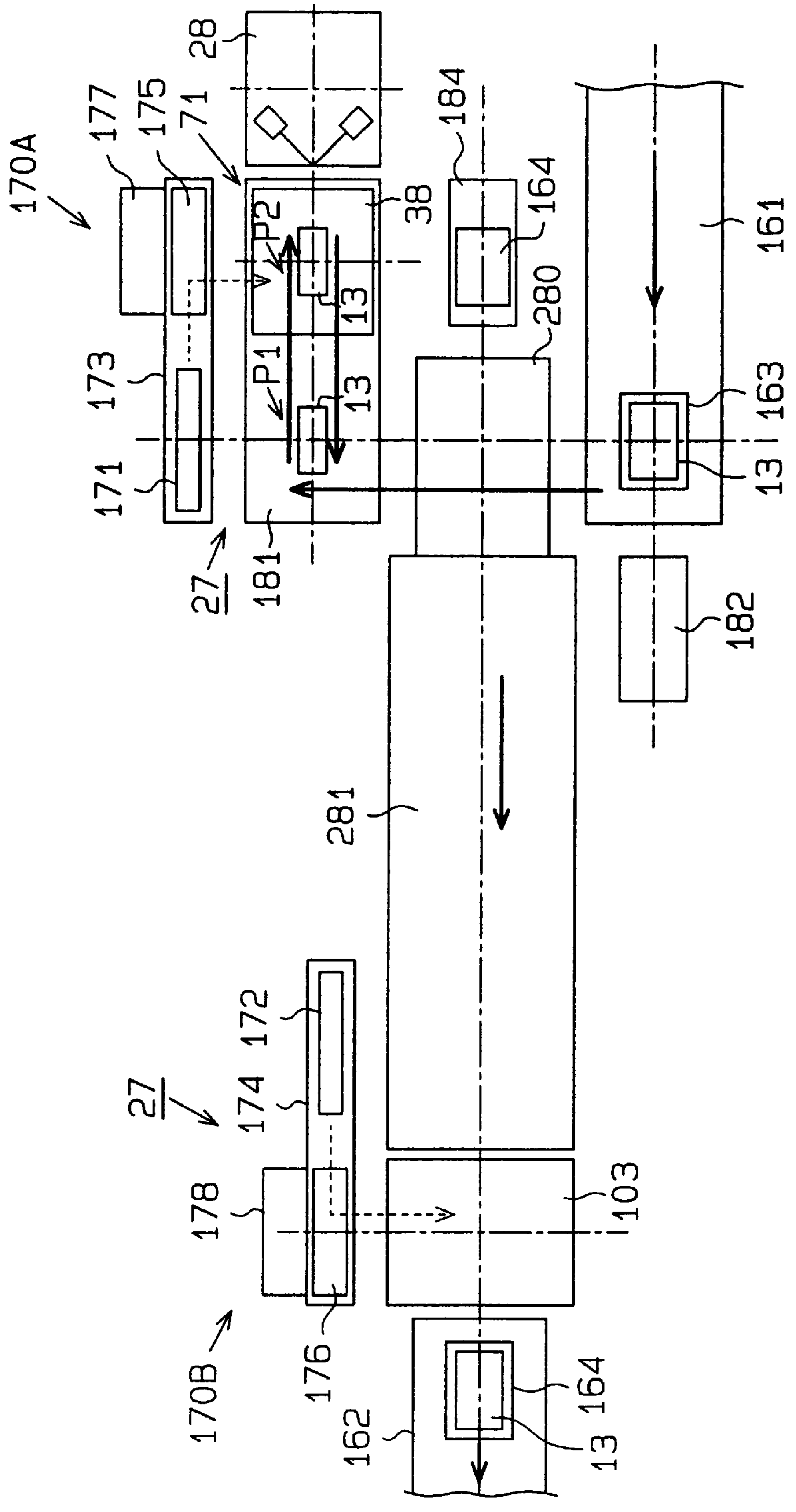
FIG. 49 is a schematic plan view of a fifth embodiment according to the present invention.
Figure 50:
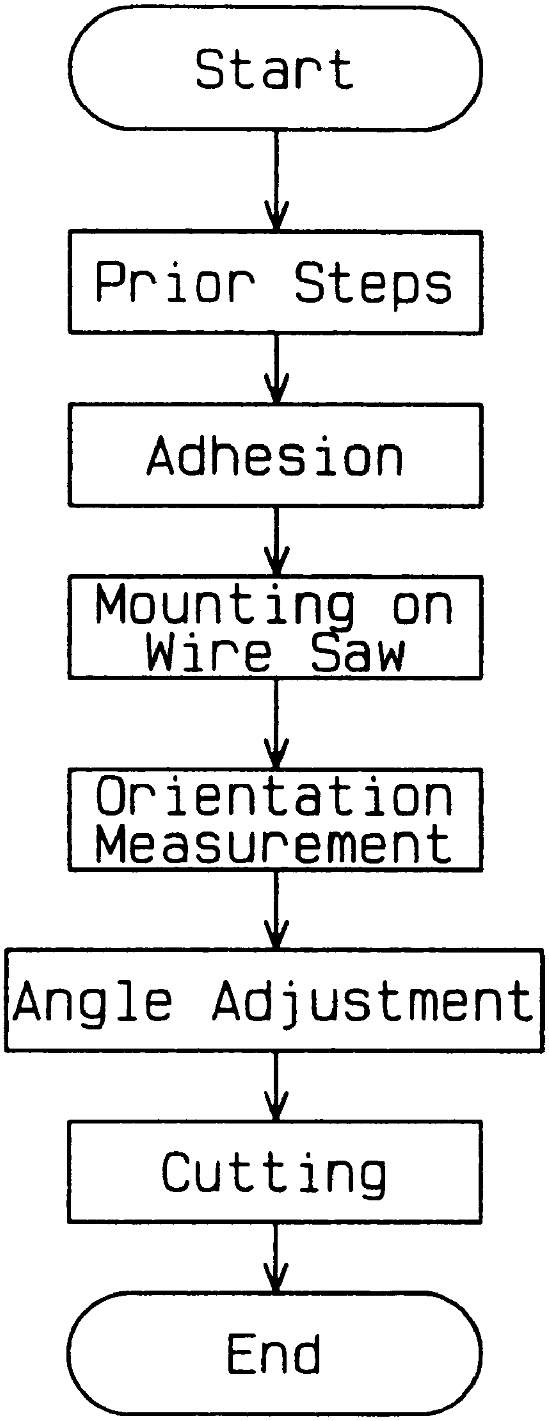
Fig.50 (Prior Art)
FIG. 50 is a flowchart showing the procedures taken to slice ingots in the prior art.

A fifth embodiment of the present invention will hereafter be described with reference to FIG. 49. The structure of the adhering apparatus 27 in this embodiment differs from that employed in the previous embodiments. In the fifth embodiment, parts that are identical to those employed in the third embodiment are denoted with the same numeral.

In this embodiment, the first adhering mechanism 103 and the second adhering mechanism 71 are provided separately in the same manner as the first and second embodiments. A drying apparatus 281 is provided between the first and second adhering mechanisms 71, 103. An apparatus 182 is provided near the loading conveyor 161 to receive the empty pallets 163. An apparatus 184 is provided between the second adhering mechanism 71 and the loading conveyor 161 to feed each pallet 164 to the conveyor 280. The pallet 164 receives the ingot 13, to which the intermediate plate 20 is adhered. After the intermediate plate 20 is adhered to the ingot 13 by the second adhering mechanism 71, the ingot 13 is transferred to the pallet 164 on the conveyor 280 and conveyed to the drying apparatus 281.

In the fifth embodiment, the ingot 13 is sent to the drying apparatus 281 after adhering the intermediate plate 20 thereon. Therefore, the support plate 21 is adhered to the intermediate plate 20 after the intermediate plate 20 is securely adhered to the ingot 13. Accordingly, when adhering the support plate 21, the intermediate plate 20 remains fixed between the ingot 13 and the support plate 21.

Although several embodiments of the present invention have been described herein, it should be apparent to those skilled in the art that the present invention may be embodied in many other specific forms without departing from the spirit or scope of the invention. For example, the present invention may be modified as described below.

(1) In the above embodiments, when adhering the intermediate and support plates 20, 21 to the ingot 13, the pressing force, oscillating speed, the number of oscillations, the oscillating time period, and other factors may be controlled by a controller. Such adhering data may be input through an operation panel. Data stored in a memory may also be selected arbitrarily.

(2) The insulating plate 21*a* may be omitted.

(3) The insulating plate 21*a* and the intermediate-plate 20 may be omitted. In this case, only the support plate 20 is adhered to each ingot 13.

(4) The crystal orientation L2 of the ingot 13 may be measured by rotating the goniometer 28 instead of rotating the ingot 13.

(5) Each ingot 13 may be rotated along the horizontal plane instead of rotating the support plate 21 along the horizontal plane so that the crystal orientation L2 of the ingot 13 becomes parallel to the mounting axis 23 of the support plate 21.

(6) Based on the measurement data taken by the goniometer 28, the intermediate plate 20 and the support plate 21 may be adhered to each other in correspondence with the crystal orientation before adhering the plates 20, 21 to each ingot 13.

Therefore, the present examples and embodiments are to be considered as illustrative and not restrictive and the invention is not to be limited to the details given herein, but may be modified within the scope of the appended claims.

What is claimed is:

1. An apparatus for simultaneously manufacturing a plurality of wafers by slicing a cylindrical ingot with a wire saw, the ingot having a crystal orientation, said apparatus comprising:

a measuring device for measuring the crystal orientation of the ingot;

an adhering device for adhering a support to a predetermined location on the surface of the ingot based on the measured crystal orientation, wherein the support includes an intermediate plate and a support plate, the support plate being adapted to fit the wire saw, wherein the adhering device includes an auxiliary adhering element for adhering the intermediate plate to the predetermined position in the outer peripheral surface of the ingot and an adhering element for adhering the support plate to the intermediate plate;

a dryer for drying and solidifying an adhesive applied between the ingot and the intermediate plate and an adhesive applied between the intermediate plate and the support plate; and the wire saw for slicing the ingot into the plurality of wafers while the ingot is supported on the support.

2. The apparatus as set forth in claim 1 further comprising:

a first stocker for storing the ingot; and a first transferring device for transferring the ingot among the first stocker, the measuring device, the auxiliary adhering element, the adhering element and the dryer.

3. The apparatus as set forth in claim 2, wherein the first transferring device includes a belt conveyor.

4. The apparatus as set forth in claim 3 further comprising:

a second stocker for temporarily storing the ingot after the intermediate plate and the support plate have been attached, wherein the first transferring device transfers the ingot to the second stocker from the dryer.

5. The apparatus as set forth in claim 2 further comprising:

a second stocker for temporarily storing the ingot after the intermediate plate and the support plate have been attached, wherein the first transferring device transfers the ingot to the second stocker from the dryer.

6. The apparatus as set forth in claim 5, wherein the wire saw has a plurality of cylindrical rollers that are parallel to one to another and a wire spirally guided on the rollers with a predetermined pitch, wherein the wire saw applies slurry containing grinding particles and dispersing liquid to the wire and urges the ingot carrying the intermediate plate and the support plate against the wire.

7. The apparatus as set forth in claim 6 further comprising a device for collecting the grinding particles and dispersing liquid from slurry discharged from the wire saw and mixing and supplying new slurry containing the collected particles and liquid to the wire saw.

8. The apparatus as set forth in claim 7 further comprising a device for processing the wafers, the processing device including means for removing the intermediate plate and support plate from the wafers formed by the wire saw, means for separating the wafers from one another to store into a cassette, means for washing the wafers in the cassette and means for drying the washed wafers.

9. The apparatus as set forth in claim 8 further comprising a second transferring device for transferring the ingot among the second stocker, the wire saw and the processing device.

10. The apparatus as set forth in claim 9, wherein the second transferring device includes an automatic guided vehicle.

11. The apparatus as set forth in claim 10 further comprising an examining device for drawing the wafers out of the cassette one by one and examining each said wafer.

12. The apparatus as set forth in claim 11, wherein the ingot has a first mark indicative of first information relating to production management, the apparatus further comprising:

a support plate marking device for applying a second mark to the support plate based on the information of the first mark of the ingot, the second mark being applied to the support plate before the ingot is sliced by the wire saw, the second mark representing second information relating to production management; and a cassette marking device for applying a third mark to the cassette based on the information of the second mark of the support plate, the third mark being applied to the cassette before the processing device processes the wafers, the third mark representing third information relating to production management.

13. The apparatus as set forth in claim 12 further comprising a control means for controlling operation of the measuring device, the adhering element, the auxiliary adhering element, the dryer, the first stocker, the first transferring device, the second stocker, the wire, saw, the collecting device, the processing device, the second transferring device, the examining device, the support plate marking device and the cassette marking device.

14. An apparatus for simultaneously manufacturing a plurality of wafers by slicing a cylindrical ingot with a wire saw, the ingot having a crystal orientation, the apparatus; comprising:

a measuring device for measuring the crystal orientation of the ingot;

a connecting device for connecting a support to a predetermined location on the surface of the ingot based on the measured crystal orientation;

a first stocker for storing the ingot;

a first transferring device for transferring the ingot among the first stocker, the measuring device and the connecting device; and the wire saw for slicing the ingot into a plurality of wafers while the ingot is supported on the support.

15. The apparatus as set forth in claim 14, wherein the support includes an intermediate plate and a support plate, the support plate being adapted to fit the wire saw, and wherein the connecting device includes an auxiliary attaching element for attaching the intermediate plate to the predetermined location on the surf ace of the ingot and a connecting element for connecting the support plate to the intermediate plate.

16. The apparatus as set forth in claim 15, wherein the first transferring device transfers the ingot between the auxiliary attaching element and the connecting element.

17. An apparatus for simultaneously manufacturing a plurality of wafers by slicing a cylindrical ingot with a wire saw, the ingot having a crystal orientation, the apparatus comprising:

a measuring device for measuring the crystal orientation of the ingot;

a connecting device for connecting a support to a predetermined location on the surface of the ingot based on the measured crystal orientation;

a first stocker for storing the ingot;

a second stocker for storing the ingot connected to the support;

a first transferring device for transferring the ingot among the first stocker, the second stocker, the measuring device and the connecting device; and the wire saw for slicing the ingot into the plurality of wafers while the into is supported on the support.

18. The apparatus as set forth in claim 17, wherein the support includes an intermediate plate and support plate, the support plate being adapted to fit the wire saw, and wherein the connecting device includes an auxiliary attaching element for attaching the intermediate plate to the predetermined location on the surface of the ingot and a connecting element for connecting the support plate to the intermediate plate.

19. The apparatus as set forth in claim 18, wherein the first transferring device transfers the ingot between the auxiliary attaching element and the connecting element.

20. An apparatus for simultaneously manufacturing a plurality of wafers by slicing a cylindrical ingot with a wire saw, the ingot having a crystal orientation, the apparatus comprising:

a measuring device for measuring the crystal orientation of the ingot;

a connecting device for connecting a support to a predetermined location on the surface of the ingot based on the measured crystal orientation;

a first stocker for storing the ingot;

a second stocker for storing the ingot after the ingot is connected to the support;

a first transferring device for transferring the ingot among the first stocker, second stocker, the measuring device and the connecting device; and a second transferring device for transferring the ingot from the second stocker to the wire saw.

21. The apparatus as set forth in claim 20, further comprising controller controlling operation of at least the measuring device, the connecting device, the first stocker, the first transferring device, the second stocker, the wire saw and the second transferring device.

* * * * *